United States Patent
Hatakeyama

(10) Patent No.: US 10,698,314 B2
(45) Date of Patent: Jun. 30, 2020

(54) CHEMICALLY AMPLIFIED RESIST COMPOSITION AND PATTERNING PROCESS

(71) Applicant: SHIN-ETSU CHEMICAL CO., LTD., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 182 days.

(21) Appl. No.: 15/814,659

(22) Filed: Nov. 16, 2017

(65) Prior Publication Data

US 2018/0143532 A1 May 24, 2018

(30) Foreign Application Priority Data

Nov. 18, 2016 (JP) ................. 2016-224748

(51) Int. Cl.
| | |
|---|---|
| G03F 7/028 | (2006.01) |
| G03F 7/004 | (2006.01) |
| G03F 7/039 | (2006.01) |
| G03F 7/20 | (2006.01) |
| G03F 7/42 | (2006.01) |
| C08F 12/24 | (2006.01) |
| C09D 125/18 | (2006.01) |
| C08F 212/14 | (2006.01) |
| C08F 220/38 | (2006.01) |
| C08K 5/19 | (2006.01) |
| C08F 220/28 | (2006.01) |
| C08F 220/30 | (2006.01) |
| C08L 25/04 | (2006.01) |
| C08L 33/08 | (2006.01) |
| C08L 33/10 | (2006.01) |
| C08L 41/00 | (2006.01) |

(52) U.S. Cl.
CPC .............. G03F 7/028 (2013.01); C08F 12/24 (2013.01); C08F 212/14 (2013.01); C08F 220/38 (2013.01); C08K 5/19 (2013.01); C09D 125/18 (2013.01); G03F 7/0045 (2013.01); G03F 7/0397 (2013.01); G03F 7/2004 (2013.01); G03F 7/425 (2013.01); G03F 7/426 (2013.01); C08F 220/281 (2020.02); C08F 220/282 (2020.02); C08F 220/283 (2020.02); C08F 220/301 (2020.02); C08F 220/302 (2020.02); C08F 220/303 (2020.02); C08L 25/04 (2013.01); C08L 33/08 (2013.01); C08L 33/10 (2013.01); C08L 41/00 (2013.01); G03F 7/0046 (2013.01)

(58) Field of Classification Search
USPC ............................................. 430/270.1, 280.1
See application file for complete search history.

(56) References Cited

U.S. PATENT DOCUMENTS

| | | | | |
|---|---|---|---|---|
| 5,846,689 A | * | 12/1998 | Schwalm | ............ G03F 7/0045 430/270.1 |
| 9,176,379 B2 | | 11/2015 | Ichikawa et al. | |
| 9,448,475 B2 | | 9/2016 | Masuyama et al. | |
| 9,563,123 B2 | | 2/2017 | Masuyama et al. | |
| 2003/0134232 A1 | * | 7/2003 | Yokoyama | ............ G03F 7/0046 430/312 |
| 2015/0241769 A1 | * | 8/2015 | Masuyama | ............ G03F 7/027 430/281.1 |
| 2015/0248052 A1 | * | 9/2015 | Masuyama | .......... C07D 321/10 430/285.1 |
| 2018/0079864 A1 | * | 3/2018 | Kawabata | ............ G03F 7/0212 |

FOREIGN PATENT DOCUMENTS

| | | |
|---|---|---|
| JP | 2015-172746 A | 10/2015 |
| JP | 2015-180928 A | 10/2015 |
| JP | 5852490 B2 | 2/2016 |
| WO | WO-2016194769 A1 * 12/2016 | ............ C08G 73/10 |

OTHER PUBLICATIONS

Frechet, Jean "The photogeneration of acid and base within polymer coatings: Approaches to polymer curing and imaging", Pure & Appl. Chem, vol. 64, No. 9, pp. 1239-1248, 1992. (Year: 1992).*

Shiraishi et al "Novolak resin-based positive electron-beam resist system untilizing acid sensitive polymeric dissolution inhibitor with solubility reversal reactivity", J. Vac. Sci. Technol., B, vol. 9 Issue: 6, pp. 3343-3347, Nov. 1991. (Year: 1991).*

Toshio Sakamizu, Tadashi Arai, Hidenori Yamaguchi, Hiroshi Shiraishi, "Acid diffusion control in chemical amplification positive resists by exchange reaction of conjugate bases," Proc. SPIE 3049, Advances in Resist Technology and Processing XIV, (Jul. 7, 1997) pp. 448-458 ; doi: 10.1117/12.275845 (Year: 1997).*

* cited by examiner

Primary Examiner — Cynthia Hamilton
(74) Attorney, Agent, or Firm — Westerman, Hattori, Daniels & Adrian, LLP

(57) ABSTRACT

A chemically amplified resist composition comprising a quencher containing a quaternary ammonium iodide, dibromoiodide, bromodiiodide or triiodide, and an acid generator exhibits a sensitizing effect and an acid diffusion suppressing effect and forms a pattern having improved resolution, LWR and CDU.

15 Claims, No Drawings

CHEMICALLY AMPLIFIED RESIST COMPOSITION AND PATTERNING PROCESS

CROSS-REFERENCE TO RELATED APPLICATION

This non-provisional application claims priority under 35 U.S.C. § 119(a) on Patent Application No. 2016-224748 filed in Japan on Nov. 18, 2016, the entire contents of which are hereby incorporated by reference.

TECHNICAL FIELD

This invention relates to a chemically amplified resist composition comprising a quencher containing a quaternary ammonium salt, and an acid generator, and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, EUV lithography of 13.5 nm wavelength, and double patterning version of the ArF lithography, on which active research efforts have been made.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 kV to 30 kV and reached 50 kV in the current mainstream system, with a voltage of 100 kV being under investigation.

As the pattern feature size is reduced, approaching to the diffraction limit of light, light contrast lowers. In the case of positive resist film, a lowering of light contrast leads to reductions of resolution and focus margin of hole and trench patterns.

As the pattern feature size is reduced, the edge roughness (LWR) of line patterns and the critical dimension uniformity (CDU) of hole patterns are regarded significant. It is pointed out that these factors are affected by the segregation or agglomeration of a base polymer and acid generator and the diffusion of generated acid. There is a tendency that as the resist film becomes thinner, LWR becomes greater. A film thickness reduction to comply with the progress of size reduction causes a degradation of LWR, which becomes a serious problem.

The EUV lithography resist must meet high sensitivity, high resolution and low LWR at the same time. As the acid diffusion distance is reduced, LWR is reduced, but sensitivity becomes lower. For example, as the PEB temperature is lowered, the outcome is a reduced LWR, but a lower sensitivity. As the amount of quencher added is increased, the outcome is a reduced LWR, but a lower sensitivity. It is necessary to overcome the tradeoff relation between sensitivity and LWR. It would be desirable to have a resist material having a high sensitivity and resolution as well as improved LWR and CDU.

Patent Document 1 proposes a quencher of iodonium carboxylate type having a carboxylate ion bonded to an iodonium cation. Patent Documents 2 and 3 propose the use of hypervalent iodine compounds as the quencher. Since iodine has a high atomic number, quenchers in the form of iodinated compounds are fully effective for suppressing acid diffusion.

CITATION LIST

Patent Document 1: JP 5852490 (U.S. Pat. No. 9,176,379)
Patent Document 2: JP-A 2015-180928 (U.S. Pat. No. 9,563,123)
Patent Document 3: JP-A 2015-172746 (U.S. Pat. No. 9,448,475)

SUMMARY OF INVENTION

As the wavelength of light becomes shorter, the energy density thereof becomes higher and hence, the number of photons generated upon exposure becomes smaller. A variation in photon number causes variations in LWR and CDU. As the exposure dose increases, the number of photons increases, leading to a less variation of photon number. Thus there is a tradeoff relationship between sensitivity and resolution, LWR and CDU. In particular, the EUV lithography resist materials have the tendency that a lower sensitivity leads to better LWR and CDU.

An increase in acid diffusion also causes degradation of resolution, LWR and CDU. This is because acid diffusion not only causes image blur, but also proceeds non-uniformly in a resist film. For suppressing acid diffusion, it is effective to lower the PEB temperature, to use a bulky acid which is least diffusive, or to increase the amount of quencher added. However, any of these means for reducing acid diffusion results in a lowering of sensitivity. Either the means for reducing photon variation or the means for reducing acid diffusion variation leads to a lowering of resist sensitivity.

An object of the invention is to provide a chemically amplified resist composition which exerts a high sensitizing effect and an acid diffusion suppressing effect and has improved resolution, LWR and CDU, and a pattern forming process using the same.

A significant increase of acid generation efficiency and a significant suppression of acid diffusion must be achieved before the tradeoff relationship between sensitivity and resolution, LWR and CDU can be overcome.

Iodine is substantially absorptive to EUV of wavelength 13.5 nm and EB because of its high atomic number, and releases many secondary electrons upon exposure because of many electron orbits in its molecule. The secondary electrons thus released provide energy transfer to an acid generator, achieving a high sensitizing effect.

The inventors have found that when a quaternary ammonium salt selected from a quaternary ammonium iodide, quaternary ammonium dibromoiodide, quaternary ammonium bromodiiodide, and quaternary ammonium triiodide is added as the quencher to a chemically amplified resist composition comprising an acid generator, the resulting resist composition forms a resist film which exerts a high sensitizing effect and an acid diffusion suppressing effect, experiences no film thickness loss after development, and has a high sensitivity, minimized LWR and improved CDU.

In one aspect, the invention provides a chemically amplified resist composition comprising a quencher containing a quaternary ammonium salt selected from the group consisting of a quaternary ammonium iodide, quaternary ammonium dibromoiodide, quaternary ammonium bromodiiodide, and quaternary ammonium triiodide, and an acid generator.

In one preferred embodiment, the quaternary ammonium salt has the formula (1) or (2).

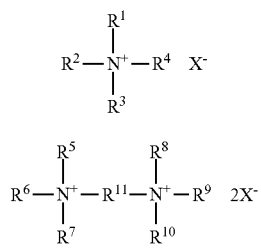

Herein $R^1$ to $R^4$ and $R^5$ to $R^{10}$ are each independently a $C_1$-$C_{24}$ straight, branched or cyclic alkyl group, $C_2$-$C_{24}$ straight, branched or cyclic alkenyl group, $C_2$-$C_{24}$ straight, branched or cyclic alkynyl group, or $C_6$-$C_{24}$ aryl group, which may contain a halogen, hydroxyl, carboxyl, ether, ester, thiol, thioester, thionoester, dithioester, amino, nitro, sulfone or ferrocenyl moiety, a pair of $R^1$ and $R^2$, $R^1$ and $R^4$, $R^2$ and $R^3$, and/or $R^3$ and $R^4$ may bond together to form a ring, or a pair of $R^1$ and $R^2$, $R^1$ and $R^4$, $R^2$ and $R^4$, or $R^3$ and $R^4$, taken together, may form a double bond, $R^{11}$ is a $C_2$-$C_{12}$ straight, branched or cyclic alkylene group which may contain an ether and/or ester moiety, $X^-$ is an anion selected from the group consisting of $I^-$, $Br_2I^-$, $BrI_2^-$ and $I_3^-$.

In one preferred embodiment, the acid generator is capable of generating sulfonic acid, imidic acid or methide acid.

The resist composition may further comprise a base polymer.

In owe preferred embodiment, the base polymer comprises recurring units of at least one type selected from recurring units having the formulae (f1) to (f3).

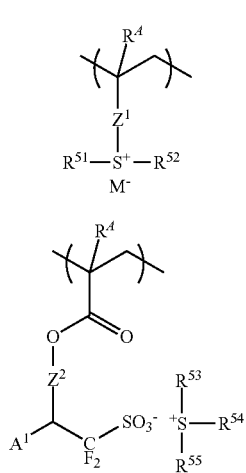

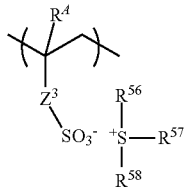

Herein $R^A$ is each independently hydrogen or methyl. $Z^1$ is a single bond, phenylene, —O—$Z^{11}$—, or —C(=O)—$Z^{12}$—$Z^{11}$—, $Z^{11}$ is a $C_1$-$C_6$ straight, branched or cyclic alkylene group or $C_2$-$C_6$ straight, branched or cyclic alkenylene group which may contain a carbonyl, ester, ether or hydroxyl moiety, or phenylene group, $Z^{12}$ is —O— or —NH—. $R^{51}$, $R^{52}$, $R^{53}$, $R^{54}$, $R^{55}$, $R^{56}$, $R^{57}$, and $R^{58}$ are each independently a $C_1$-$C_{12}$ straight, branched or cyclic alkyl group which may contain a carbonyl, ester or ether moiety, or a $C_6$-$C_{12}$ aryl, $C_7$-$C_{20}$ aralkyl, or mercaptophenyl group. $Z^2$ is a single bond, —$Z^{21}$—C(O)O—, —$Z^{21}$—O—, or —$Z^{21}$—O—C(=O)—, $Z^{21}$ is a $C_1$-$C_{12}$ straight, branched or cyclic alkylene group which may contain a carbonyl, ester or ether moiety. $Z^3$ is a single bond, methylene, ethylene, phenylene, fluorinated phenylene, —O—$Z^{31}$—, or —C(=O)—$Z^{32}$—$Z^{31}$—, $Z^{31}$ is a $C_1$-$C_6$ straight, branched or cyclic alkylene group or $C_2$-$C_6$ straight, branched or cyclic alkenylene group which may contain a carbonyl, ester, ether or hydroxyl moiety, or a phenylene, fluorinated phenylene or trifluoromethyl-substituted phenylene group, $Z^{32}$ is —O— or —NH—. $A^1$ is hydrogen or trifluoromethyl, and $M^-$ is a non-nucleophilic counter ion.

In one preferred embodiment, the acid generator also functions as a base polymer. In this case, the acid generator is a polymer comprising recurring units of at least one type selected from recurring units having the formulae (f1) to (f3) defined above.

In one preferred embodiment, the base polymer comprises recurring units having the formula (a1) or recurring units having the formula (a2).

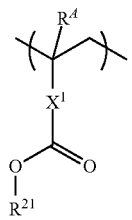

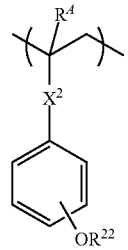

Herein $R^A$ is each independently hydrogen or methyl, $R^{11}$ and $R^{12}$ are each independently an acid labile group, $X^1$ is a single bond, phenylene, naphthylene, or a $C_1$-$C_{12}$ linking group containing ester moiety or lactone ring, and $X^2$ is a single bond or ester group.

In one preferred embodiment, the resist composition is a chemically amplified positive resist composition.

In another preferred embodiment, the resist composition is a chemically amplified negative resist composition. In this case, the base polymer is an acid labile group-free polymer.

In either embodiment, the resist composition may further comprise an organic solvent and/or a surfactant.

In another aspect, the invention provides a pattern forming process comprising the steps of coating the resist composition defined above onto a substrate, baking, exposing the resulting resist film to high-energy radiation, and developing the resist film with a developer.

Preferably, the high-energy radiation is ArF excimer laser of wavelength 193 nm, KrF excimer laser of wavelength 248 nm, EB, or EUV of wavelength 3 to 15 nm.

Advantageous Effects of Invention

Since the quaternary ammonium salt defined herein contains an iodine atom featuring substantial light absorption, a resist film containing the quaternary ammonium salt as a quencher exhibits a sensitizing effect due to secondary electrons released therefrom upon exposure. In addition, the iodine-containing resist film exerts an acid diffusion suppressing effect and a high dissolution contrast. Thus the resist film exhibits high resolution, high sensitivity, minimal LWR, and Improved CDU as a positive or negative resist film subject to alkaline development or as a negative resist film subject to organic solvent development.

DESCRIPTION OF EMBODIMENTS

As used herein, the singular forms "a," "an" and "the" include plural referents unless the context clearly dictates otherwise. The notation (Cn-Cm) means a group containing from n to m carbon atoms per group. Me stands for methyl, Ac for acetyl, and Ph for phenyl.

The abbreviations and acronyms have the following meaning.
EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Chemically Amplified Resist Composition The chemically amplified resist composition of the invention is defined as comprising a quencher containing a quaternary ammonium salt selected from among a quaternary ammonium iodide, quaternary ammonium dibromoiodide, quaternary ammonium bromodiiodide, and quaternary ammonium triiodide, and an acid generator. The quaternary ammonium salt undergoes ion exchange with an acid generated from the acid generator to form an iodonium salt and release hydriodic acid. The quaternary ammonium salt has an acid trapping ability and an acid diffusion suppressing effect.

The acid diffusion suppressing effect and contrast enhancing effect of the quaternary ammonium salt are valid in both the positive or negative pattern formation by alkaline development and the negative pattern formation by organic solvent development.

Quencher

The quencher in the chemically amplified resist composition contains a quaternary ammonium salt selected from the group consisting of a quaternary ammonium iodide, quaternary ammonium dibromoiodide, quaternary ammonium bromodiiodide, and quaternary ammonium triiodide. The preferred quaternary ammonium salt has the formula (1) or (2).

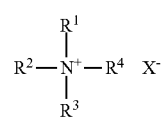
(1)

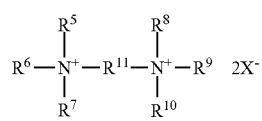
(2)

Herein $R^1$ to $R^4$ and $R^5$ to $R^{10}$ are each independently a $C_1$-$C_{24}$ straight, branched or cyclic alkyl group, $C_2$-$C_{24}$ straight, branched or cyclic alkenyl group, $C_2$-$C_{24}$ straight, branched or cyclic alkynyl group, or $C_6$-$C_{24}$ aryl group, which may contain a halogen, hydroxyl, carboxyl, ether, ester, thiol, thioester, thionoester, dithioester, amino, nitro, sulfone or ferrocenyl moiety. A pair of $R^1$ and $R^2$, $R^1$ and $R^4$, $R^2$ and $R^3$, and/or $R^3$ and $R^4$ may bond together to form a ring, or a pair of $R^1$ and $R^2$, $R^1$ and $R^4$, $R^2$ and $R^3$, or $R^3$ and $R^4$, taken together, may form a double bond. $R^{11}$ is a $C_2$-$C_{12}$ straight, branched or cyclic alkylene group which may contain an ether and/or ester moiety. $X^-$ is an anion selected from the group consisting of $I^-$, $Br_2I^-$, $BrI_2^-$ and $I_3^-$.

Examples of the cation moiety in the quaternary ammonium salt of formula (1) are given below, but not limited thereto.

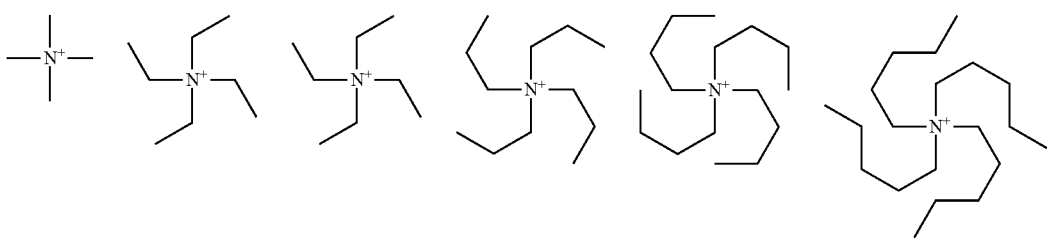

-continued
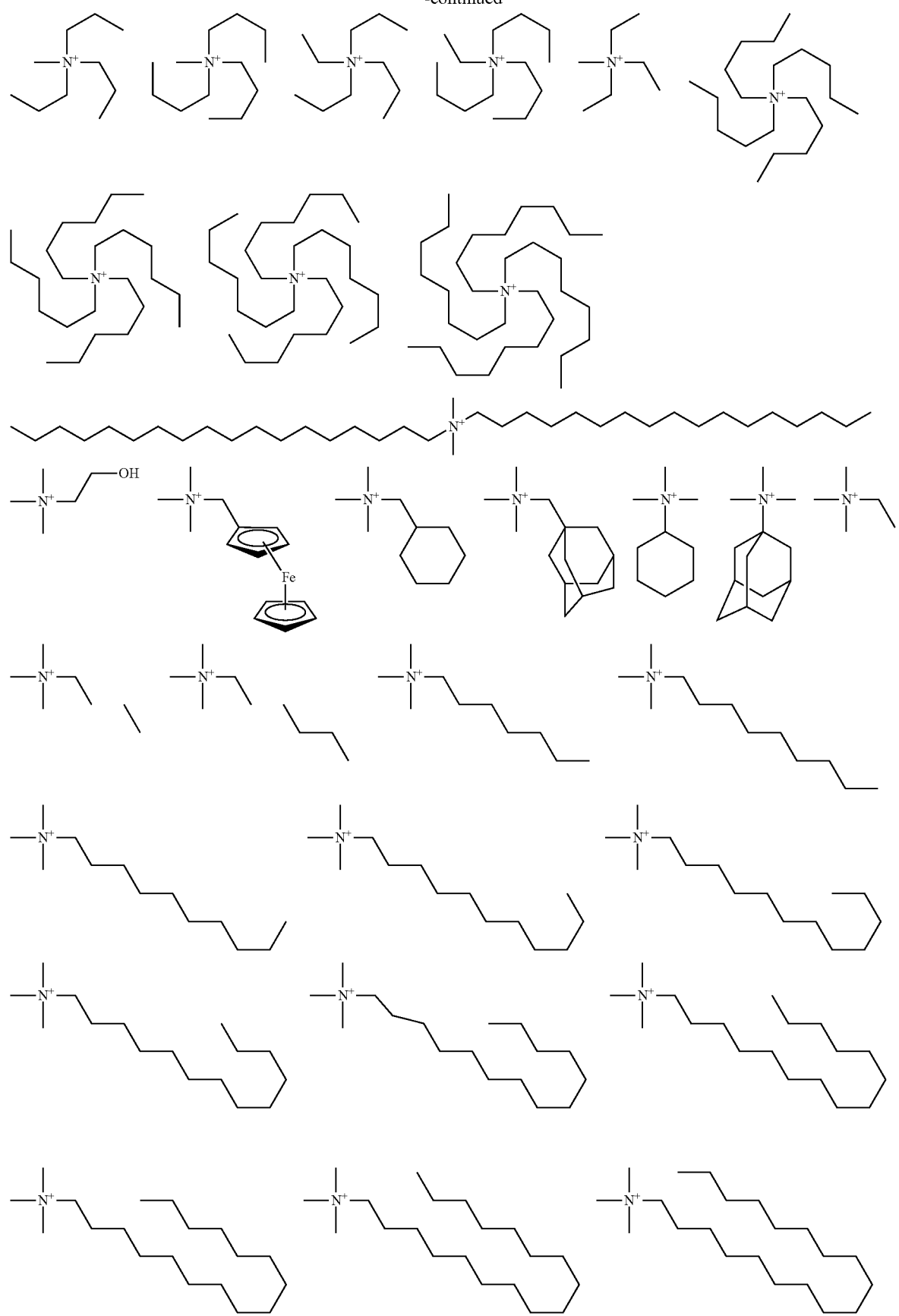

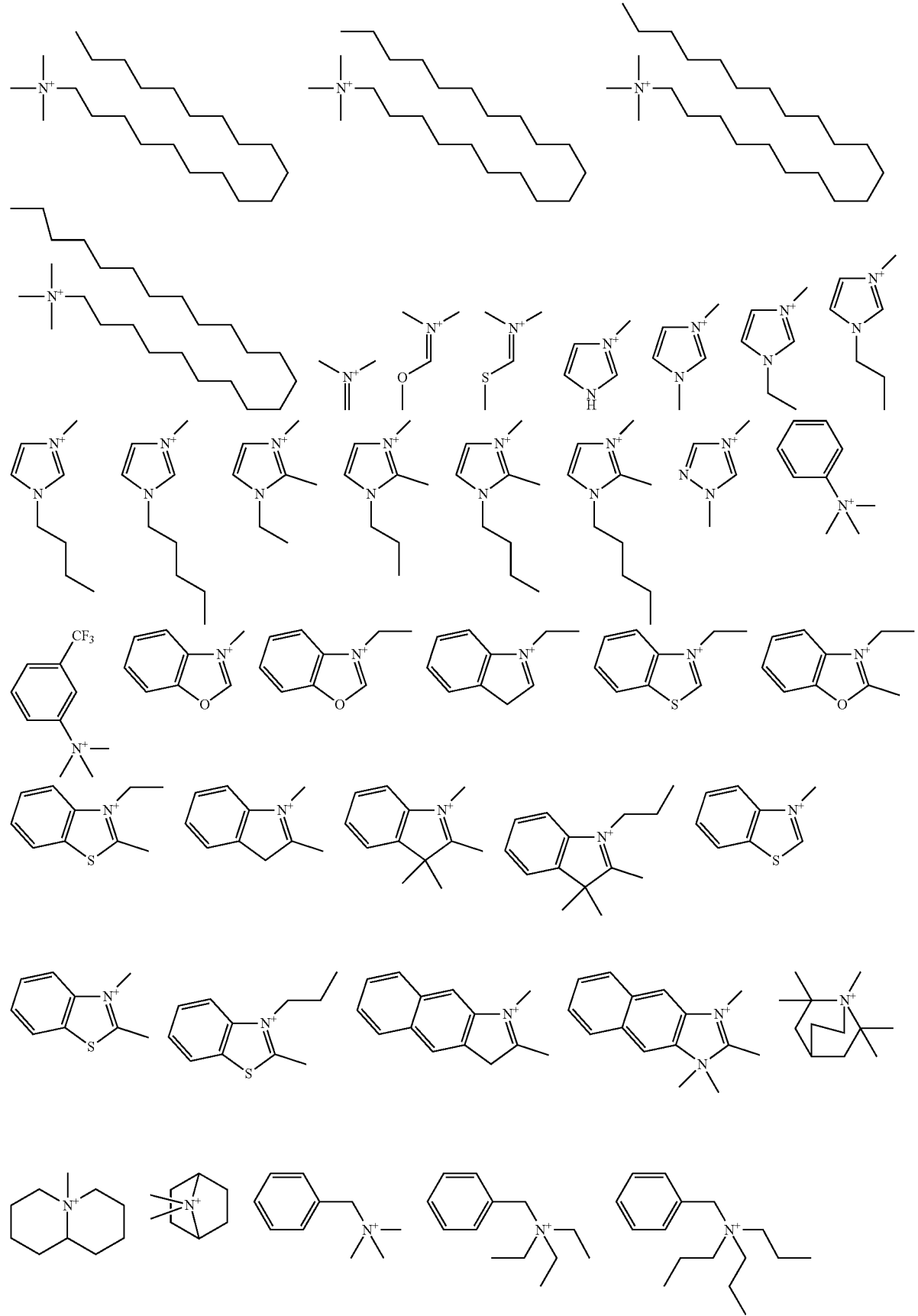

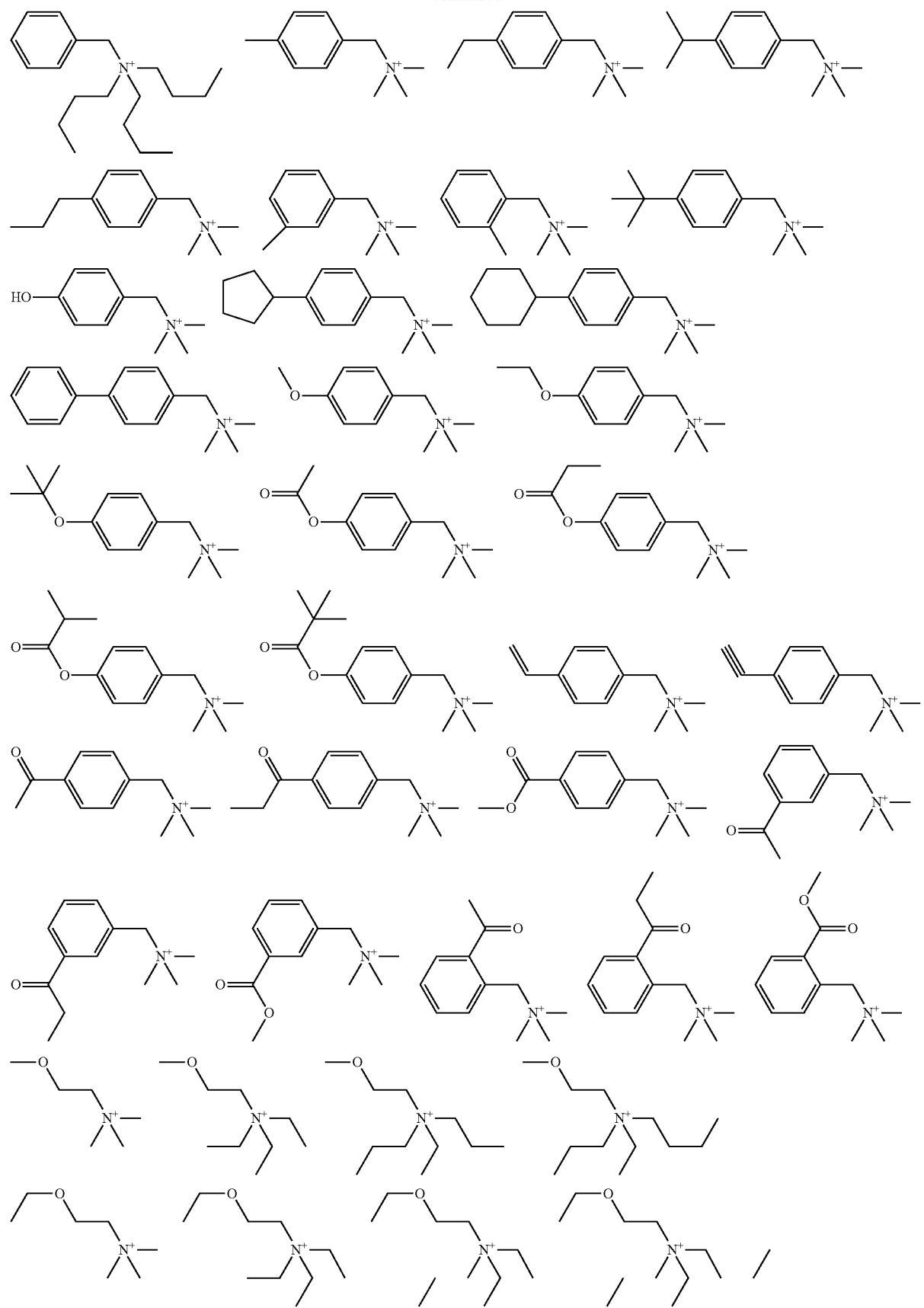

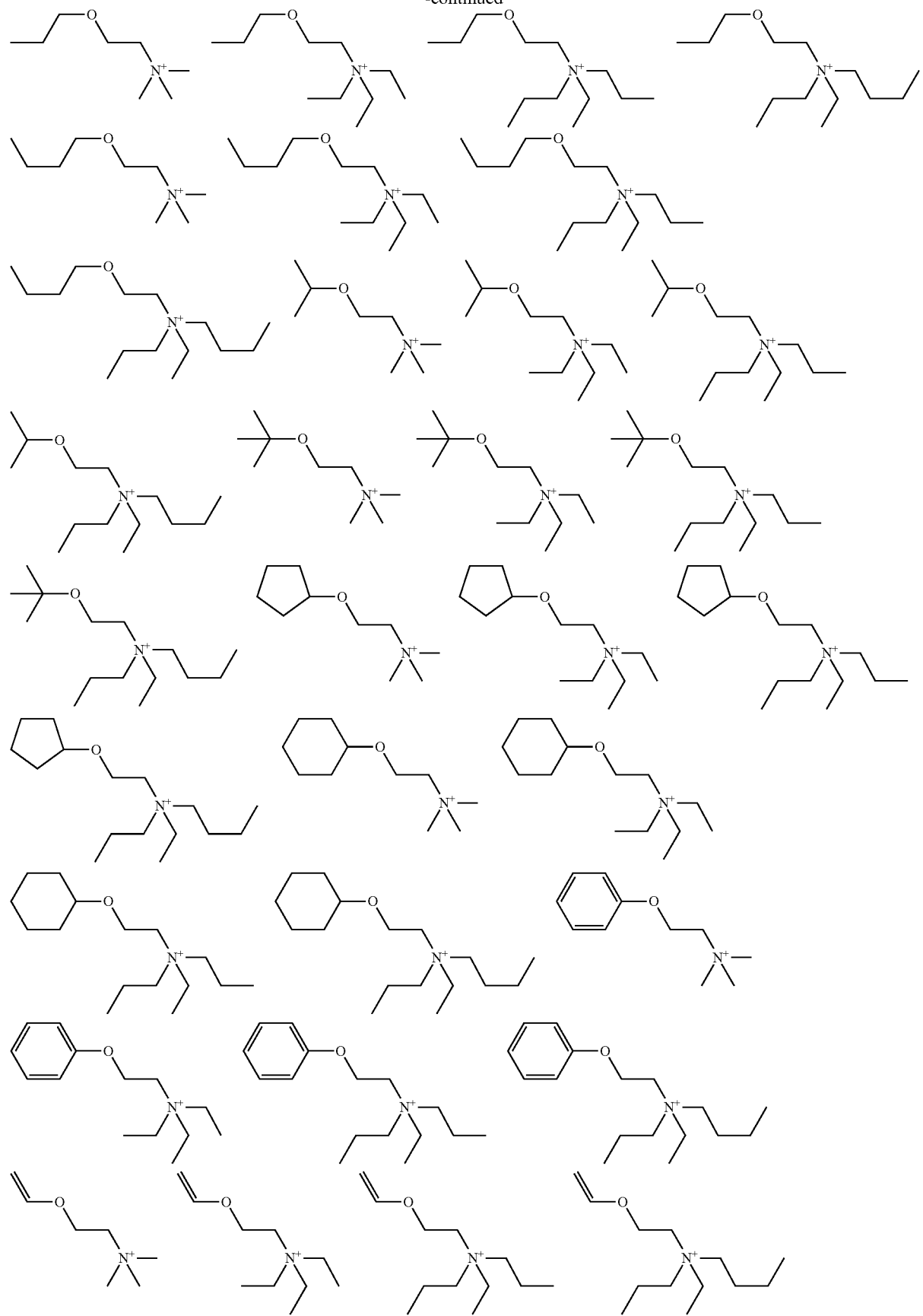

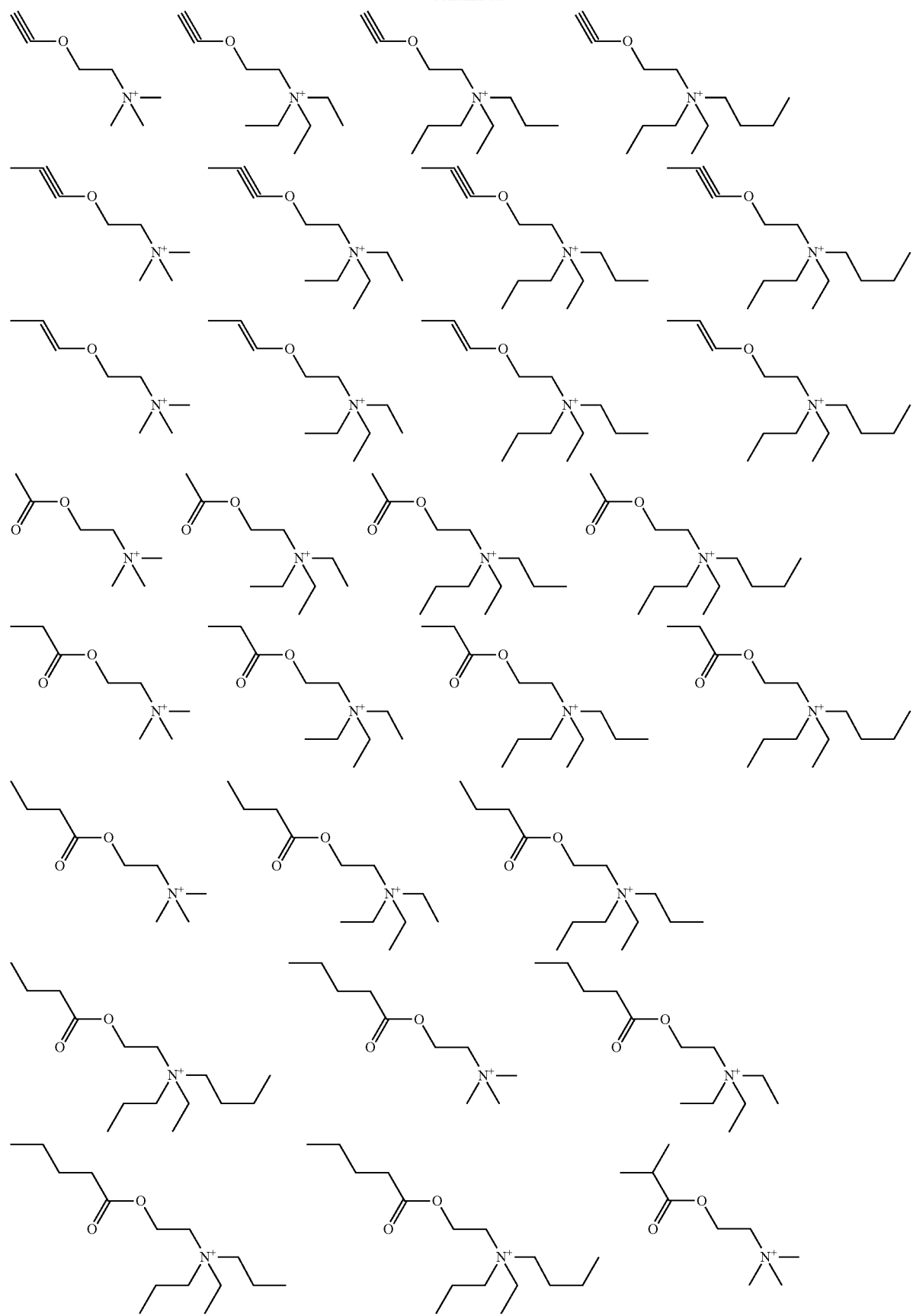

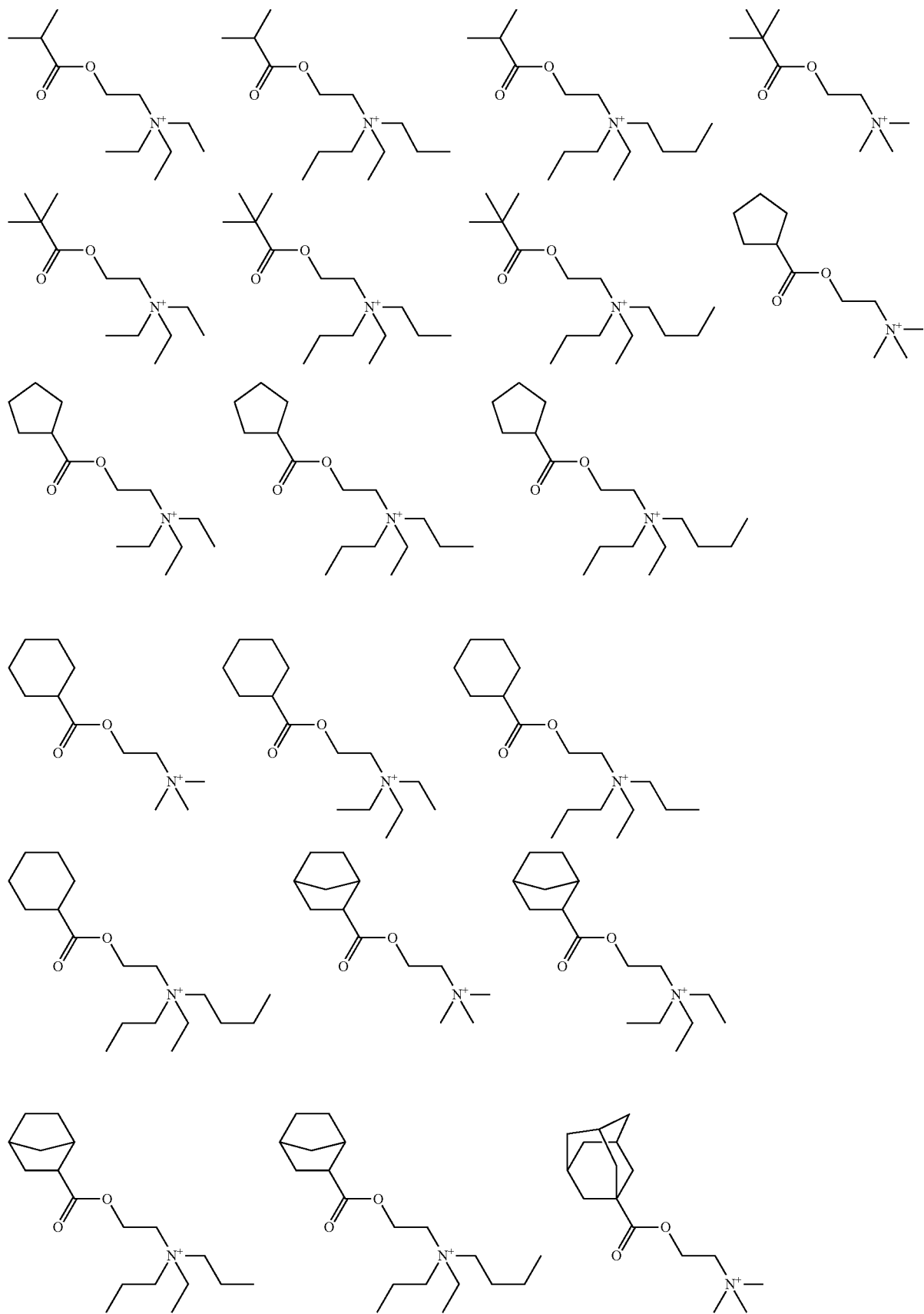

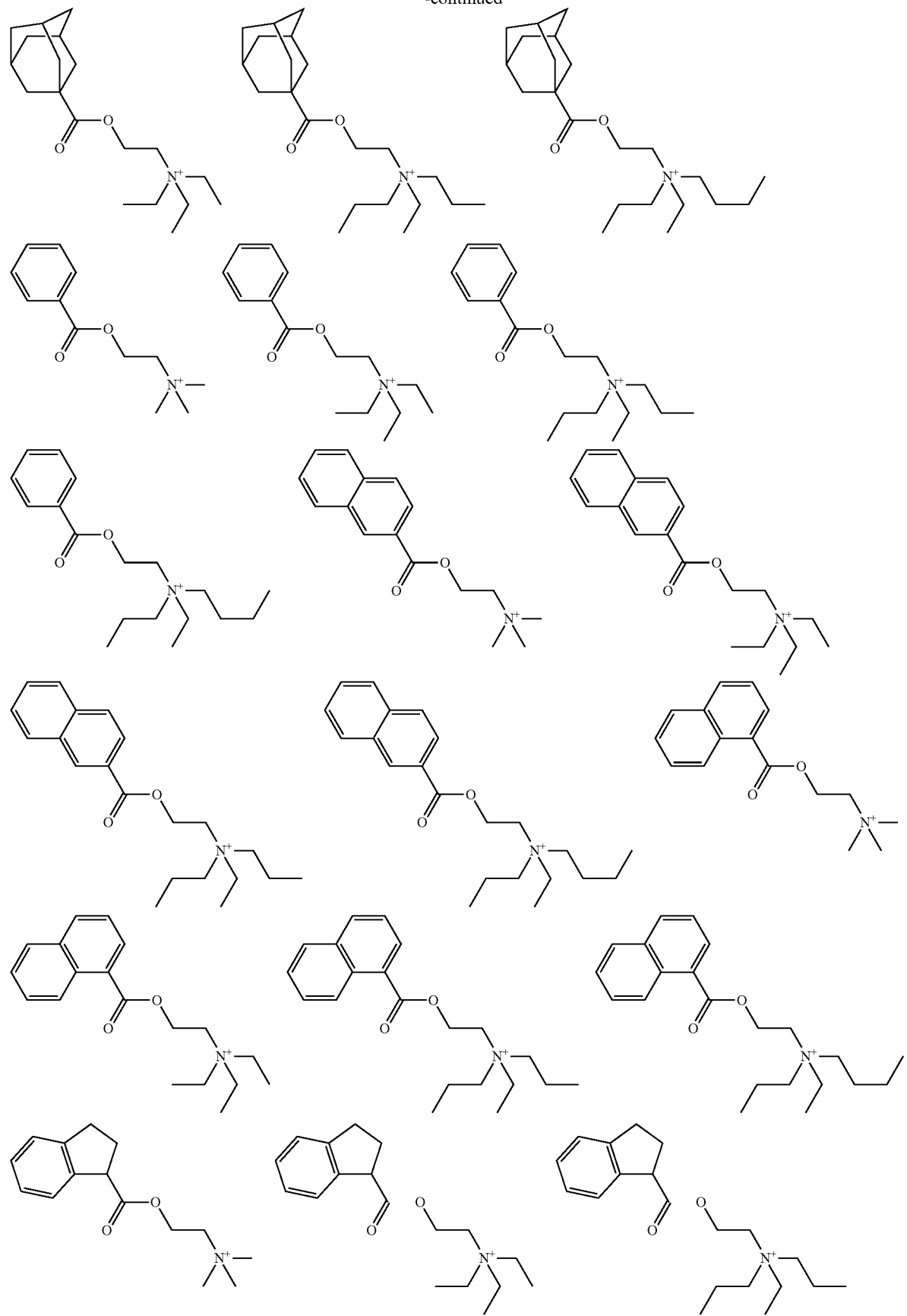

21
22
-continued
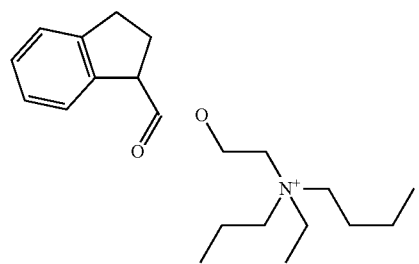
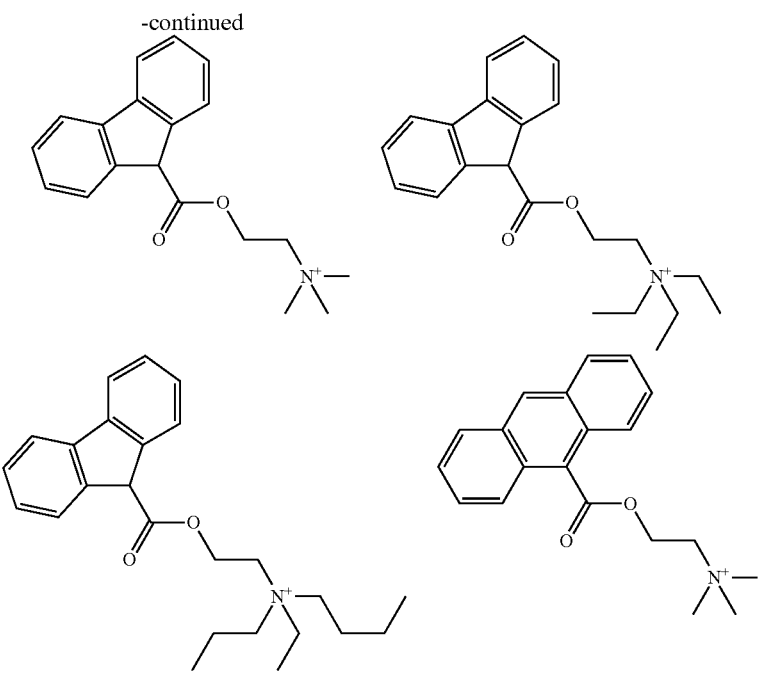
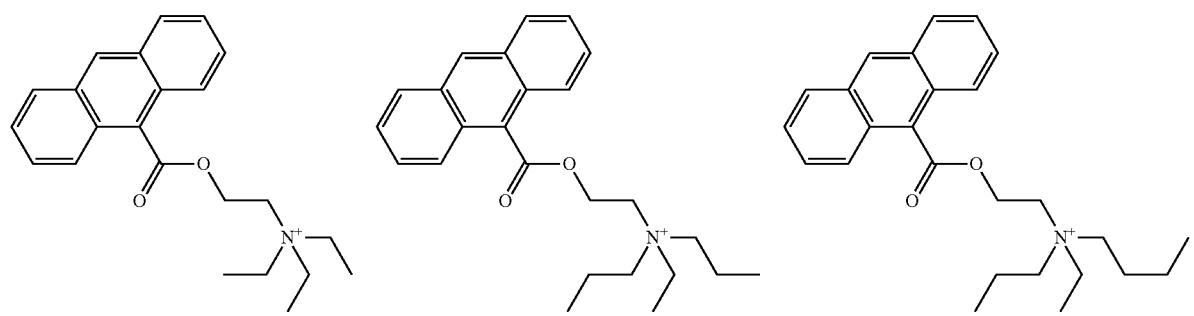
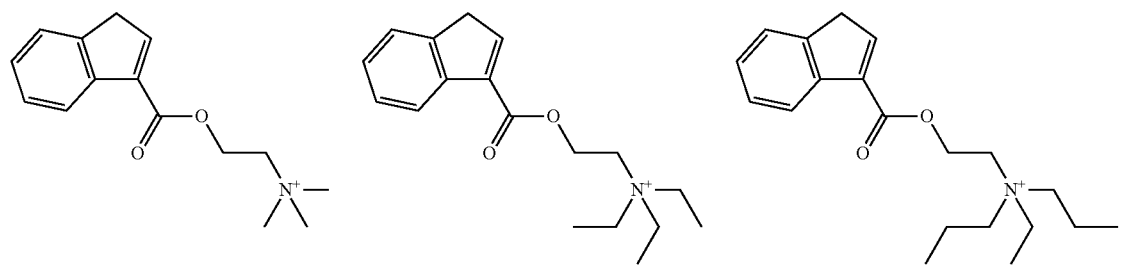
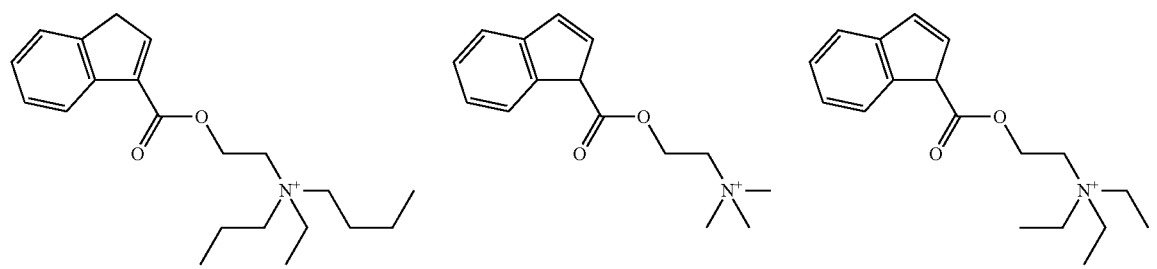

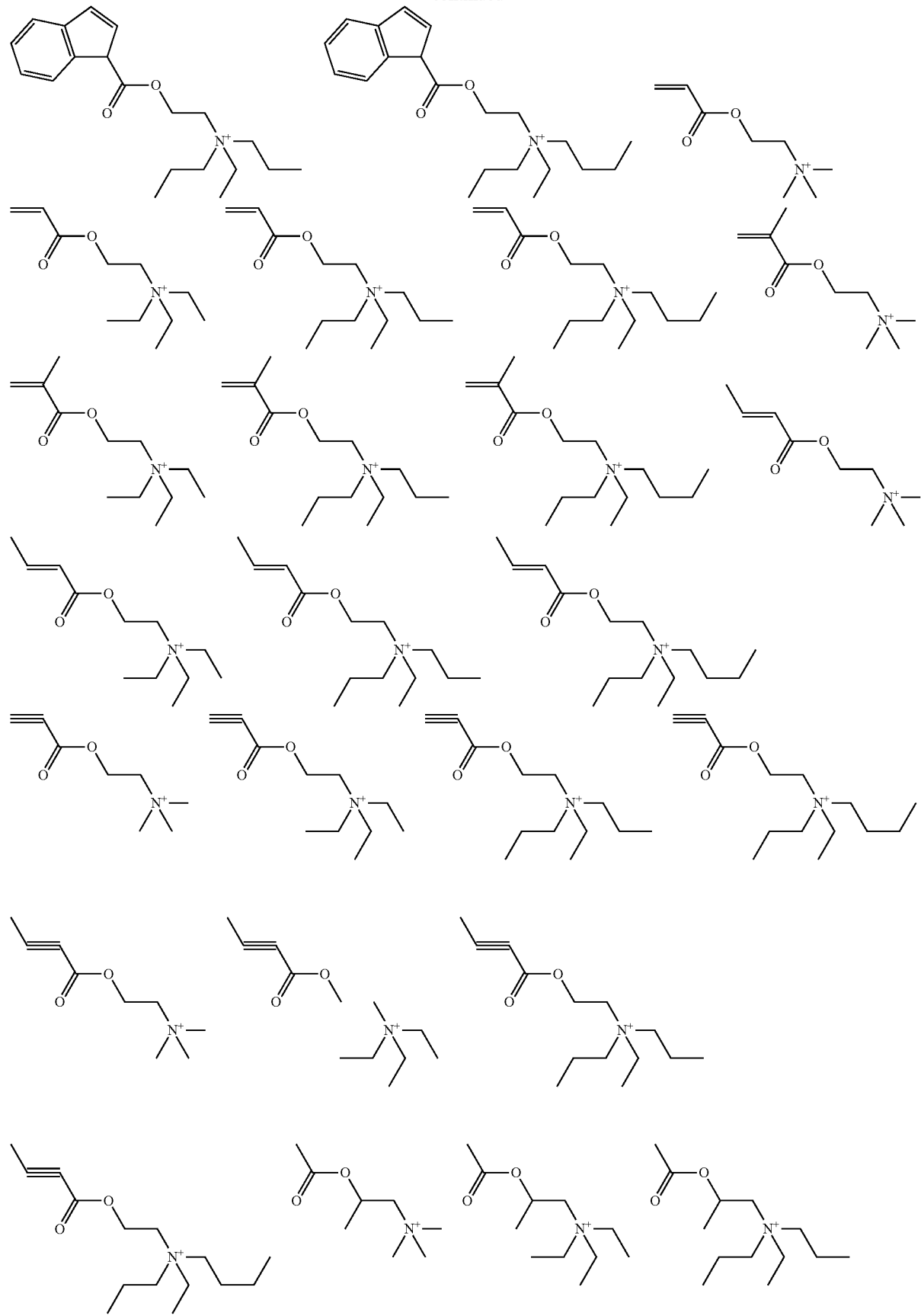

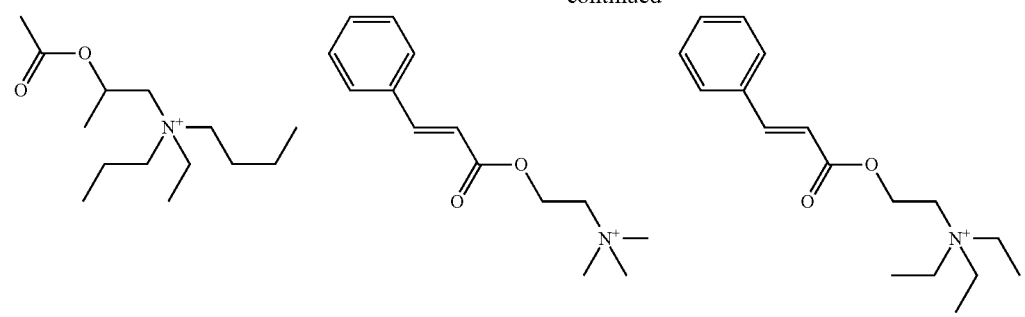
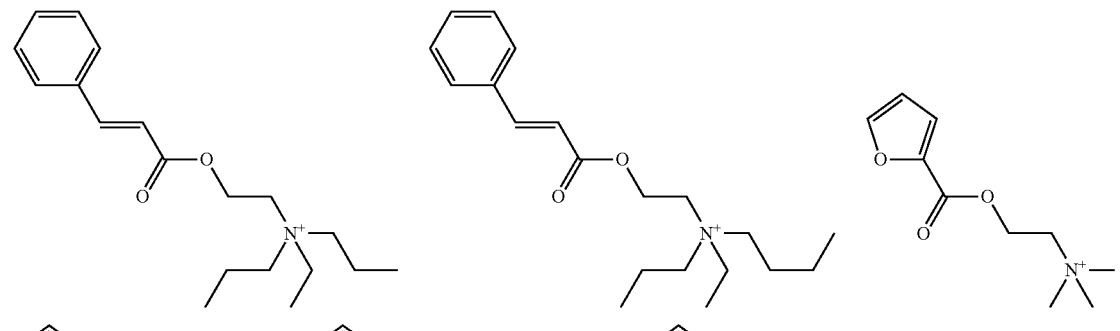
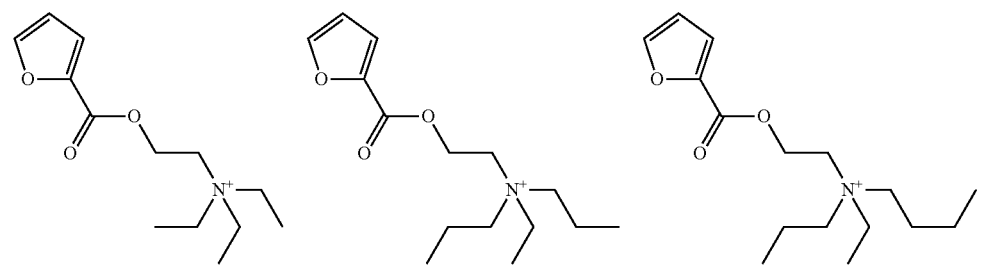
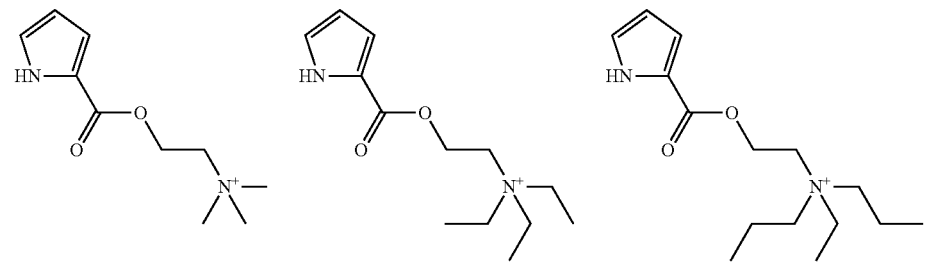
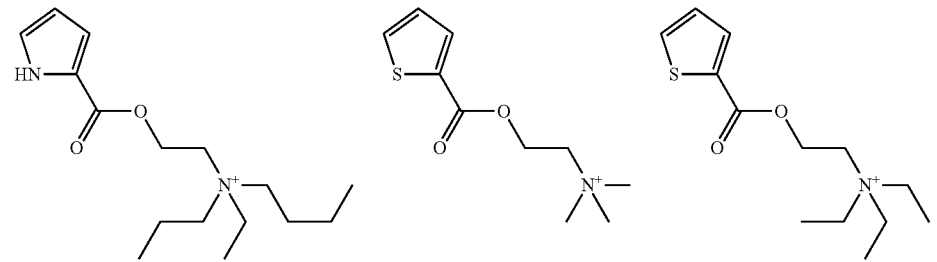
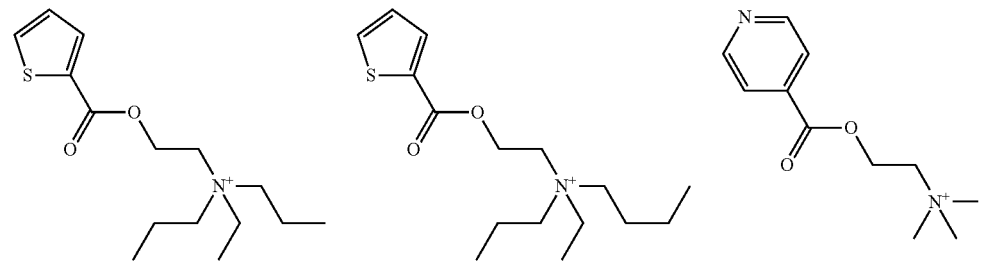

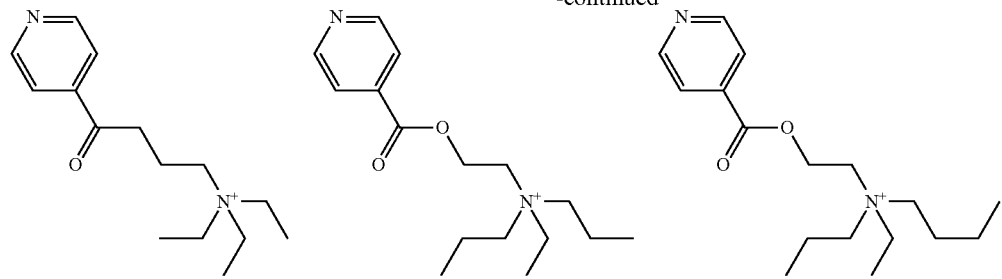
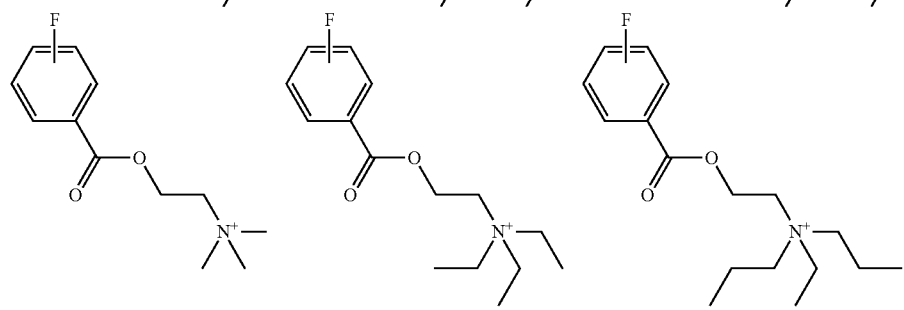
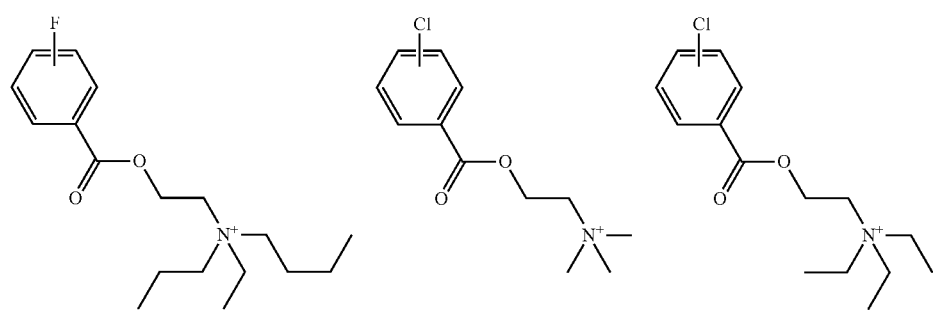
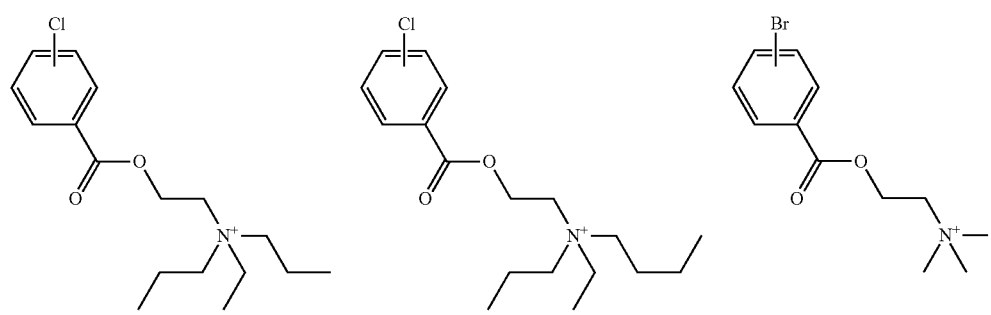
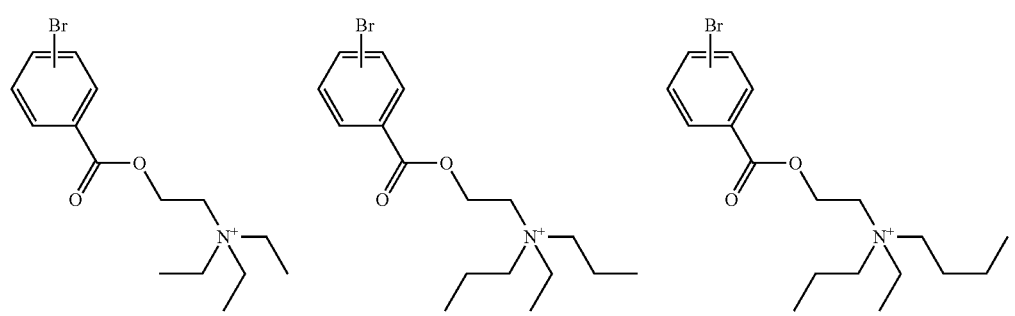

-continued
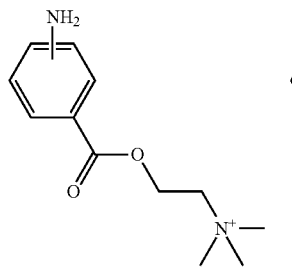
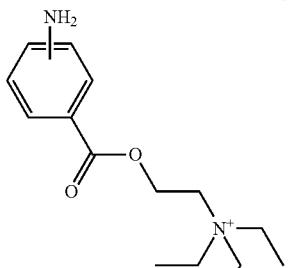
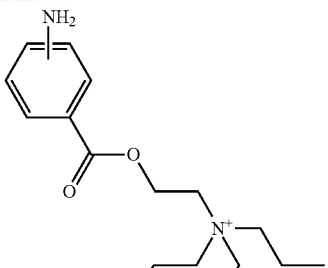
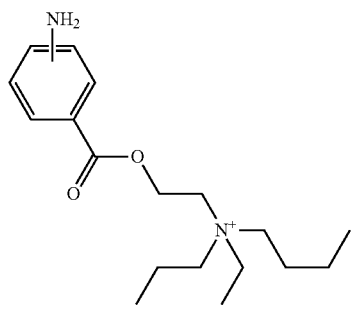
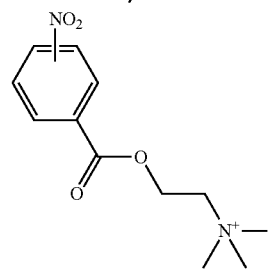
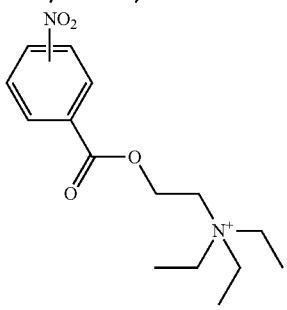
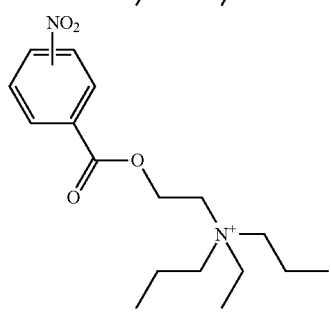
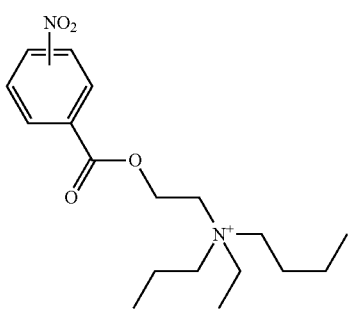
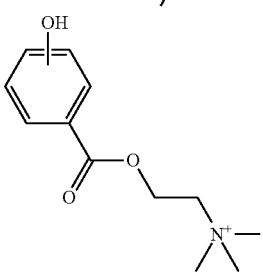
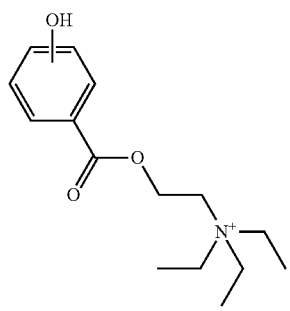
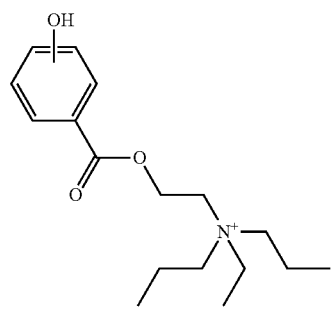
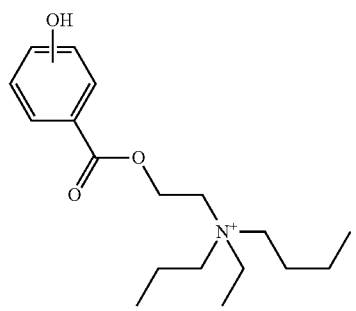
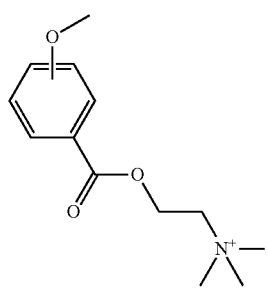
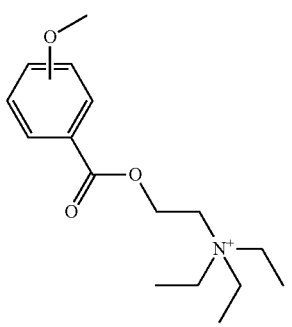
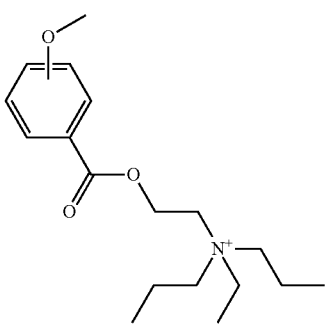

-continued
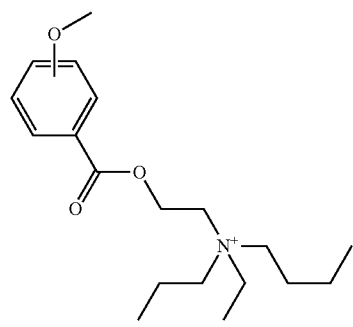 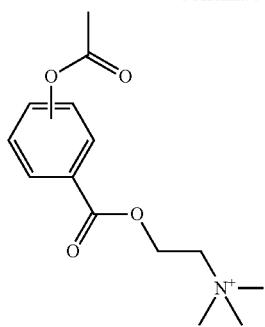 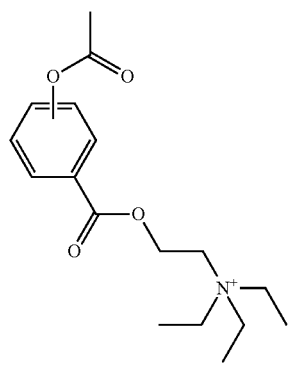
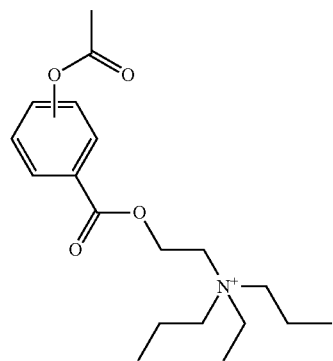 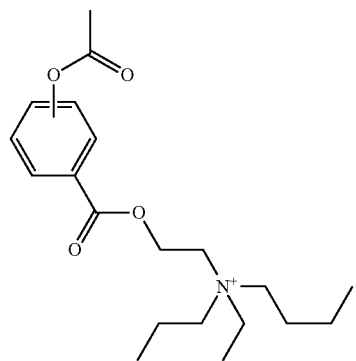 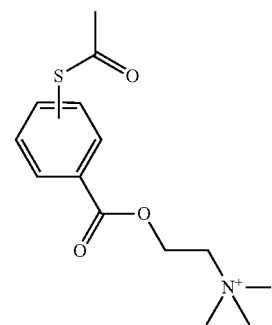
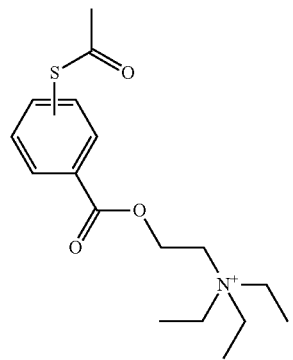 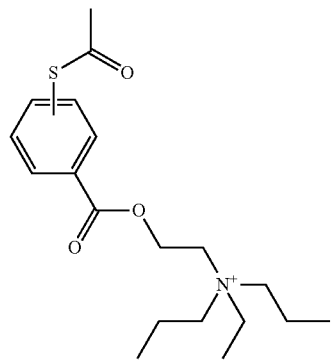 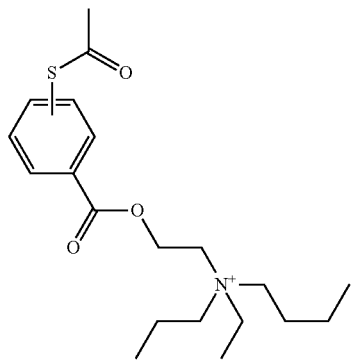
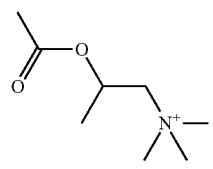 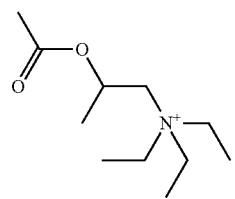 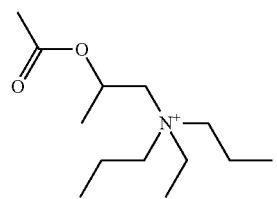 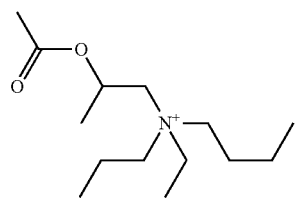
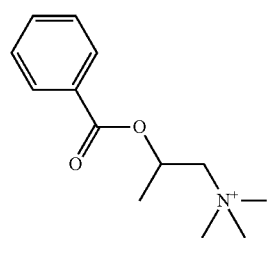 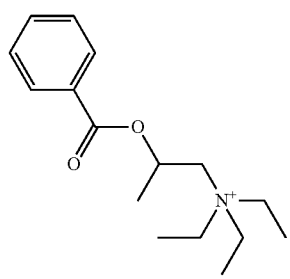 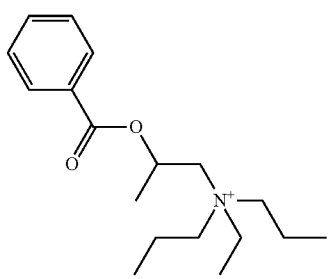

-continued
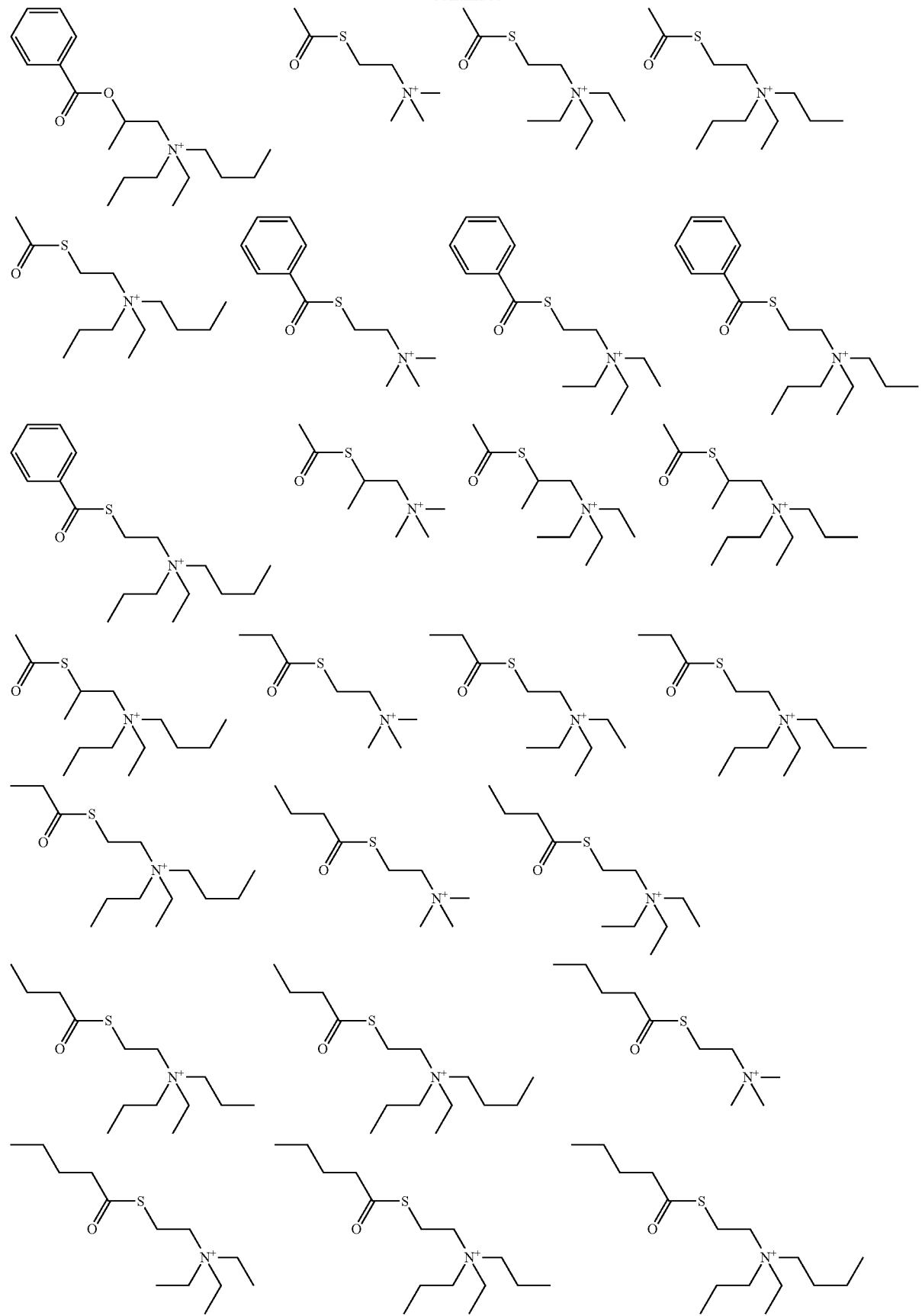

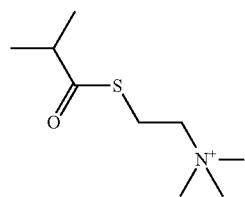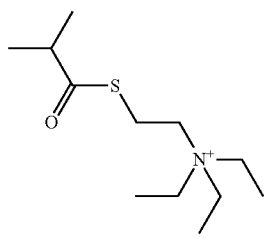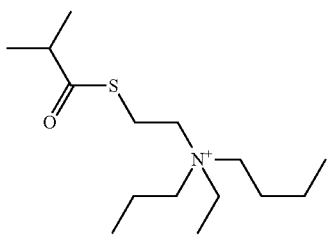
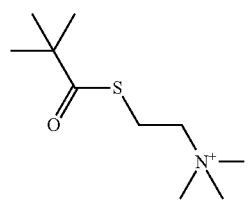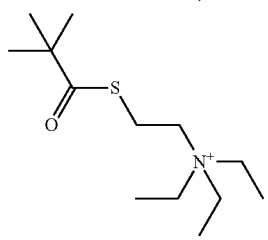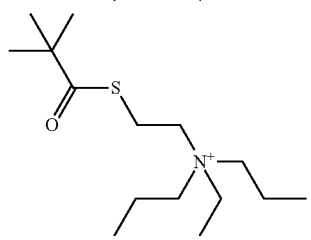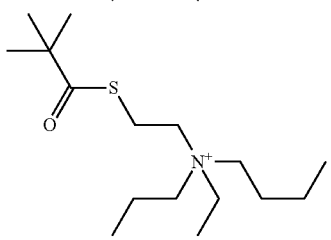
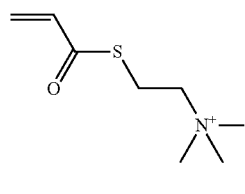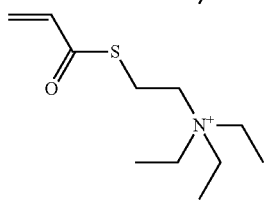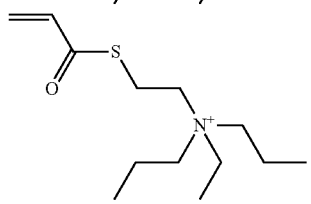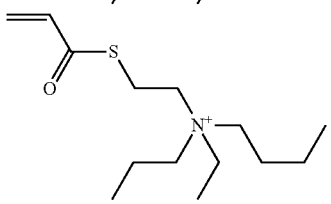
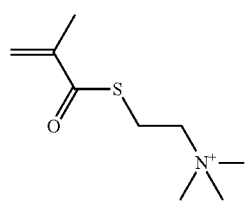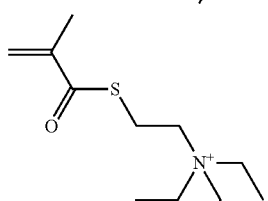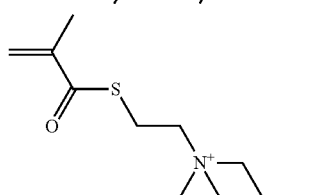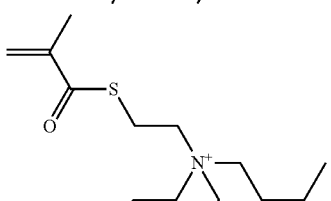
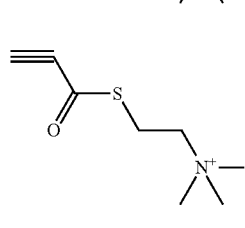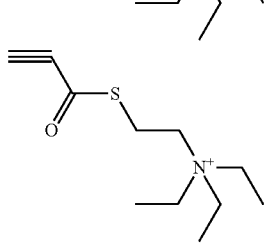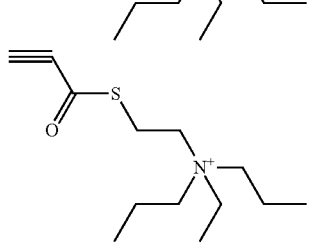
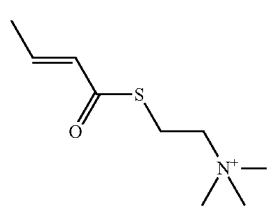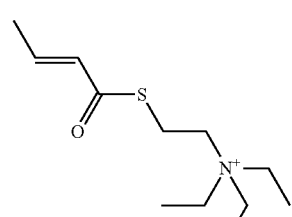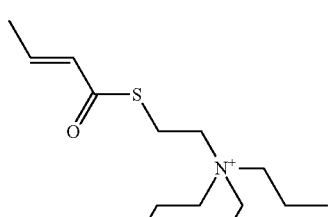
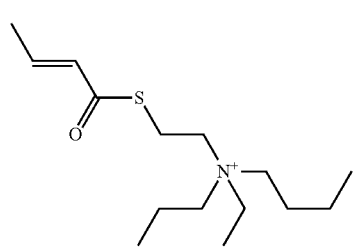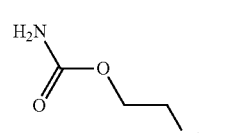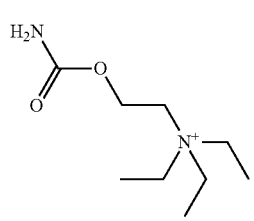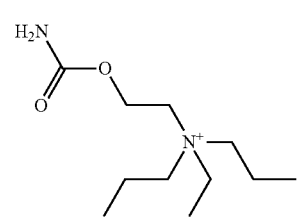

-continued
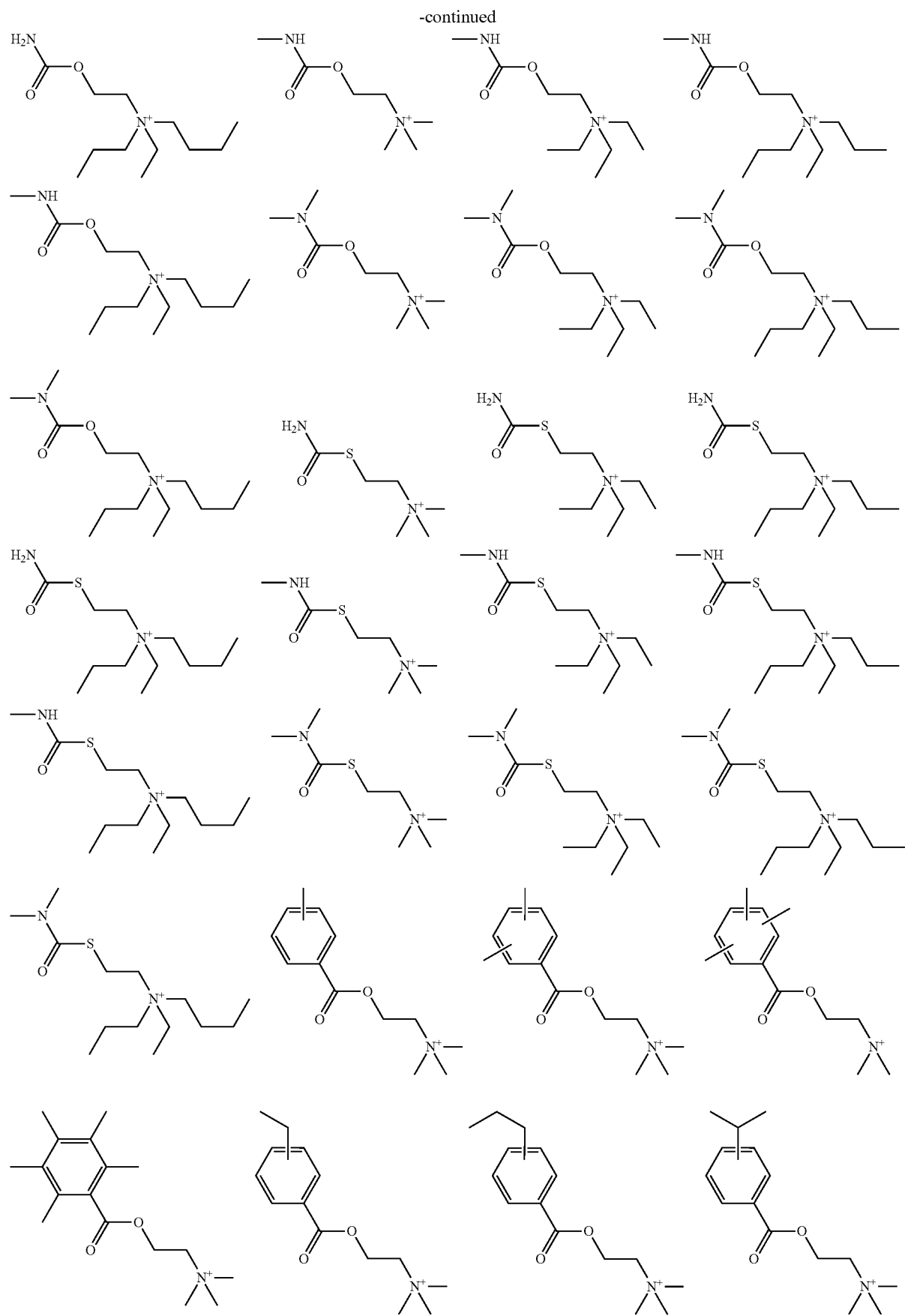

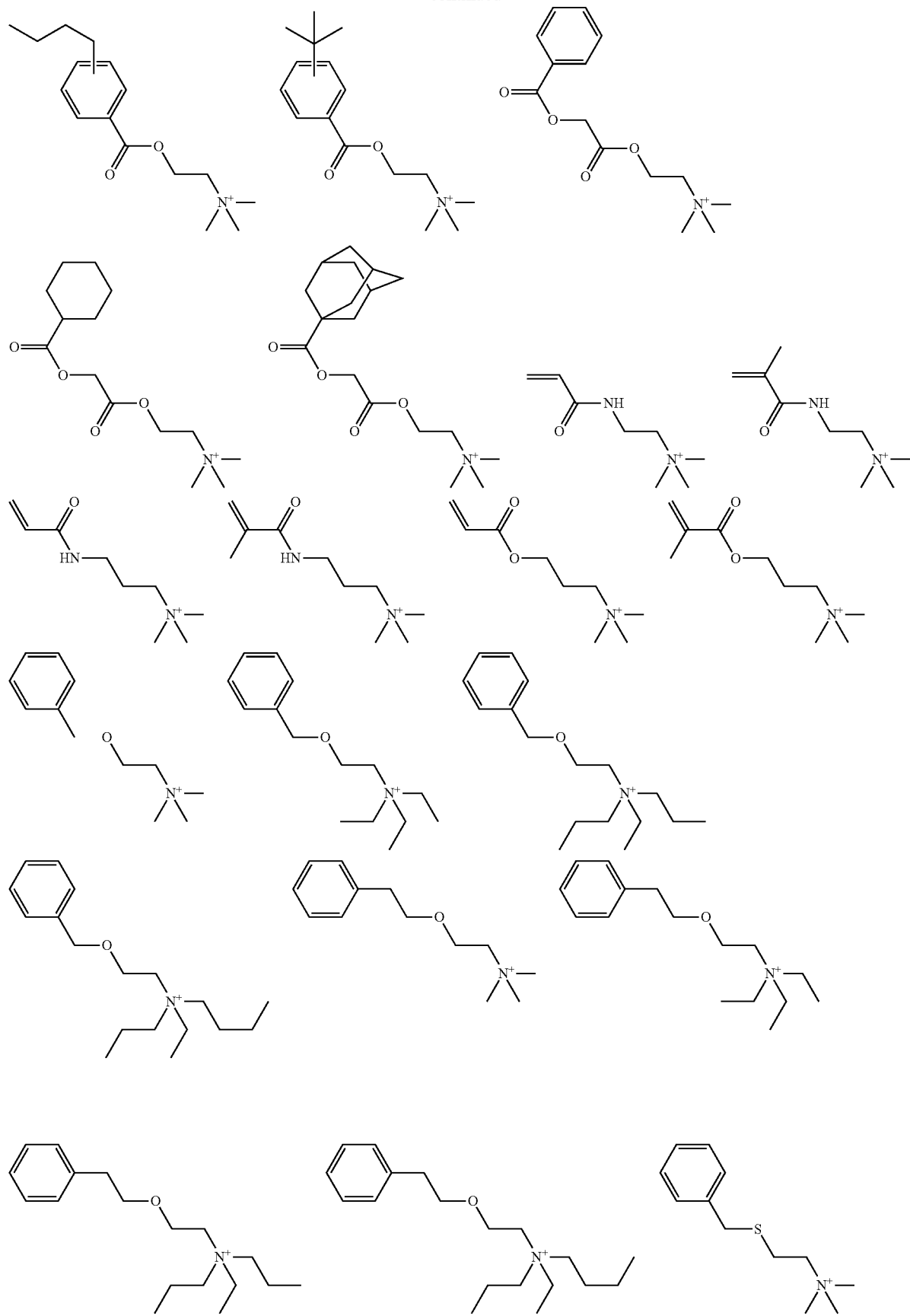

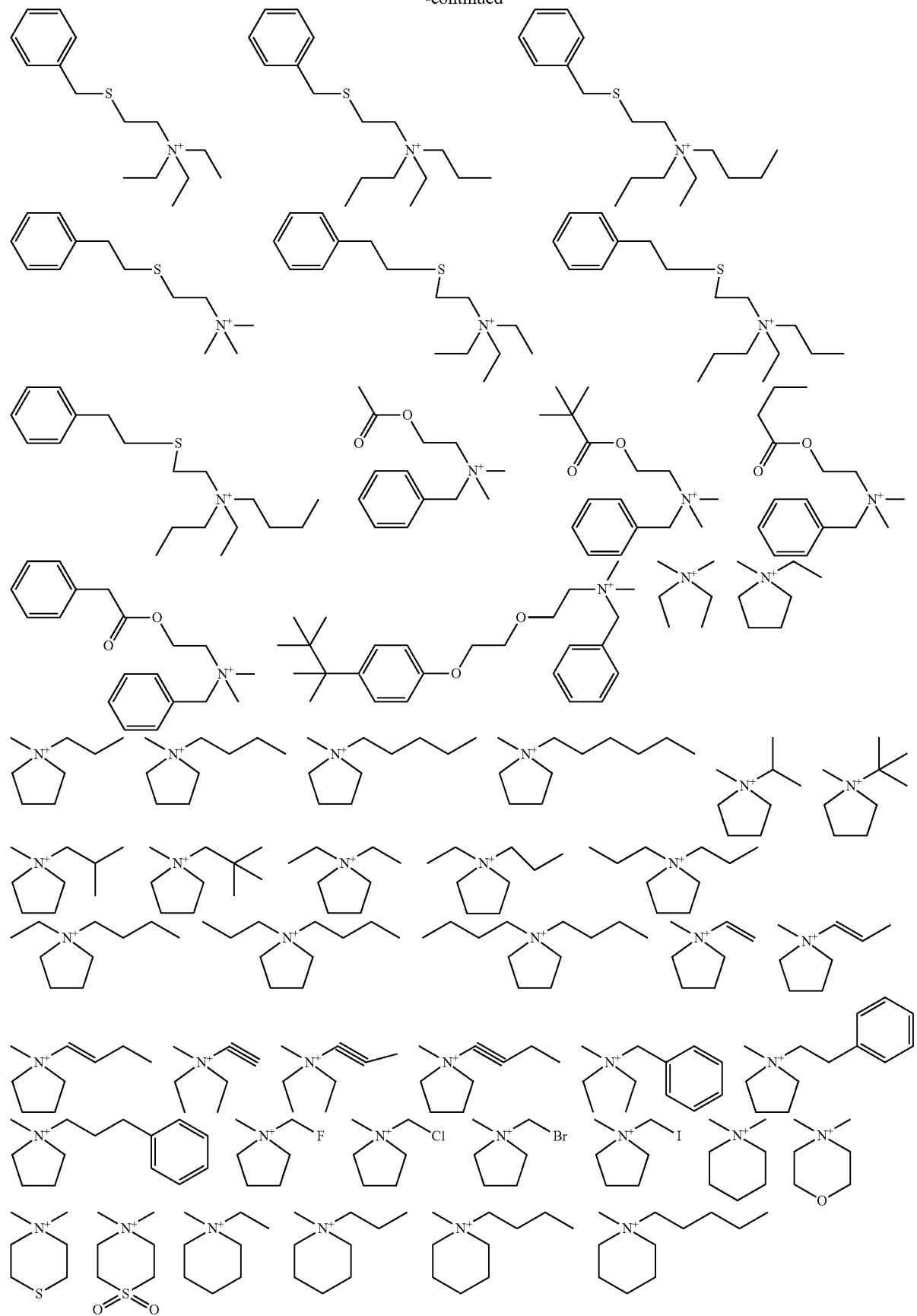

-continued
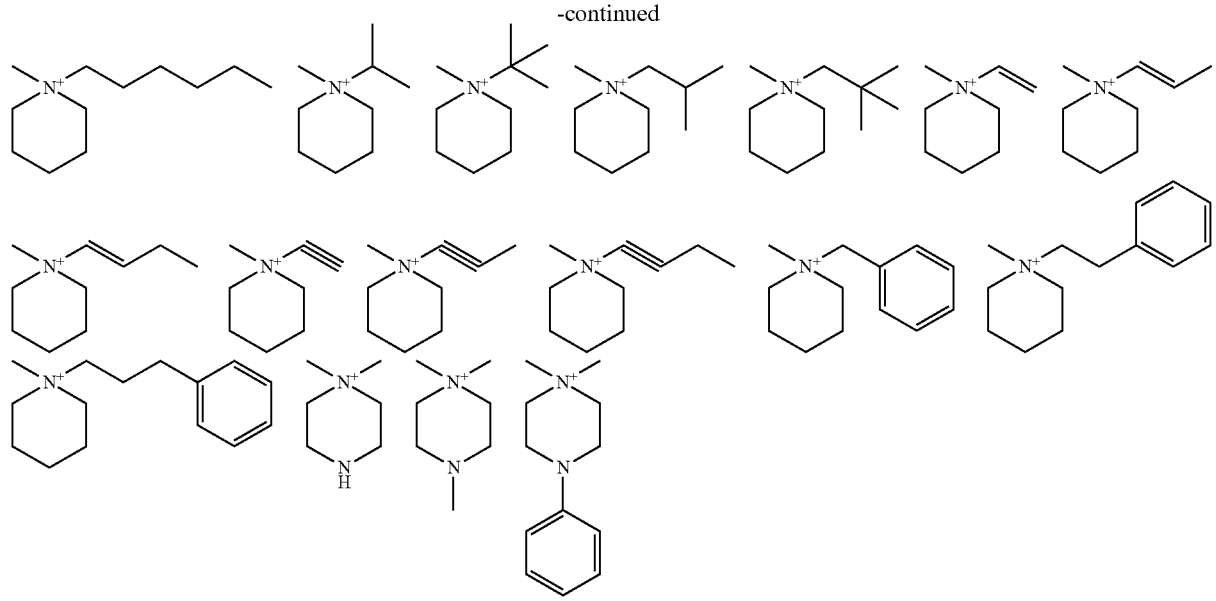
Examples of the cation moiety in the quaternary ammonium salt of formula (2) are given below, but not limited thereto.
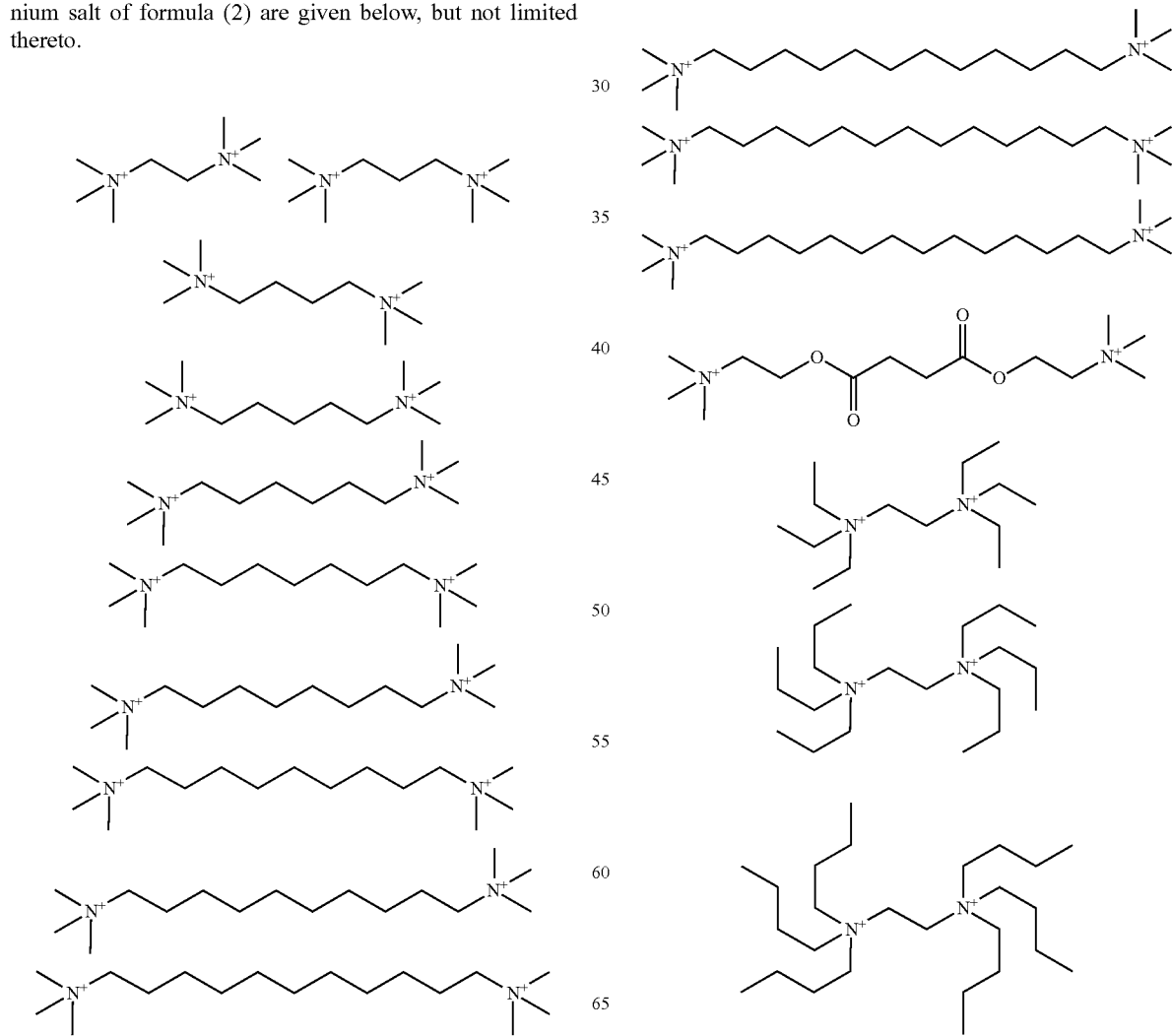

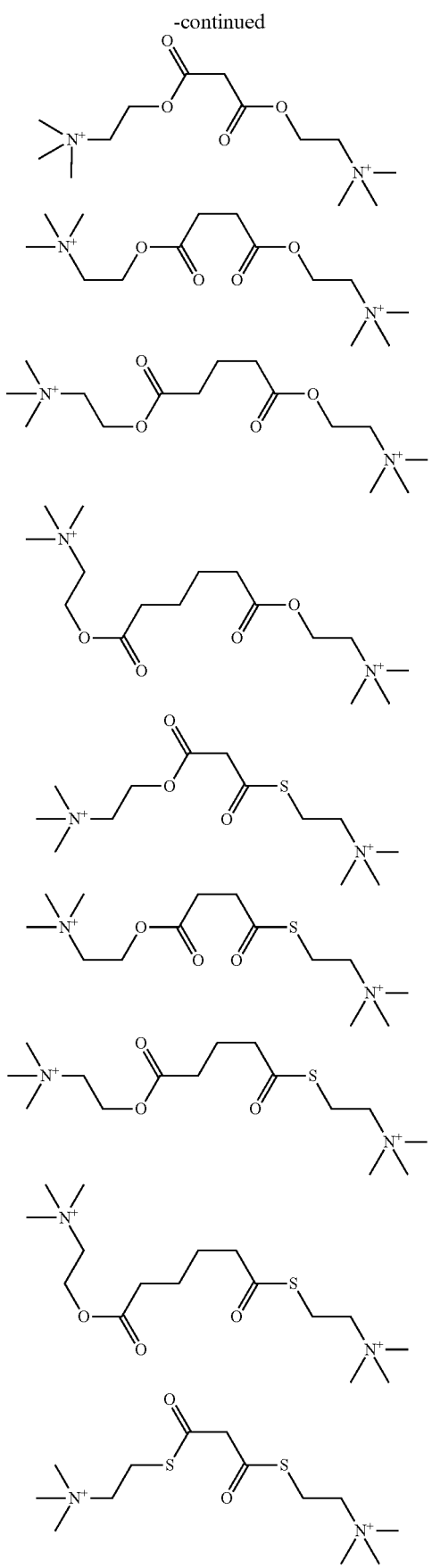

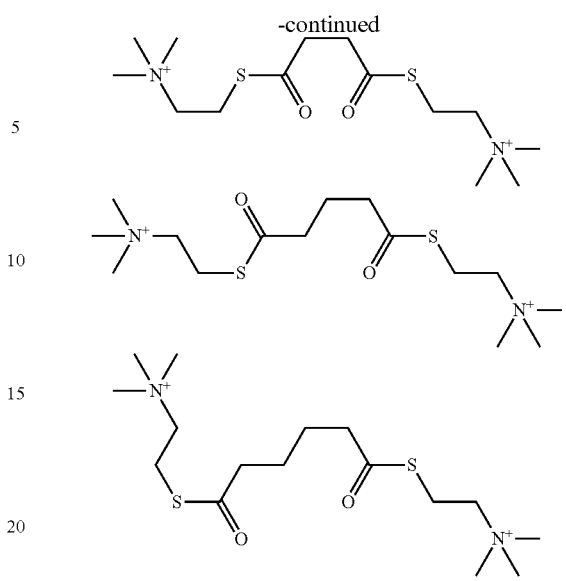

Since the quaternary ammonium salt contains an iodine atom or atoms in the molecule, it has substantial EUV absorption. Upon EUV exposure, it generates secondary electrons, followed by energy transfer to an acid generator, leading to sensitization. This establishes a high sensitivity and low acid diffusion, succeeding in improving both LWR or CDU and sensitivity.

The quaternary ammonium salt may be synthesized, for example, by neutralization reaction of a quaternary ammonium hydroxide with hydriodic acid. Also commercially available products are useful as the quaternary ammonium salt.

From the standpoints of sensitivity and acid diffusion suppressing effect, the quaternary ammonium salt is preferably present in the resist composition in an amount of 0.001 to 50 parts, more preferably 0.01 to 20 parts by weight per 100 parts by weight of the base polymer to be described below.

The quencher may contain a quencher other than the quaternary ammonium salt. The other quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl, ether, ester, lactone ring, cyano, or sulfonic acid ester group as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Quenchers of polymer type as described in U.S. Pat. No. 7,598,016 (JP-A 2008-239918) are also useful as the other quencher. The polymeric quencher segregates at the resist surface after coating and thus enhances the rectangularity of resist pattern. When a protective film is applied as is often the case in the immersion lithography, the polymeric quencher is also effective for preventing a film thickness loss of resist pattern or rounding of pattern top.

Also, an ammonium salt, sulfonium salt or iodonium salt may be added as the other quencher. Suitable ammonium salts, sulfonium salts and iodonium salts added as the other quencher are salts with carboxylic add, sulfonic acid, sulfonimide and saccharin. The carboxylic acid used herein may or may not be fluorinated at α-position.

The other quencher is preferably added in an amount of 0 to 5 parts, more preferably 0 to 4 parts by weight per 100 parts by weight of the base polymer.

Acid Generator

The chemically amplified resist composition contains an acid generator. The acid generator used herein may be either an acid generator of addition type which is different from the quaternary ammonium salt and components to be described later, or an acid generator of polymer type which also functions as a base polymer, that is, an acid generator-and-base polymer component.

The acid generator of addition type is typically a compound (PAG) capable of generating an acid upon exposure to actinic ray or radiation. Although the PAG used herein may be any compound capable of generating an acid upon exposure to high-energy radiation, those compounds capable of generating sulfonic acid, sulfonimide or sulfonmethide are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG, compounds having the formula (A) are also preferably used.

(A)

In formula (A), $R^{101}$, $R^{102}$ and $R^{103}$ are each independently a $C_1$-$C_{20}$ straight, branched or cyclic monovalent hydrocarbon group which may contain a heteroatom, any two of $R^{101}$, $R^{102}$ and $R^{103}$ may bond together to form a ring with the sulfur atom to which they are attached.

In formula (A), X⁻ is an anion selected from the formulae (A1) to (A4).

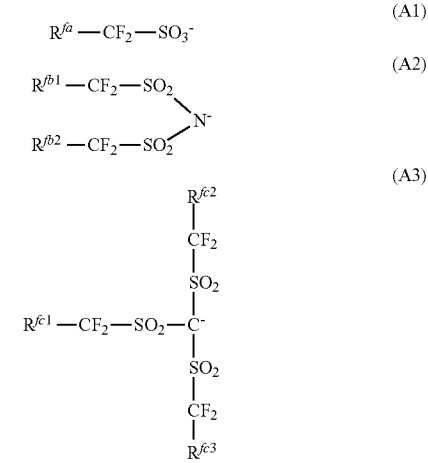

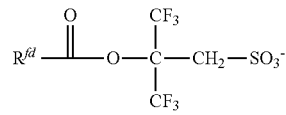

In formula (A1), $R^{fa}$ is fluorine or a $C_1$-$C_{40}$ straight, branched or cyclic monovalent hydrocarbon group which may contain a heteroatom.

Of the anions of formula (A1), a structure having formula (A1') is preferred.

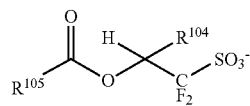

In formula (A1'), $R^{104}$ is hydrogen or trifluoromethyl, preferably trifluoromethyl. $R^{105}$ is a $C_1$-$C_{38}$ straight, branched or cyclic monovalent hydrocarbon group which may contain a heteroatom. Suitable heteroatoms include oxygen, nitrogen, sulfur and halogen, with oxygen being preferred. Of the monovalent hydrocarbon groups, those of 6 to 30 carbon atoms are preferred because a high resolution is available in fine pattern formation. Suitable monovalent hydrocarbon groups include methyl, ethyl, propyl, isopropyl, butyl, isobutyl, s-butyl, t-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, icosanyl, allyl, benzyl, diphenylmethyl, tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl. Also included are the foregoing groups in which at least one hydrogen is replaced by a radical containing a heteroatom such as oxygen, sulfur, nitrogen or halogen, or in which at least one carbon atom is replaced by a radical containing a heteroatom such as oxygen, sulfur or nitrogen, so that the group may contain a hydroxyl, cyano, carbonyl, ether, ester, sulfonic acid ester, carbonate, lactone ring, sultone ring, carboxylic acid anhydride or haloalkyl radical.

With respect to the synthesis of the sulfonium salt having an anion of formula (A1'), reference is made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the sulfonium salt having an anion of formula (A1) are shown below, but not limited thereto.

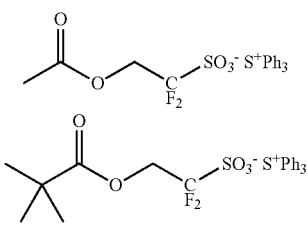

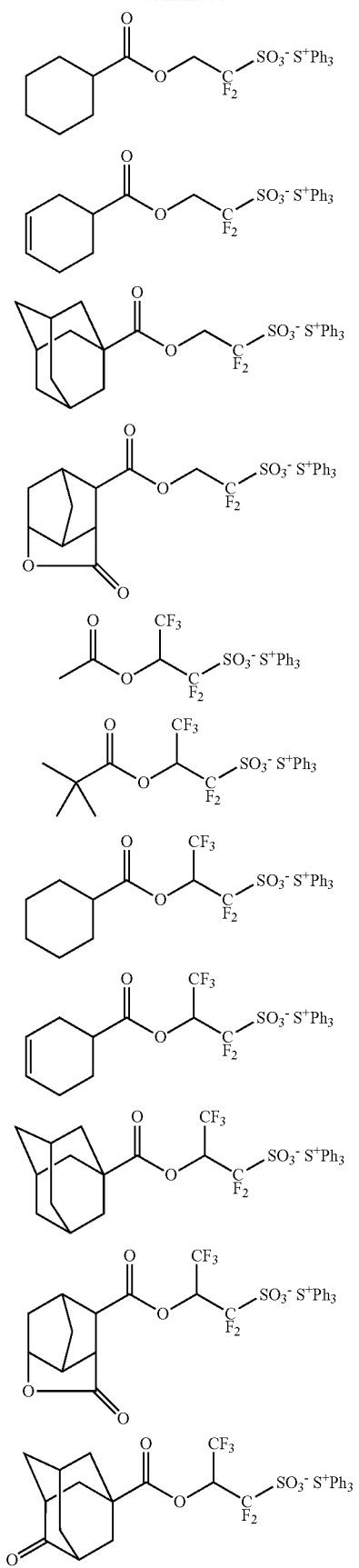
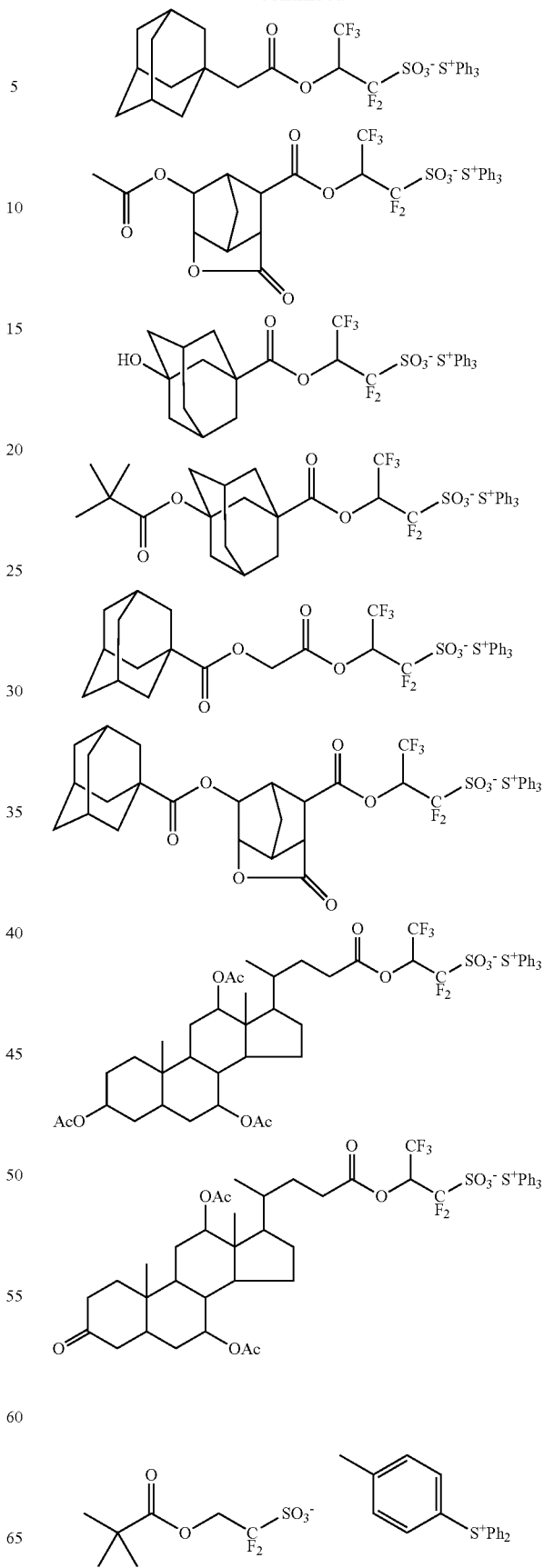

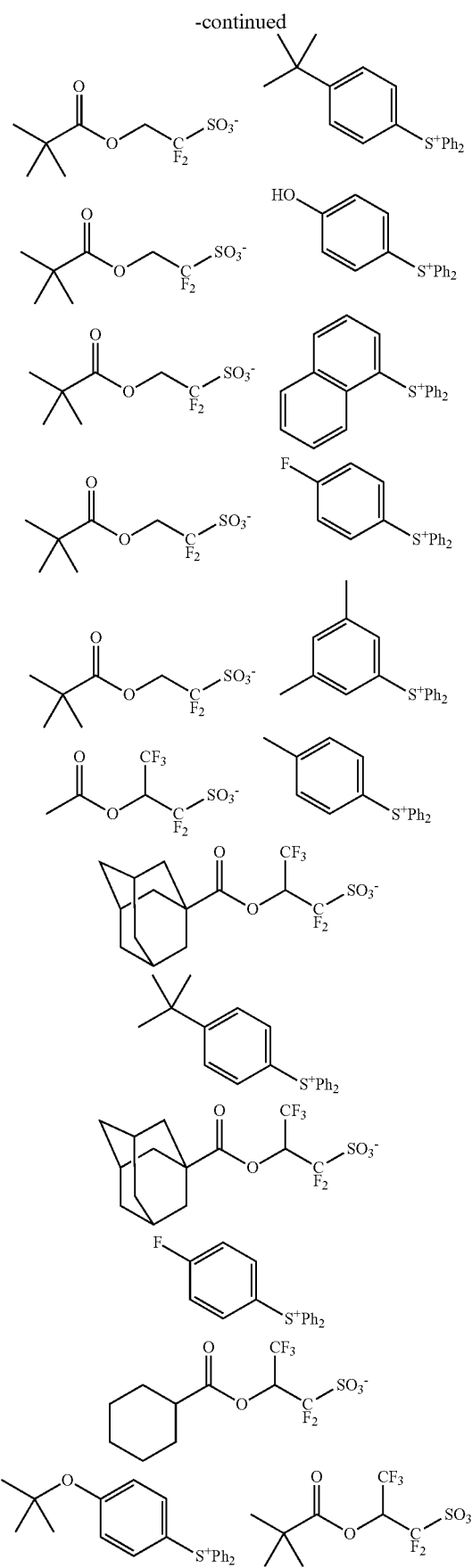
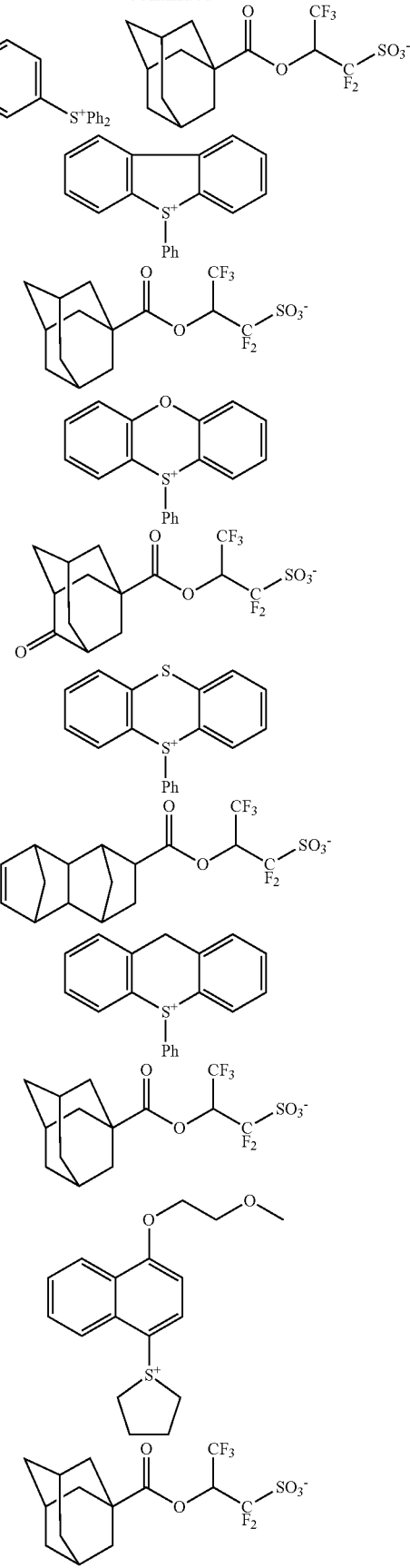

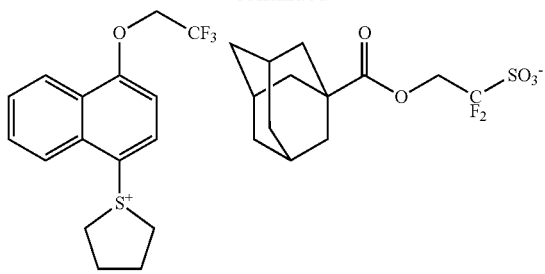
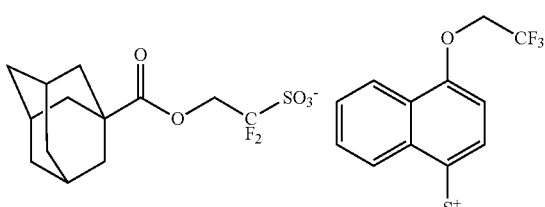
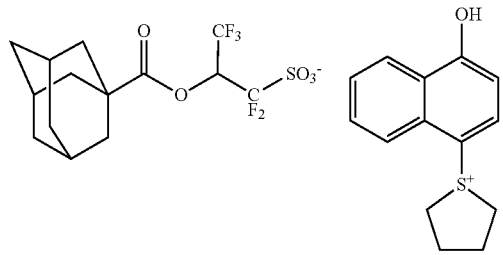
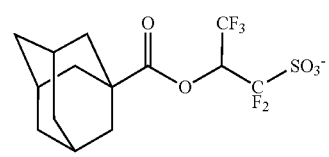
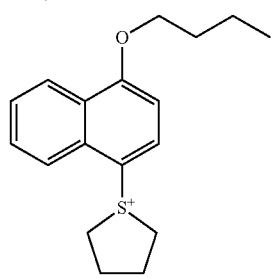
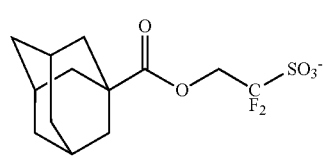

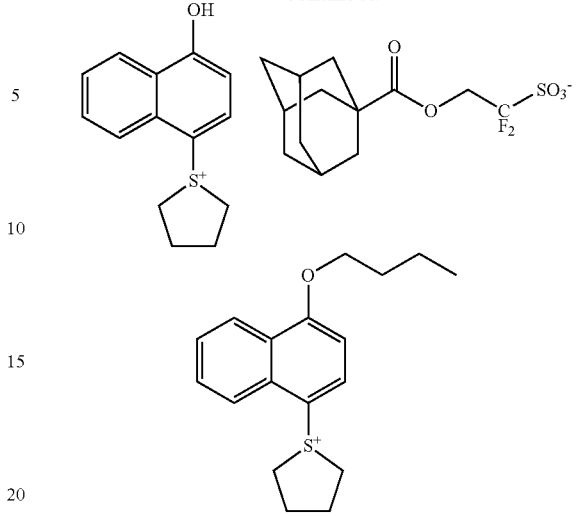

In formula (A2), $R^{fb1}$ and $R^{fb2}$ are each independently fluorine or a $C_1$-$C_{40}$ straight, branched or cyclic monovalent hydrocarbon group which may contains a heteroatom. Suitable monovalent hydrocarbon groups are as exemplified above for $R^{105}$. Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage ($-CF_2-SO_2-N^--SO_2-CF_2-$) to which they are attached, and preferably the pair is a fluorinated ethylene or fluorinated propylene group to form a ring structure.

In formula (A3), $R^{fc1}$, $R^{fc2}$ and $R^{fc3}$ are each independently fluorine or a $C_1$-$C_{40}$ straight, branched or cyclic monovalent hydrocarbon group which may contain a heteroatom. Suitable monovalent hydrocarbon groups are as exemplified above for $R^{105}$. Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage ($-CF_2-SO_2-C^--SO_2-CF_2-$) to which they are attached, and preferably the pair is a fluorinated ethylene or fluorinated propylene group to form a ring structure.

In formula (A4), $R^{fd}$ is a $C_1$-$C_{40}$ straight, branched or cyclic monovalent hydrocarbon group which may contain a heteroatom. Suitable monovalent hydrocarbon groups are as exemplified above for $R^{105}$.

With respect to the synthesis of the sulfonium salt having an anion of formula (A4), reference is made to JP-A 2010-215608 and JP-A 2014-133723.

Examples of the sulfonium salt having an anion of formula (A4) are shown below, but not limited thereto.

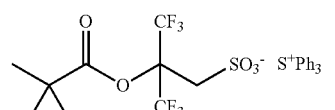
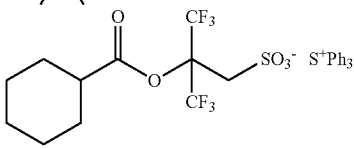

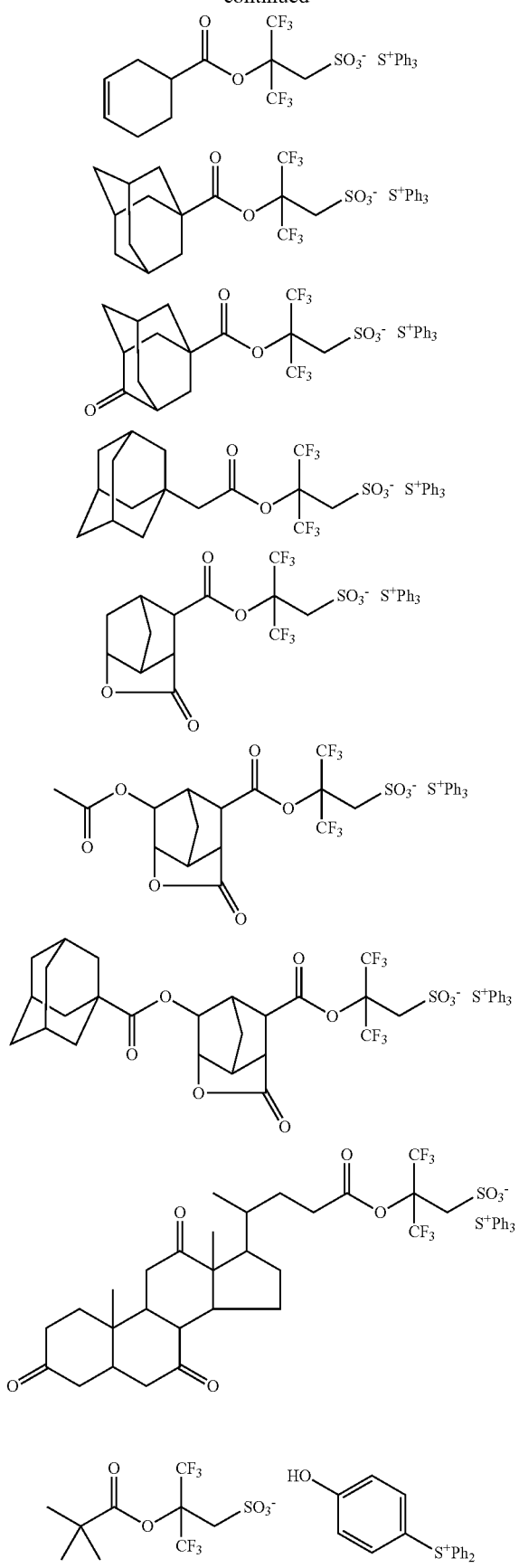
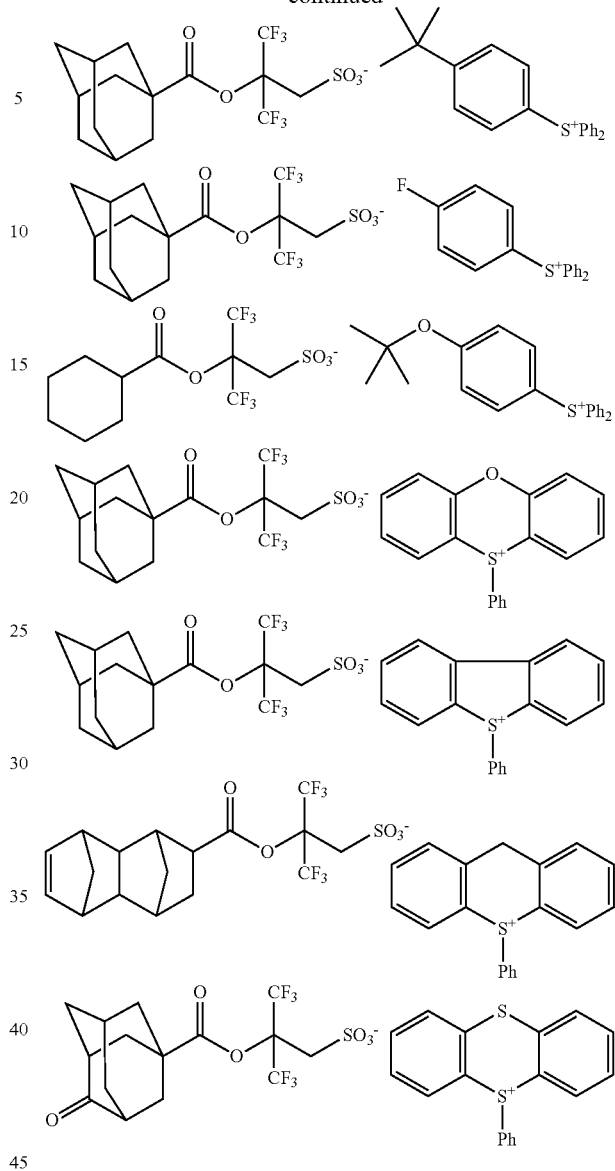

The compound having the anion of formula (A4) has a sufficient acid strength to cleave acid labile groups in the base polymer because it is free of fluorine at α-position of sulfo group, but has two trifluoromethyl groups at β-position. Thus the compound is a useful PAG.

Also compounds having the formula (B) are useful as the PAG.

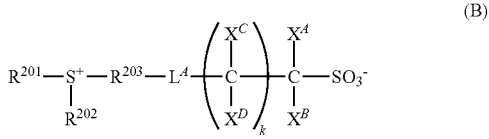

In formula (B), $R^{201}$ and $R^{202}$ are each independently a $C_1$-$C_{30}$ straight, branched or cyclic monovalent hydrocarbon group which may contain a heteroatom. $R^{203}$ is a $C_1$-$C_{30}$ straight, branched or cyclic divalent hydrocarbon group which may contain a heteroatom. Any two of $R^{201}$, $R^{202}$ and $R^{203}$ may bond together to form a ring with the sulfur atom to which they are attached. $L^A$ is a single bond, ether group or a straight, branched or cyclic $C_1$-$C_{20}$ divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

Suitable monovalent hydrocarbon groups include methyl, ethyl, propyl, isopropyl, n-butyl, s-butyl, t-butyl, n-pentyl, t-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, adamantyl, phenyl, naphthyl and anthracenyl. Also included are the foregoing groups in which at least one hydrogen is replaced by a radical containing a heteroatom such as oxygen, sulfur, nitrogen or halogen, or in which at least one carbon is replaced by a radical containing a heteroatom such as oxygen, sulfur or nitrogen, so that the group may contain a hydroxyl, cyano, carbonyl, ether, ester, sulfonic acid ester, carbonate, lactone ring, sultone ring, carboxylic acid anhydride or haloalkyl radical.

Suitable divalent hydrocarbon groups include linear alkane diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl; saturated cyclic divalent hydrocarbon groups such as cyclopentanediyl, cyclohexanediyl, norbornanediyl, and adamantanediyl; and unsaturated cyclic divalent hydrocarbon groups such as phenylene and naphthylene. Also included are the foregoing groups in which at least one hydrogen atom is replaced by an alkyl group such as methyl, ethyl, propyl, n-butyl or t-butyl, or in which at least one hydrogen atom is replaced by a radical containing a heteroatom such as oxygen, sulfur, nitrogen or halogen, or in which at least one carbon atom is replaced by a radical containing a heteroatom such as oxygen, sulfur or nitrogen, so that the group may contain a hydroxyl, cyano, carbonyl, ether, ester, sulfonic acid ester, carbonate, lactone ring, sultone ring, carboxylic acid anhydride or haloalkyl radical. Suitable heteroatoms include oxygen, nitrogen, sulfur and halogen, with oxygen being preferred.

Of the PAGs having formula (B), those having formula (B') are preferred.

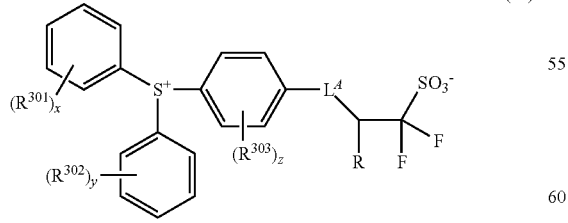
(B')

In formula (B'), $L^A$ is as defined above. R is hydrogen or trifluoromethyl, preferably trifluoromethyl. $R^{301}$, $R^{302}$ and $R^{303}$ are each independently hydrogen or a $C_1$-$C_{20}$ straight, branched or cyclic monovalent hydrocarbon group which may contain a heteroatom. Suitable monovalent hydrocarbon groups are as exemplified above for $R^{105}$. The subscripts x and y each are an integer of 0 to 5, and z is an integer of 0 to 4.

Examples of the PAG having formula (B) are shown below, but not limited thereto. Herein R is as defined above.

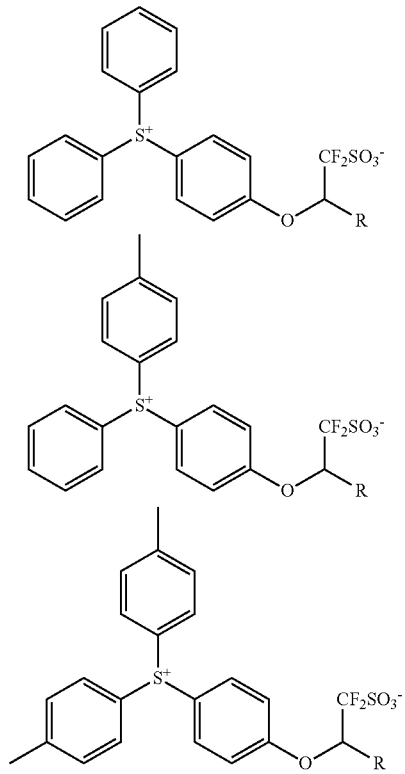

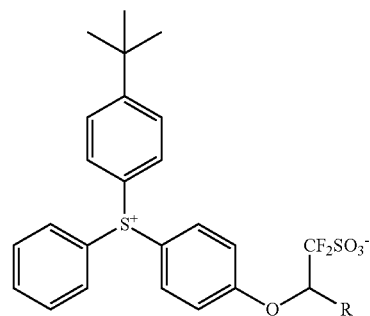

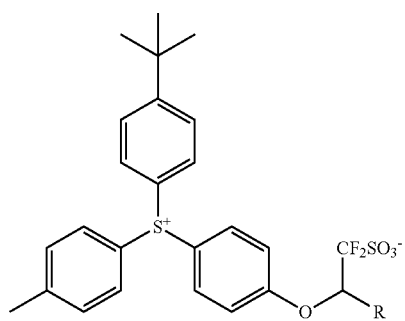

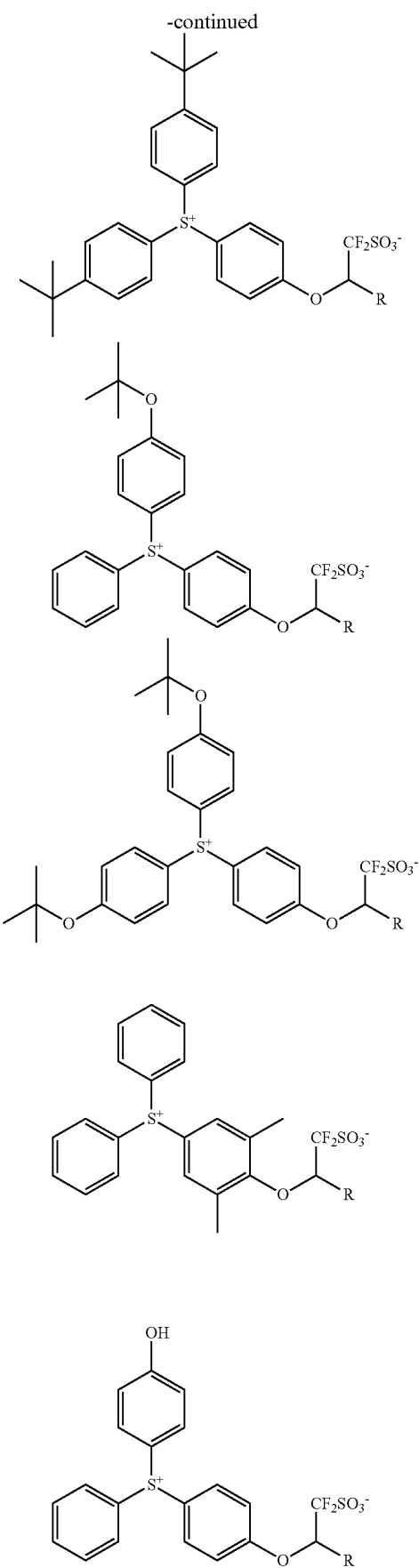
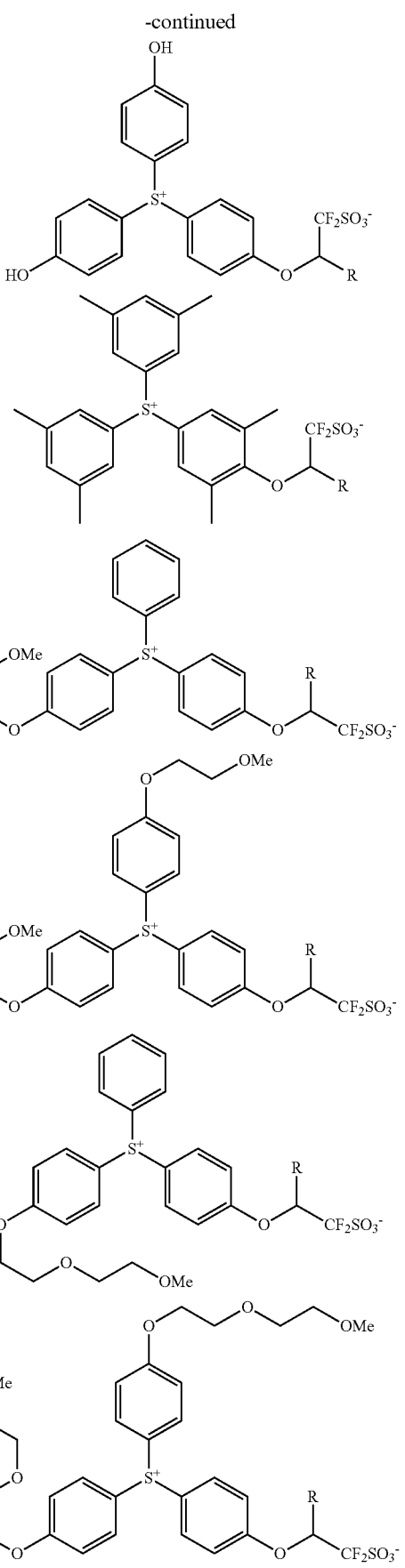

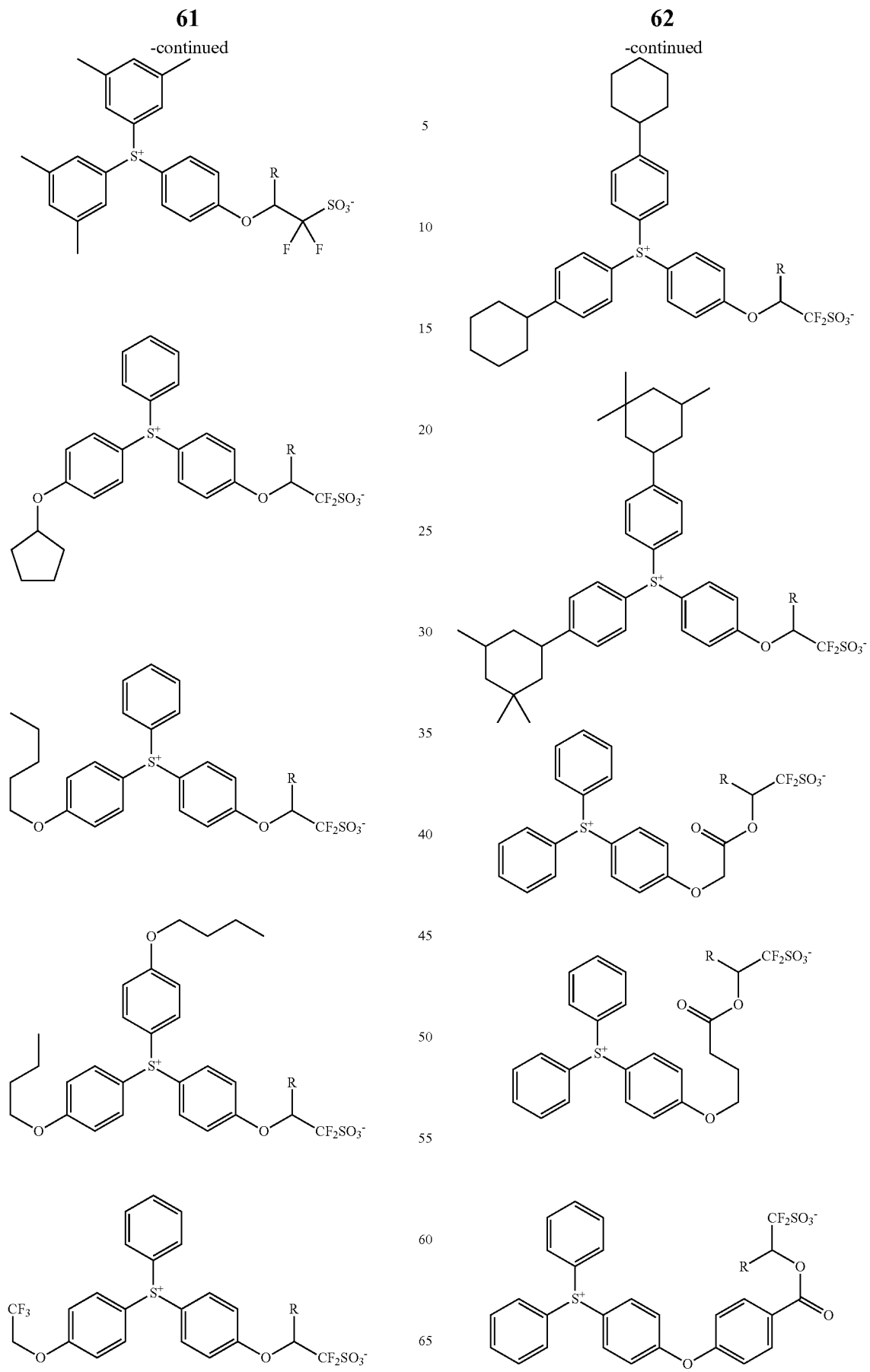

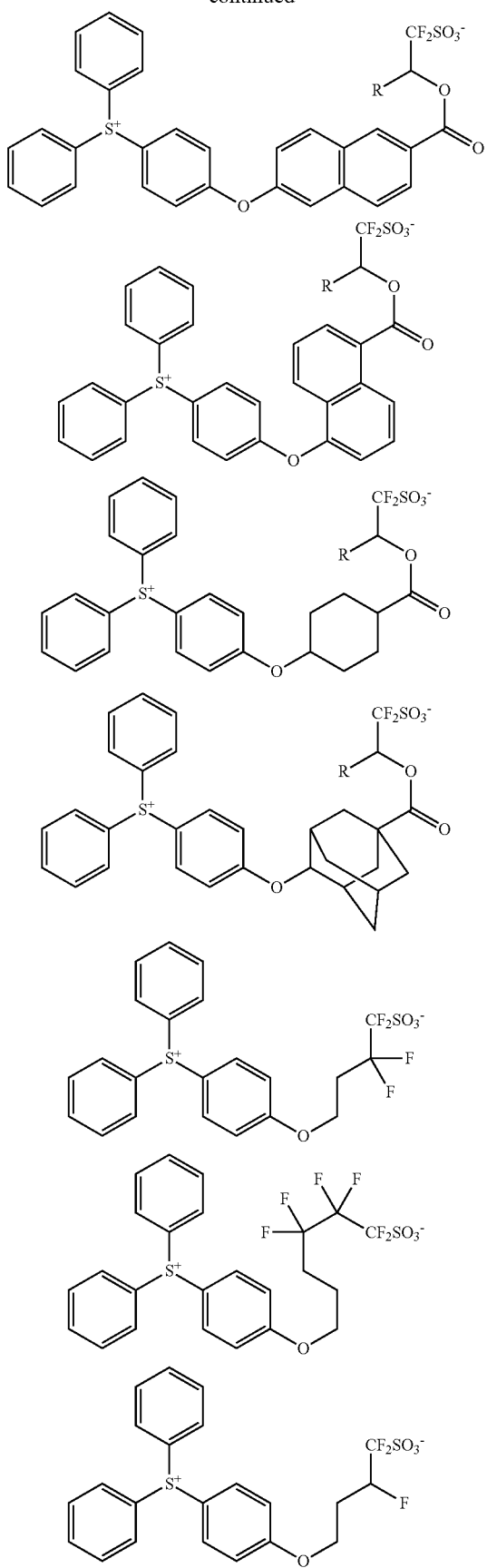
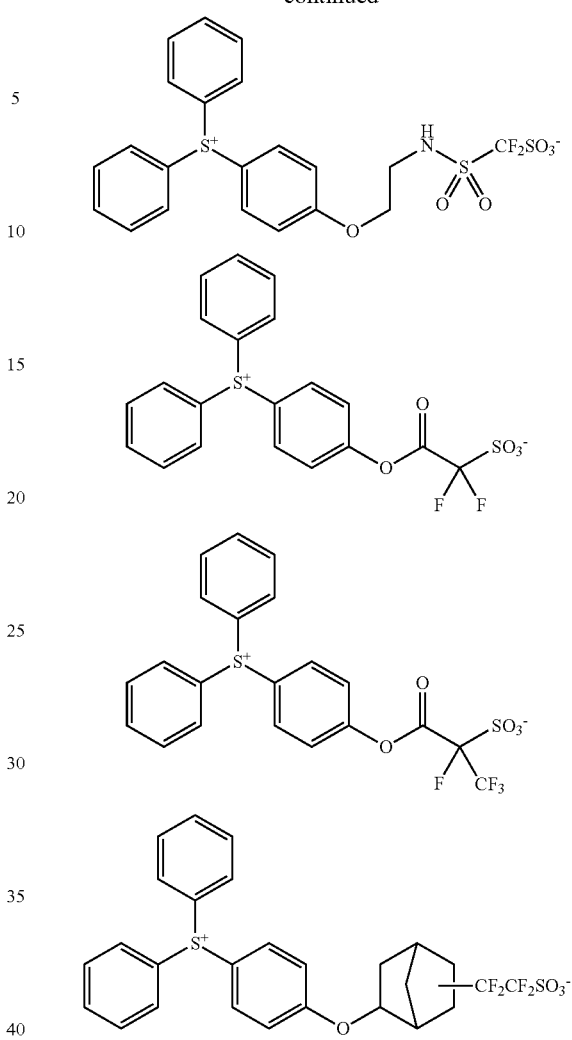

Of the foregoing PAGs, those compounds having an anion of formula (A1') or (A4) are especially preferred because of reduced acid diffusion and high solubility in resist solvent, and those compounds having an anion of formula (B') are especially preferred because of minimized acid diffusion.

An appropriate amount of the acid generator of addition type is 0.1 to 50 parts, more preferably 1 to 40 parts by weight per 100 parts by weight of the base polymer.

In case the acid generator is an acid generator-and-base polymer, this acid generator is a polymer, preferably comprising recurring units derived from a compound capable of generating an acid in response to actinic light or radiation. In this case, the acid generator is preferably a base polymer to be described below, specifically comprising recurring units (f) as essential unit.

Base Polymer

In the case of a positive resist composition, the base polymer in the resist composition is a polymer comprising acid labile group-containing recurring units. The acid labile group-containing recurring units are preferably recurring units having the formula (a1) or recurring units having the formula (a2). Sometimes these recurring units are simply referred to as recurring units (a1) and (a2).

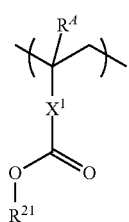
(a1)

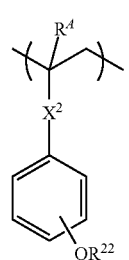
(a2)

Herein $R^A$ is each independently hydrogen or methyl. $R^{21}$ and $R^{22}$ are each independently an acid labile group. $X^1$ is a single bond, phenylene, naphthylene, or a $C_1$-$C_{12}$ linking group containing ester moiety or lactone ring. $X^2$ is a single bond or ester group.

Examples of the recurring units (a1) are shown below, but not limited thereto. Herein $R^A$ and $R^{21}$ are as defined above.

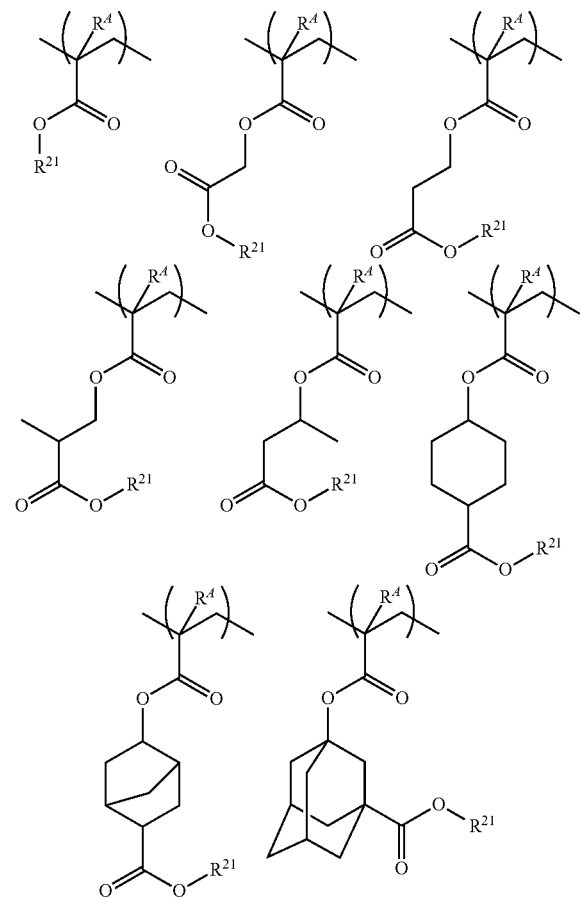

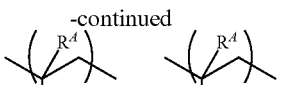
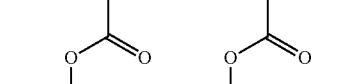
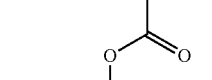
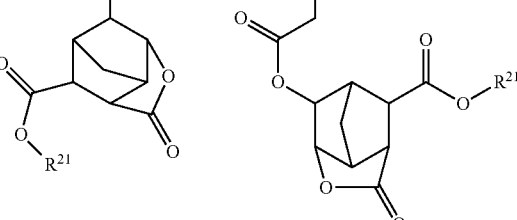

The acid labile groups represented by $R^{21}$ and $R^{22}$ in the recurring units (a1) and (a2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

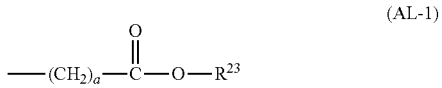
(AL-1)

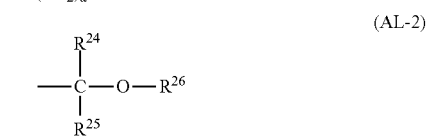
(AL-2)

(AL-3)

In formulae (AL-1) and (AL-2), $R^{23}$ and $R^{26}$ are each independently a monovalent hydrocarbon group of 1 to 40 carbon atoms, preferably 1 to 20 carbon atoms, typically straight, branched or cyclic alkyl, which may contain a heteroatom such as oxygen, sulfur, nitrogen or fluorine. $R^{24}$ and $R^{25}$ are each independently hydrogen or a monovalent hydrocarbon group of 1 to 20 carbon atoms, typically straight, branched or cyclic alkyl, which may contain a heteroatom such as oxygen, sulfur, nitrogen or fluorine. The subscript "a" is an integer of 0 to 10, especially 1 to 5. A pair of $R^{24}$ and $R^{25}$, $R^{24}$ and $R^{26}$, or $R^{25}$ and $R^{26}$ may bond together to form a ring, typically alicyclic, with the carbon atom or carbon and oxygen atoms to which they are attached, the ring containing 3 to 20 carbon atoms, preferably 4 to 16 carbon atoms.

In formula (AL-3), $R^{27}$, $R^{28}$ and $R^{29}$ are each independently a monovalent hydrocarbon group of 1 to 20 carbon atoms, typically straight, branched or cyclic alkyl, which may contain a heteroatom such as oxygen, sulfur, nitrogen or fluorine. A pair of $R^{27}$ and $R^{28}$, $R^{27}$ and $R^{29}$, or $R^{28}$ and $R^{29}$ may bond together to form a ring, typically alicyclic, with the carbon atom to which they are attached, the ring containing 3 to 20 carbon atoms, preferably 4 to 16 carbon atoms.

The base polymer may further comprise recurring units (b) having a phenolic hydroxyl group as an adhesive group. Examples of suitable monomers from which recurring units (b) are derived are given below, but not limited thereto. Herein $R^A$ is as defined above.

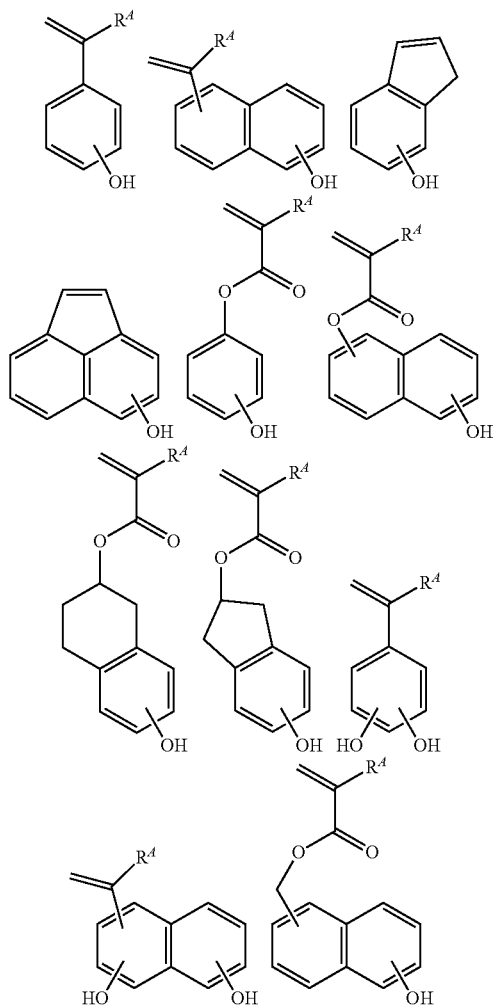

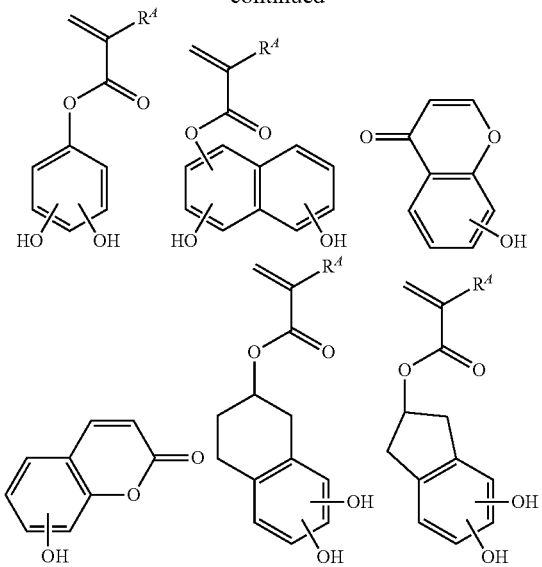

Further, recurring units (c) having another adhesive group selected from hydroxyl (other than the foregoing phenolic hydroxyl), lactone ring, ether, ester, carbonyl and cyano groups may also be incorporated in the base polymer. Examples of suitable monomers from which recurring units (c) are derived are given below, but not limited thereto. Herein $R^A$ is as defined above.

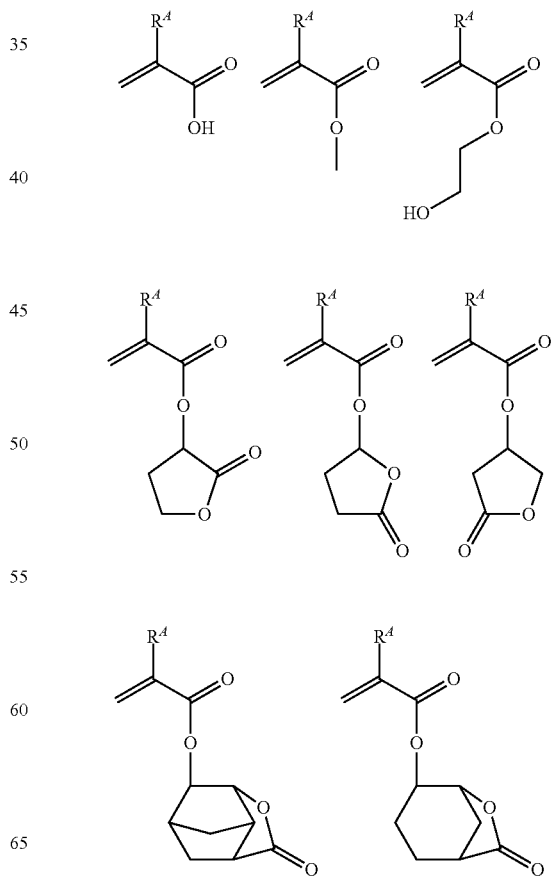

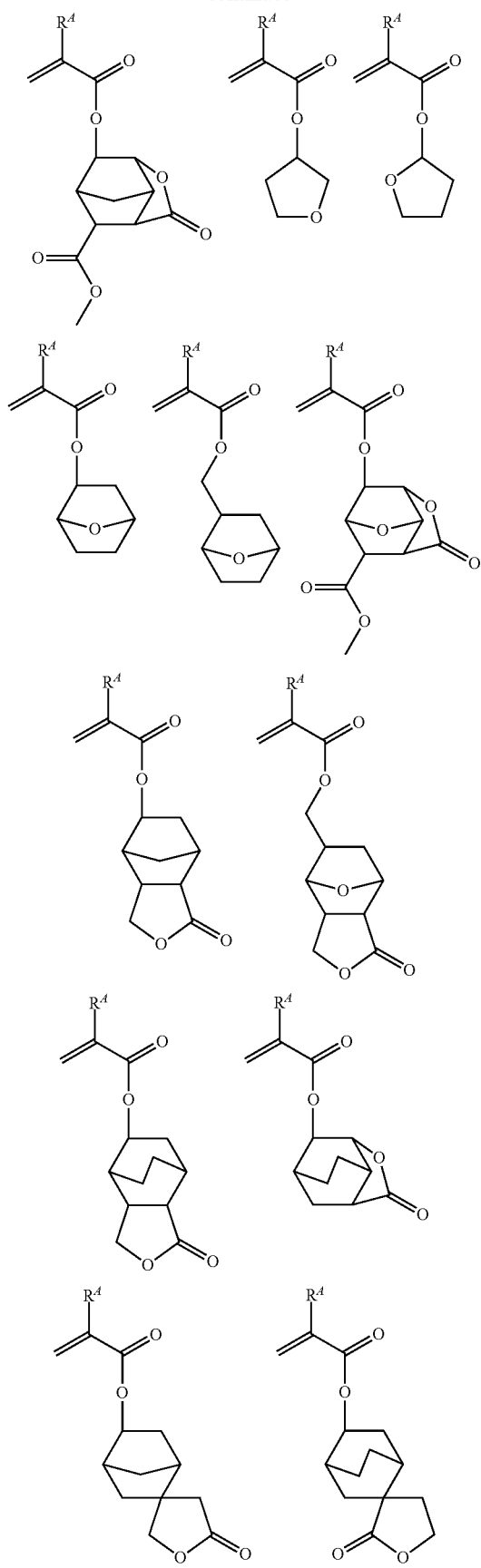
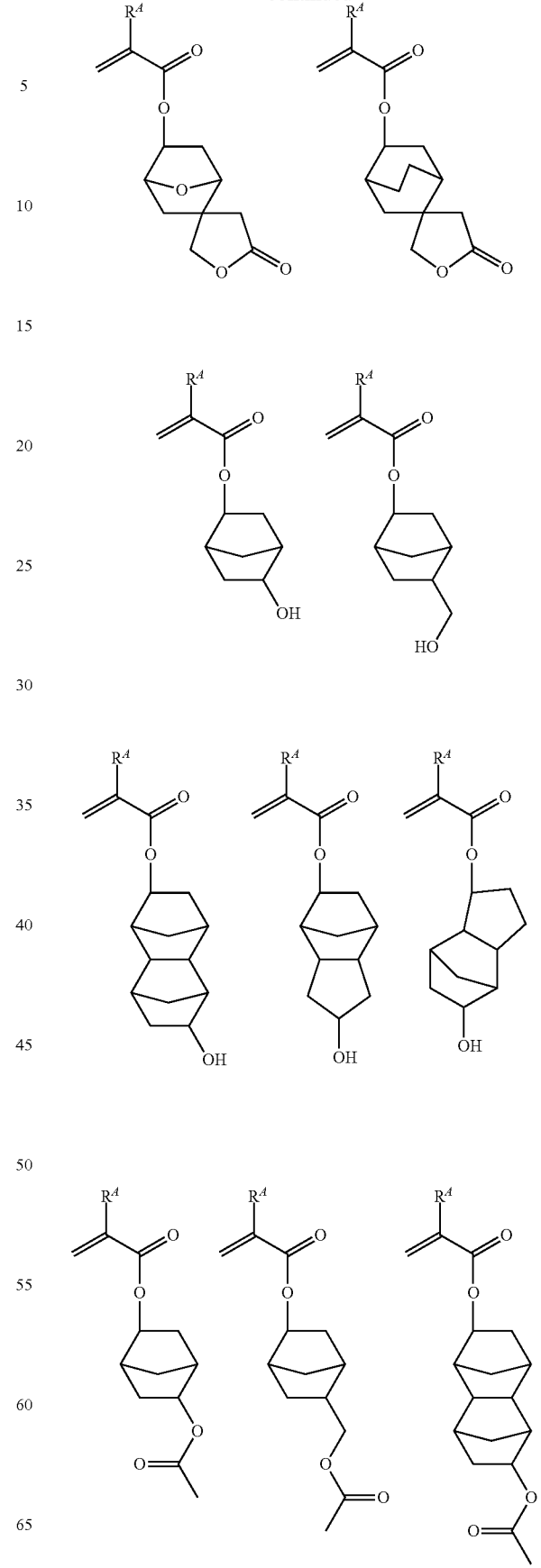

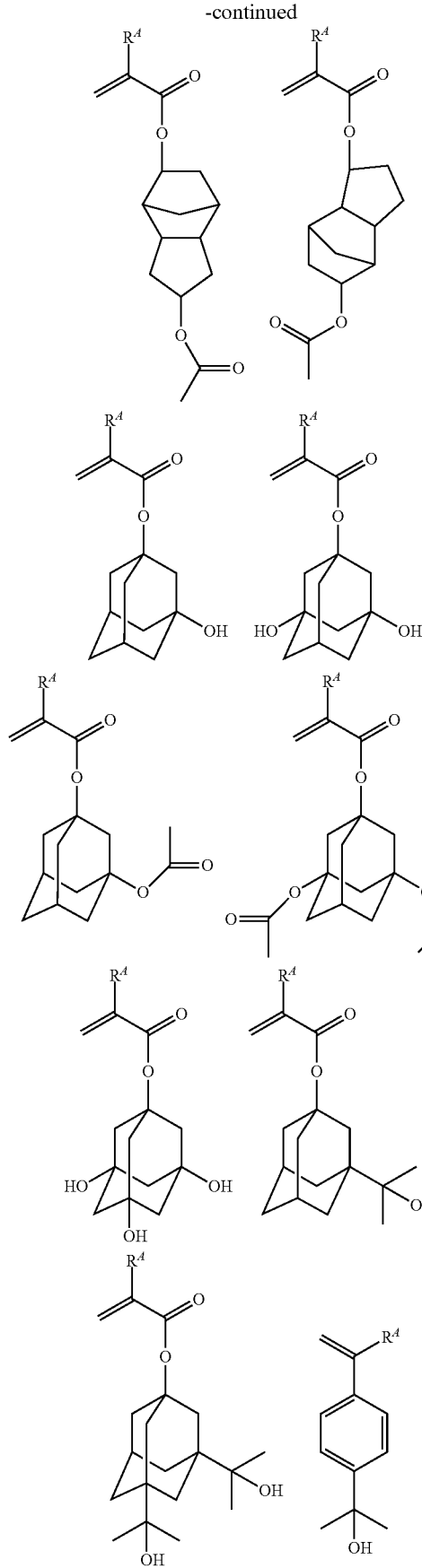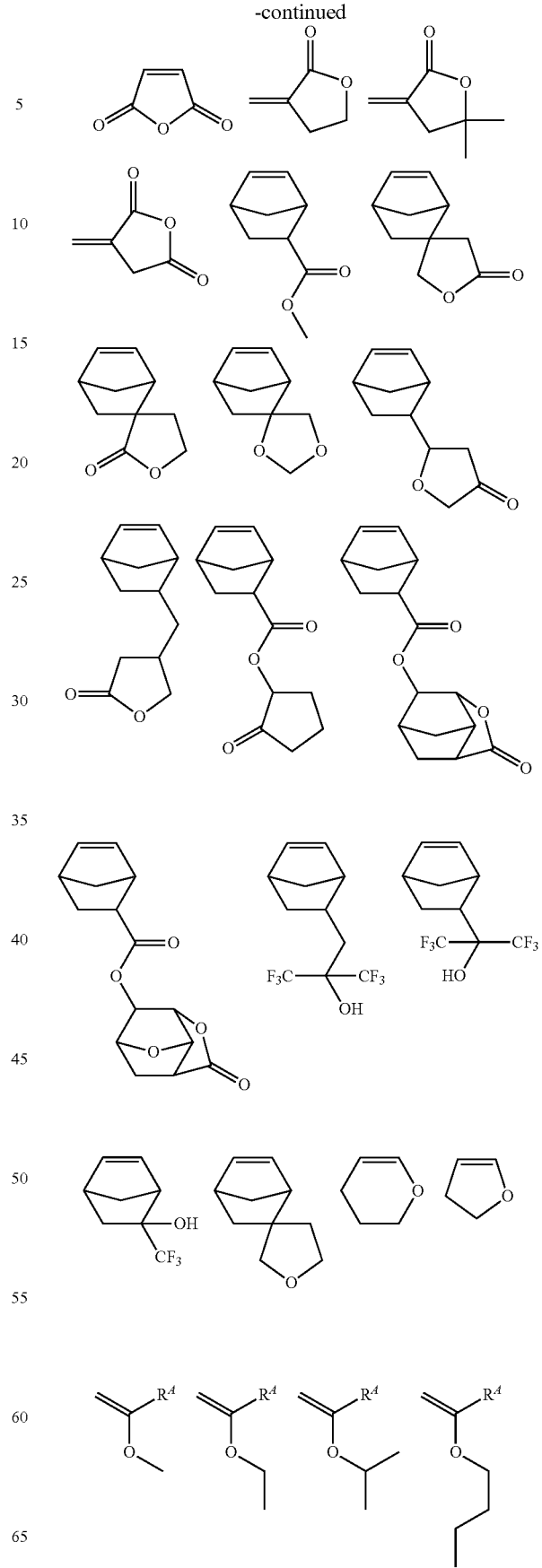

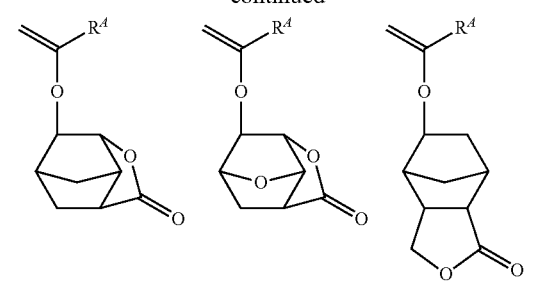
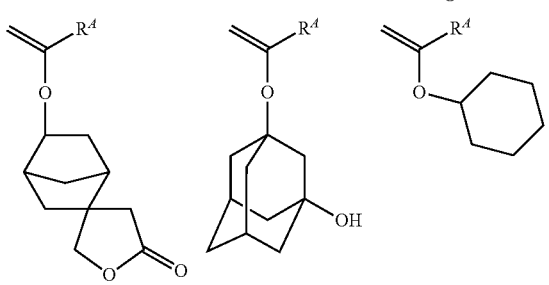
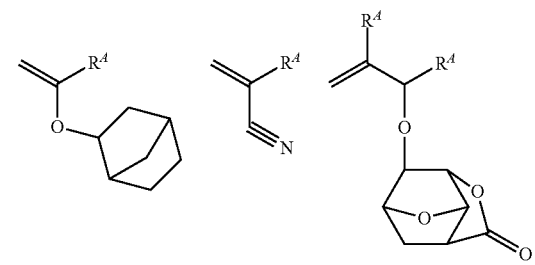
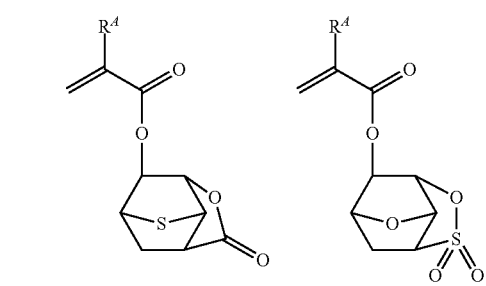
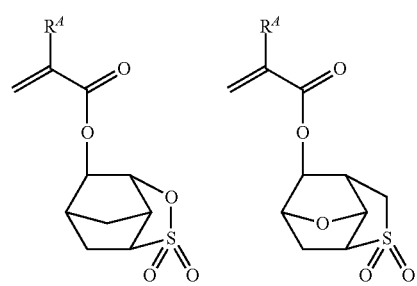
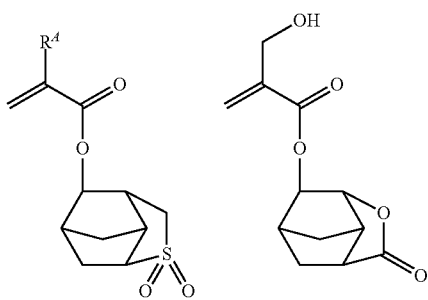
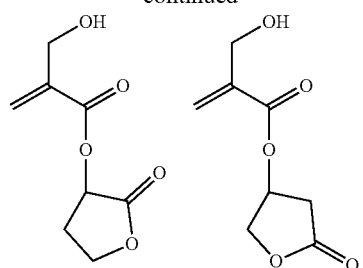
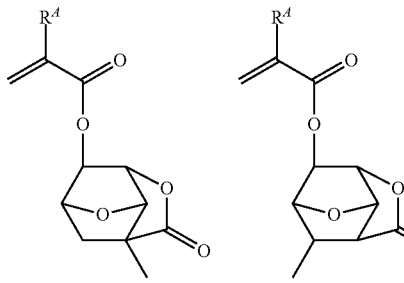
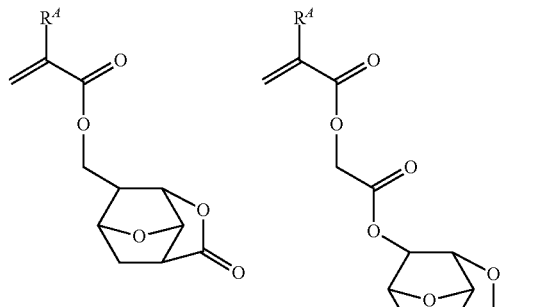
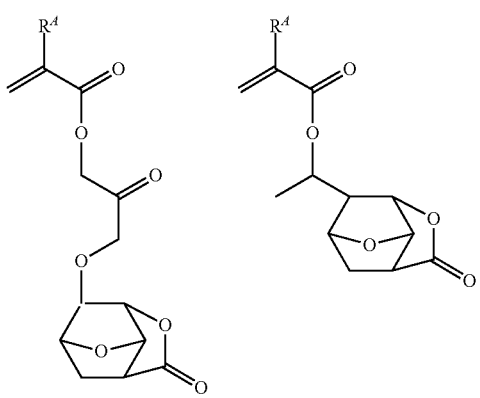
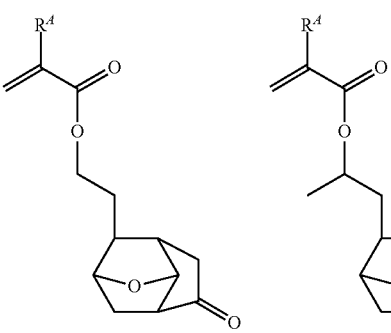

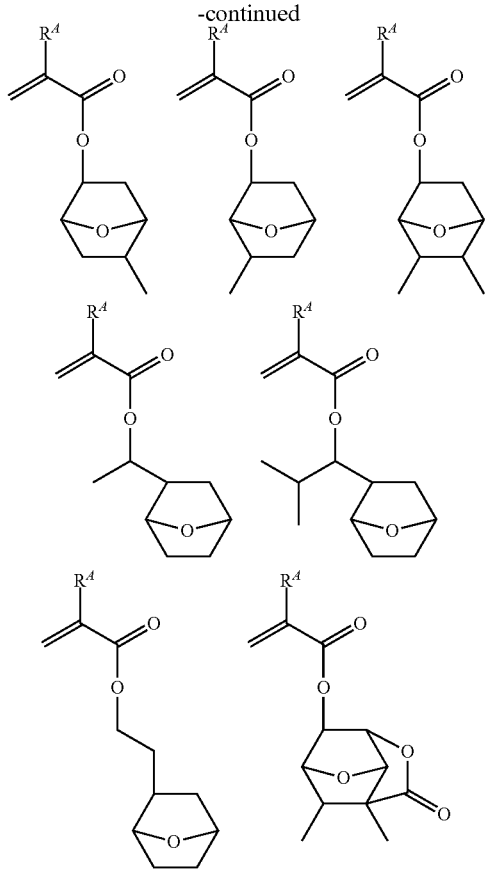
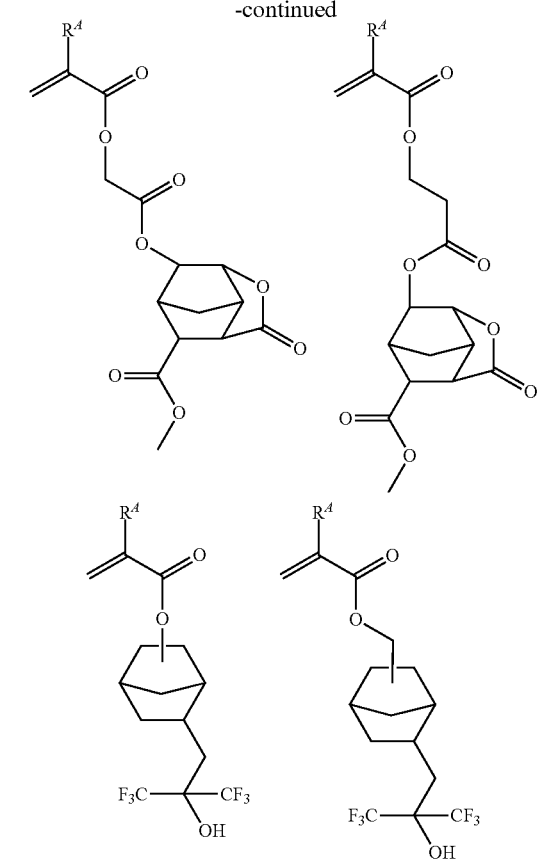
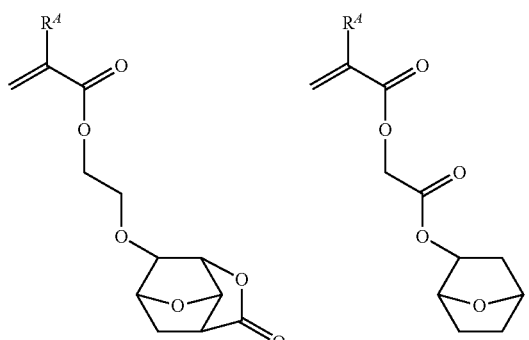
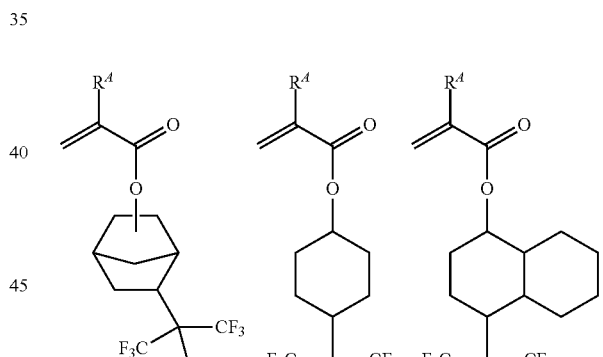
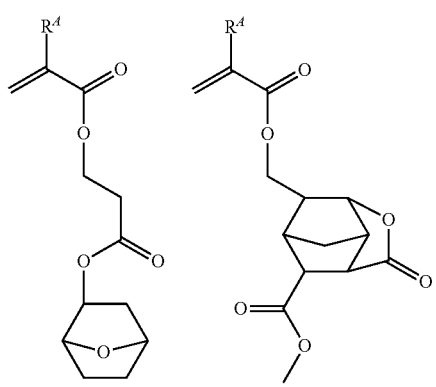
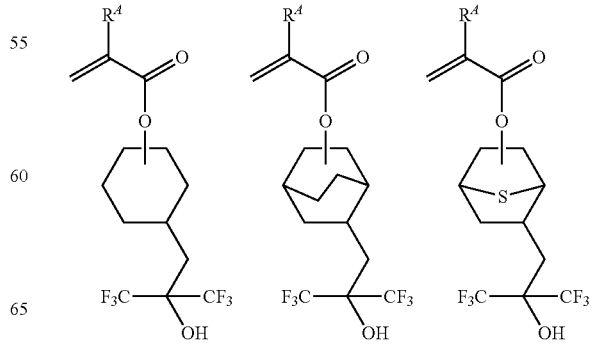

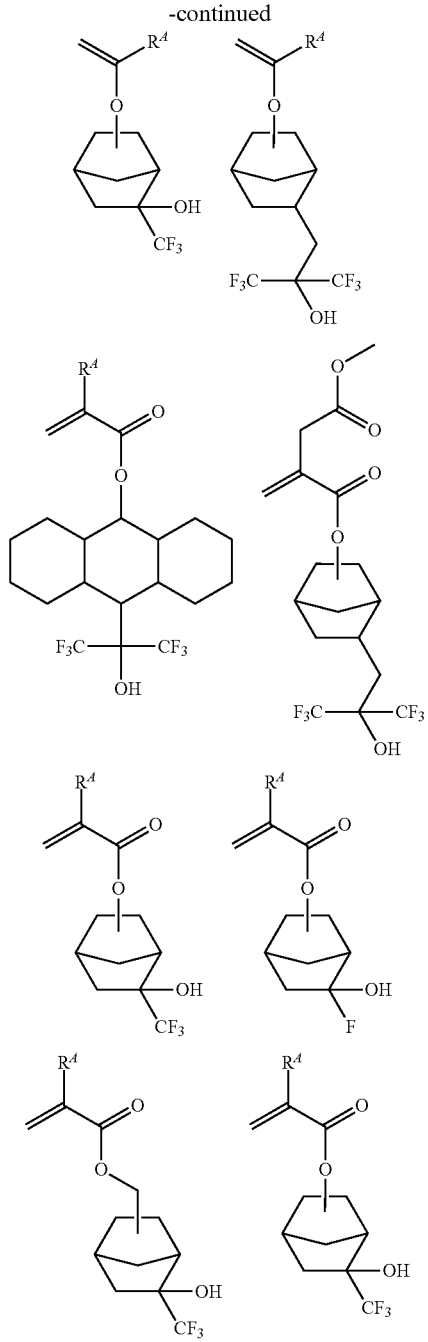
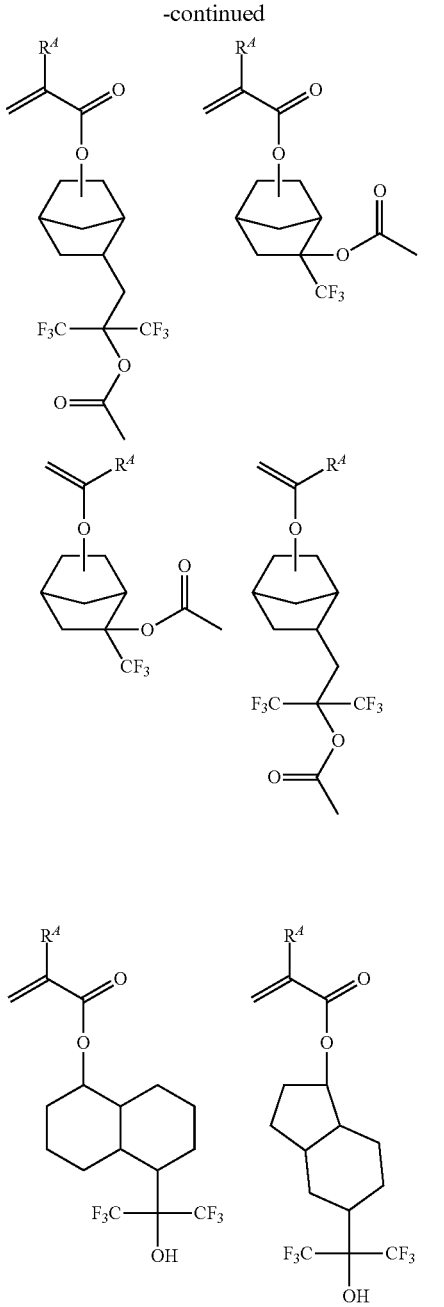
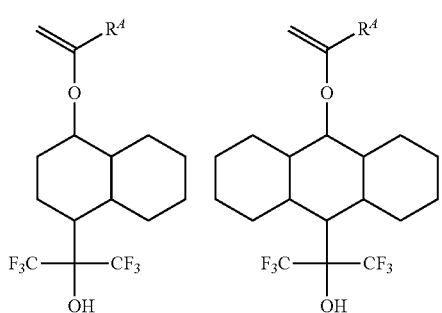

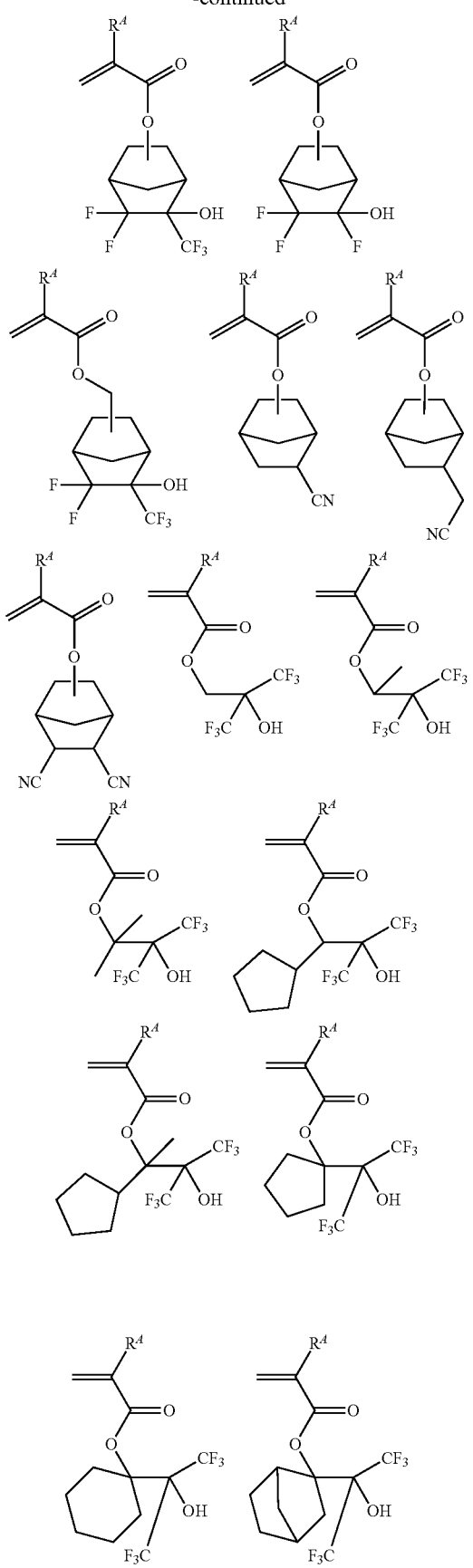
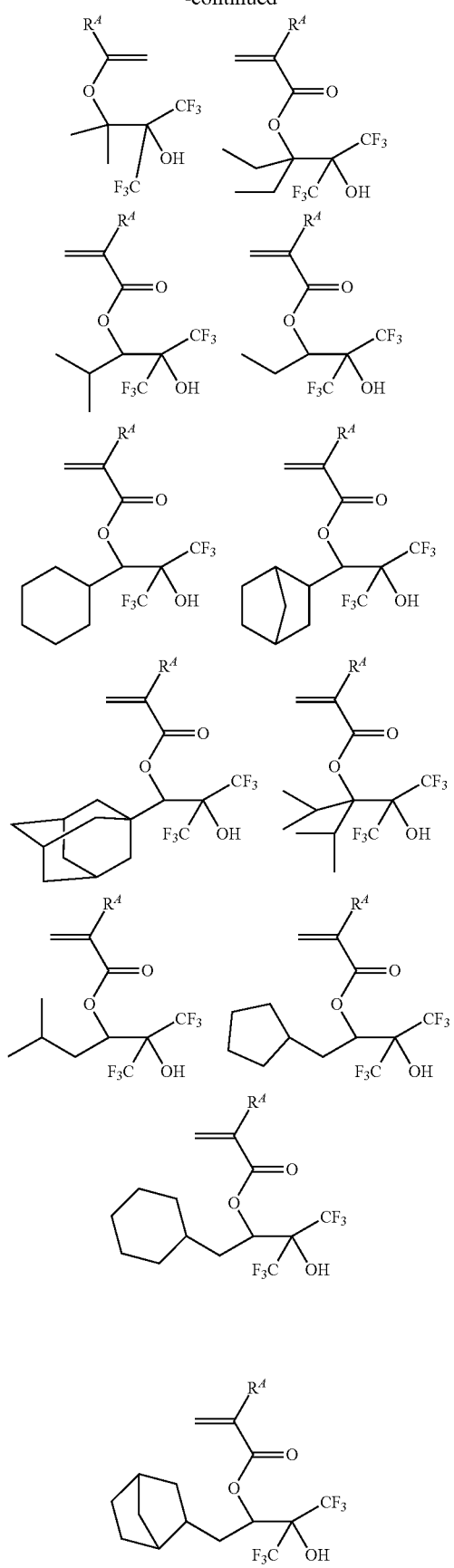

-continued
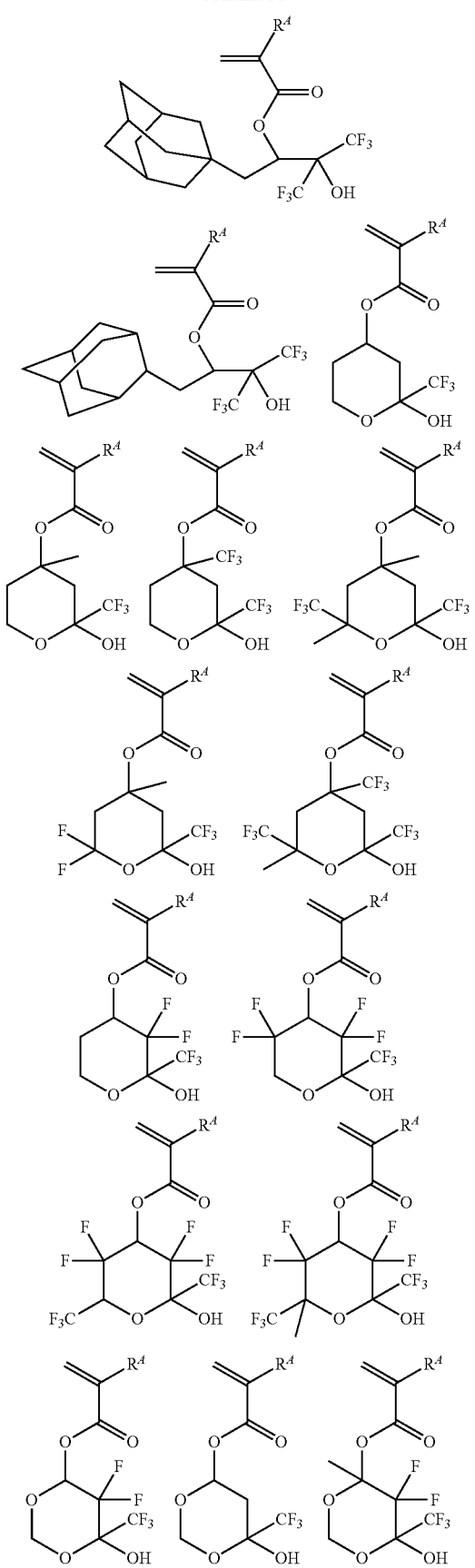
-continued
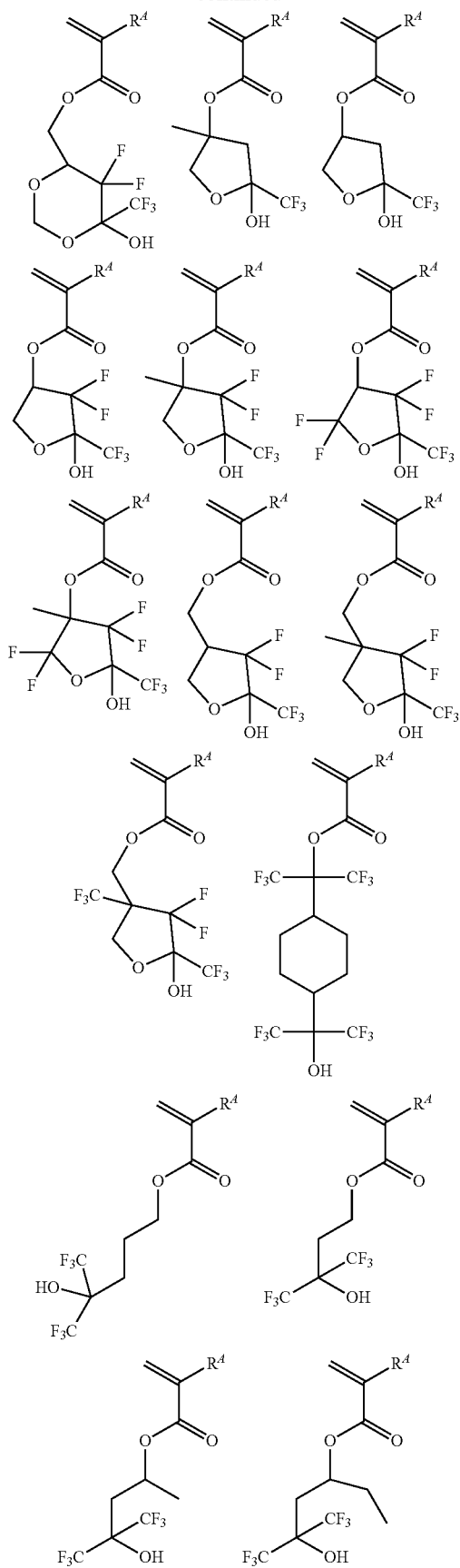

-continued
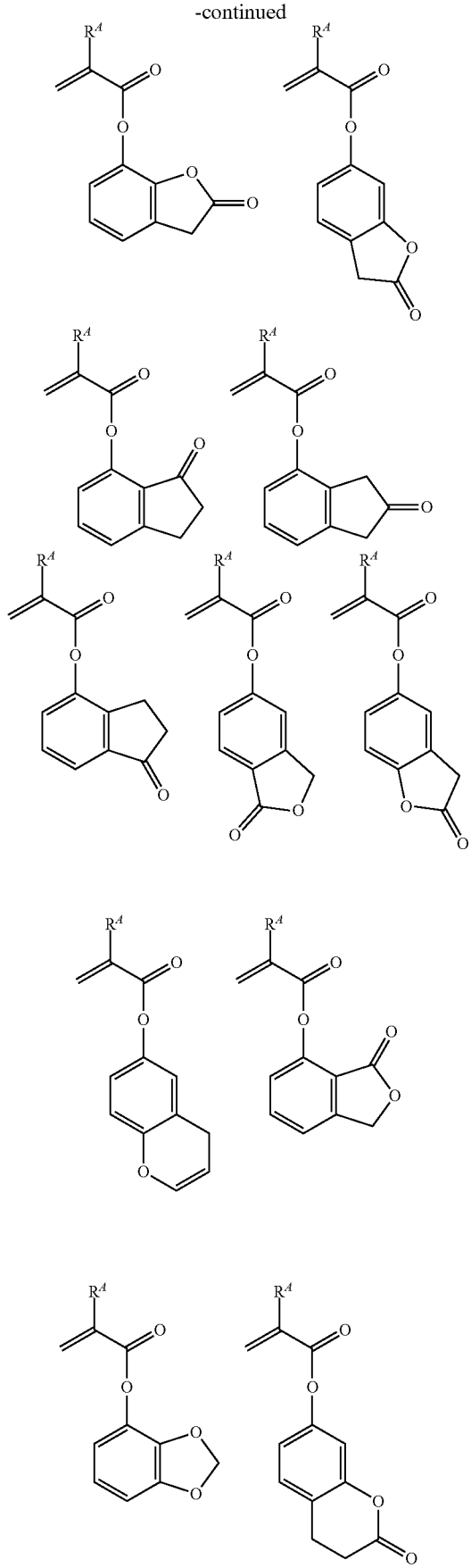
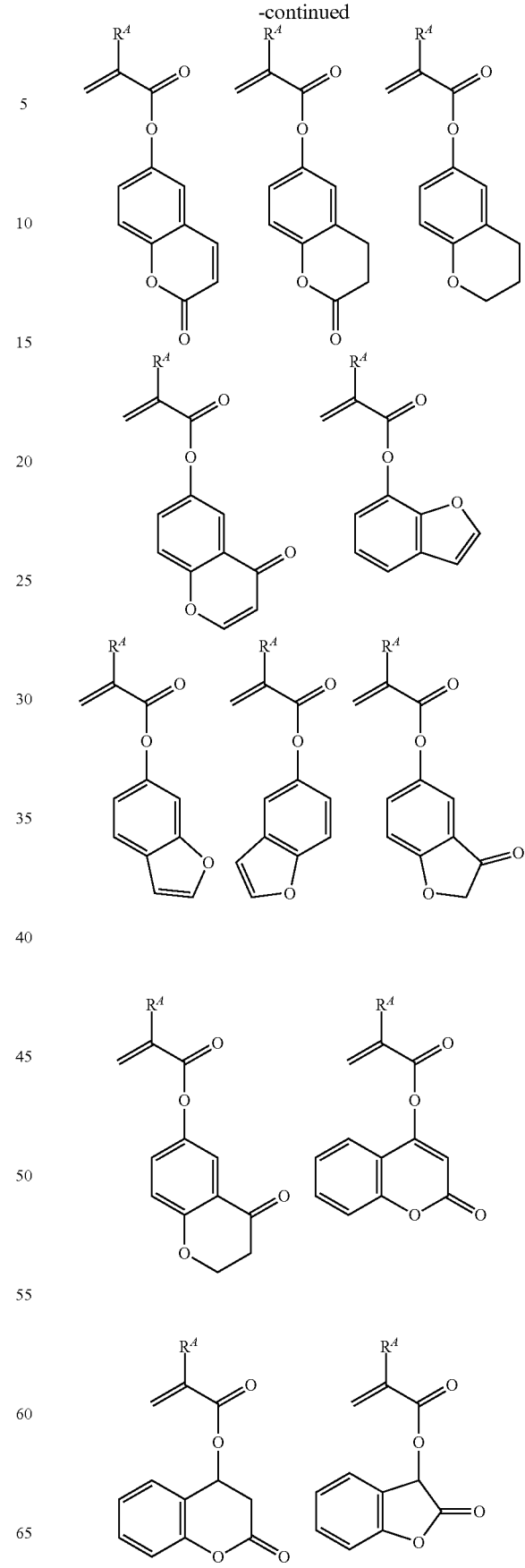

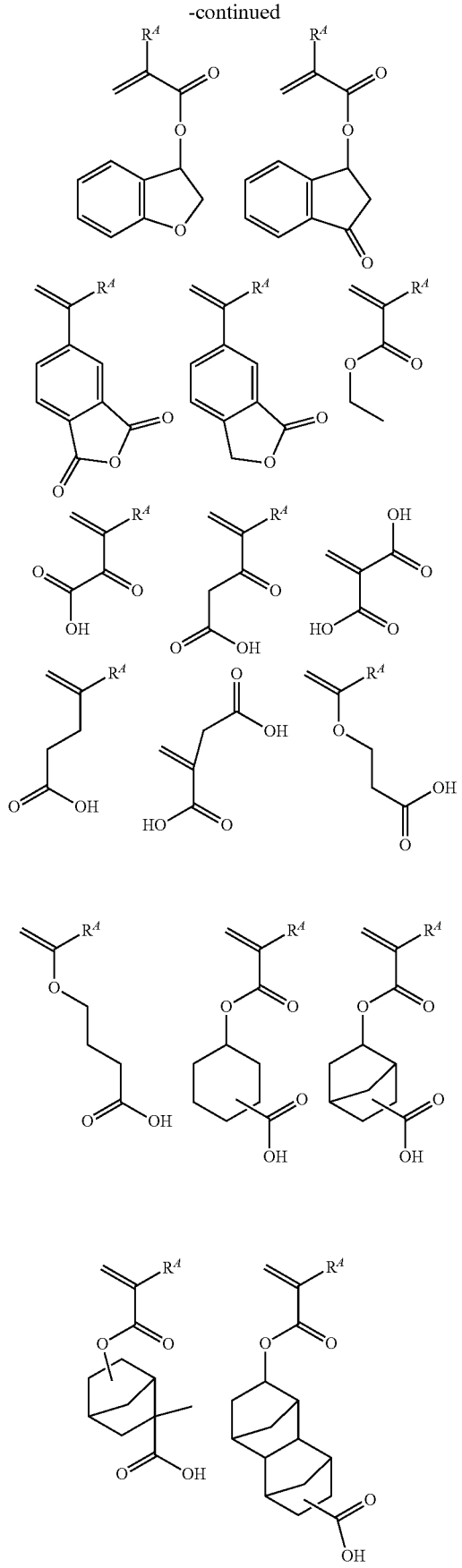
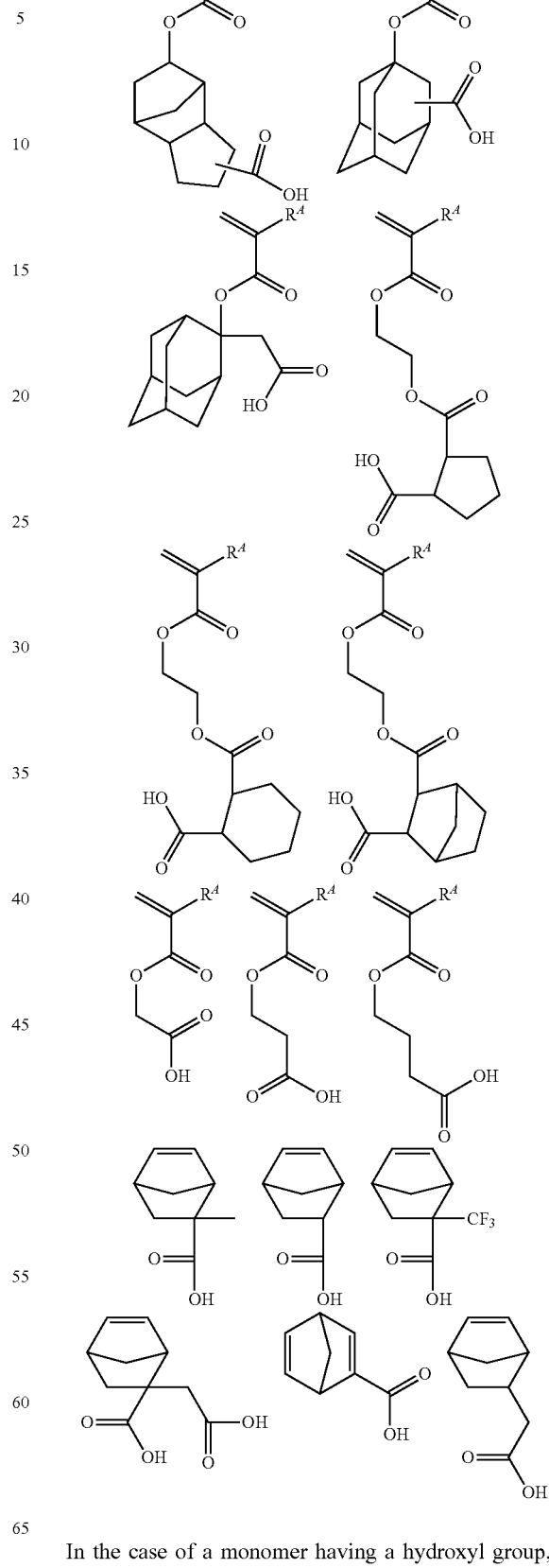
In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

In another preferred embodiment, the base polymer may further comprise recurring units (d) selected from units of indene, benzofuran, benzothiophene, acenaphthylene, chromone, coumarin, and norbornadiene, or derivatives thereof. Suitable monomers are exemplified below.

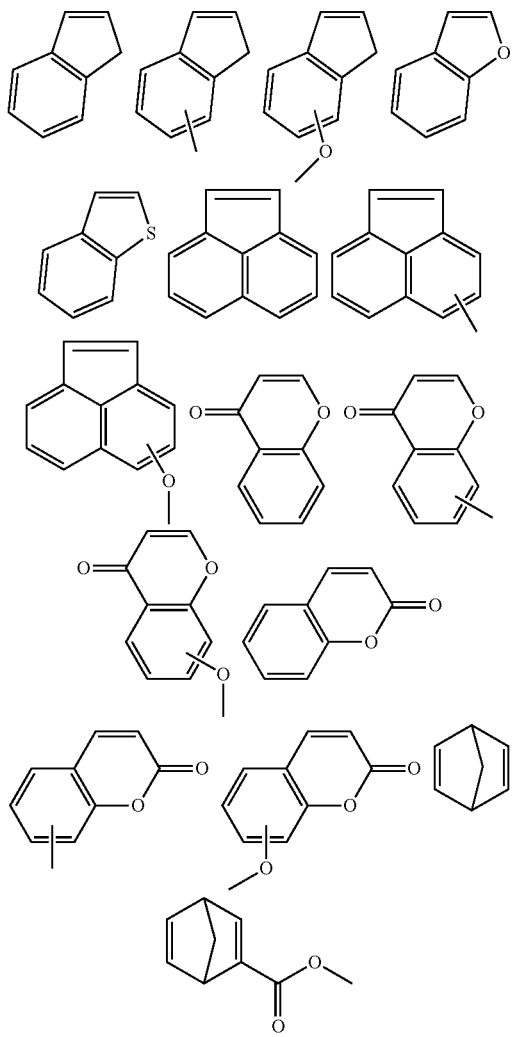

Besides the recurring units described above, further recurring units (e) which are derived from styrene, vinylnaphthalene, vinylanthracene, vinylpyrene, methyleneindene, vinylpyridine, and vinylcarbazole may be incorporated in the base polymer.

In a further embodiment, recurring units (f) derived from an onium salt having a polymerizable carbon-carbon double bond may be incorporated in the base polymer. JP-A 2005-084365 discloses sulfonium and iodonium salts having a polymerizable carbon-carbon double bond capable of generating a sulfonic acid. JP-A 2006-178317 discloses a sulfonium salt having sulfonic acid directly attached to the main chain.

The preferred recurring units (f) include recurring units having formula (f1), recurring units having formula (f2), and recurring units having formula (f3). These units are simply referred to as recurring units (f1), (f2) and (f3), which may be used alone or in combination of two or more types.

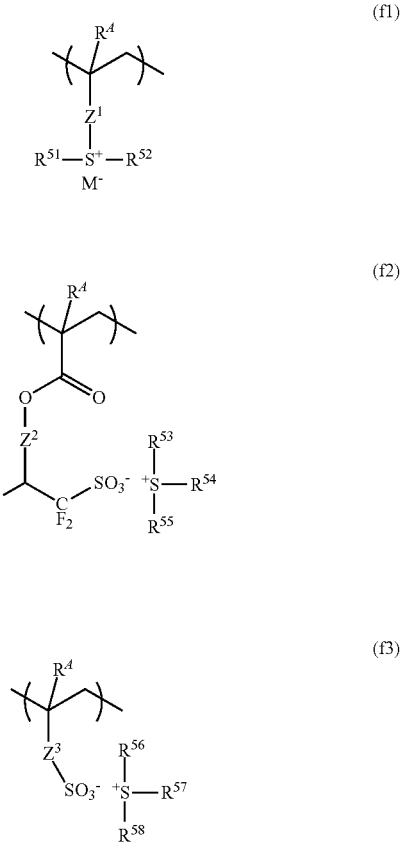

Herein $R^A$ is each independently hydrogen or methyl. $Z^1$ is a single bond, phenylene, —O—$Z^{11}$—, or —C(=O)—$Z^{12}$—$Z^{11}$—, wherein $Z^{11}$ is a straight, branched or cyclic $C_1$-$C_6$ alkylene group or straight, branched or cyclic $C_2$-$C_6$ alkenylene group which may contain a carbonyl, ester, ether or hydroxyl moiety, or phenylene group, $Z^{12}$ is —O— or —NH—. $R^{51}$, $R^{52}$, $R^{53}$, $R^{54}$, $R^{55}$, $R^{66}$, $R^{57}$, and $R^{58}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl, or mercaptophenyl group. $Z^2$ is a single bond, —$Z^{21}$—C(=O)—O—, —$Z^{21}$—O—, or —$Z^{21}$—O—C(=O)—, wherein $Z^{21}$ is a straight, branched or cyclic $C_1$-$C_{12}$ alkylene group which may contain a carbonyl, ester or ether moiety. $Z^3$ is a single bond, methylene, ethylene, phenylene, fluorinated phenylene, —O—$Z^{31}$—, or —C(=O)—$Z^{32}$—$Z^{31}$—, wherein $Z^{31}$ is a straight, branched or cyclic $C_1$-$C_6$ alkylene group or straight, branched or cyclic $C_2$-$C_6$ alkenylene group which may contain a carbonyl, ester, ether or hydroxyl moiety, or a phenylene, fluorinated phenylene or trifluoromethyl-substituted phenylene group, $Z^{32}$ is —O— or —NH—. $A^1$ is hydrogen or trifluoromethyl. $M^-$ is a non-nucleophilic counter ion.

Examples of the monomer from which recurring unit (f1) is derived are shown below, but not limited thereto. $R^A$ and $M^-$ are as defined above.

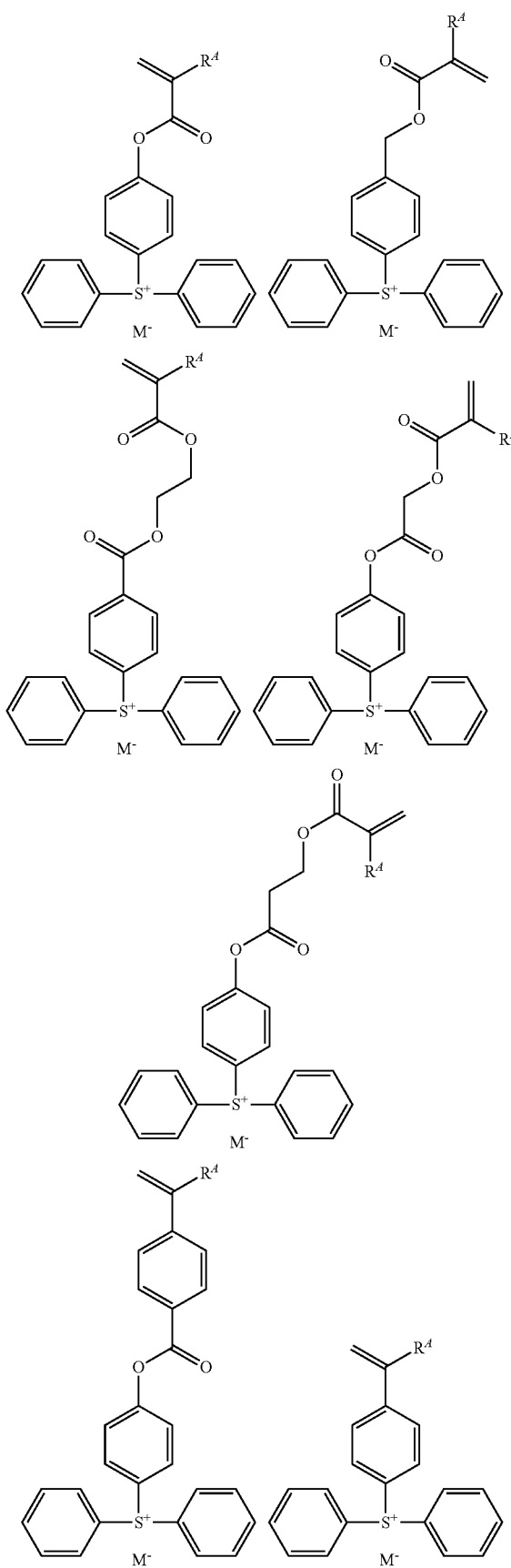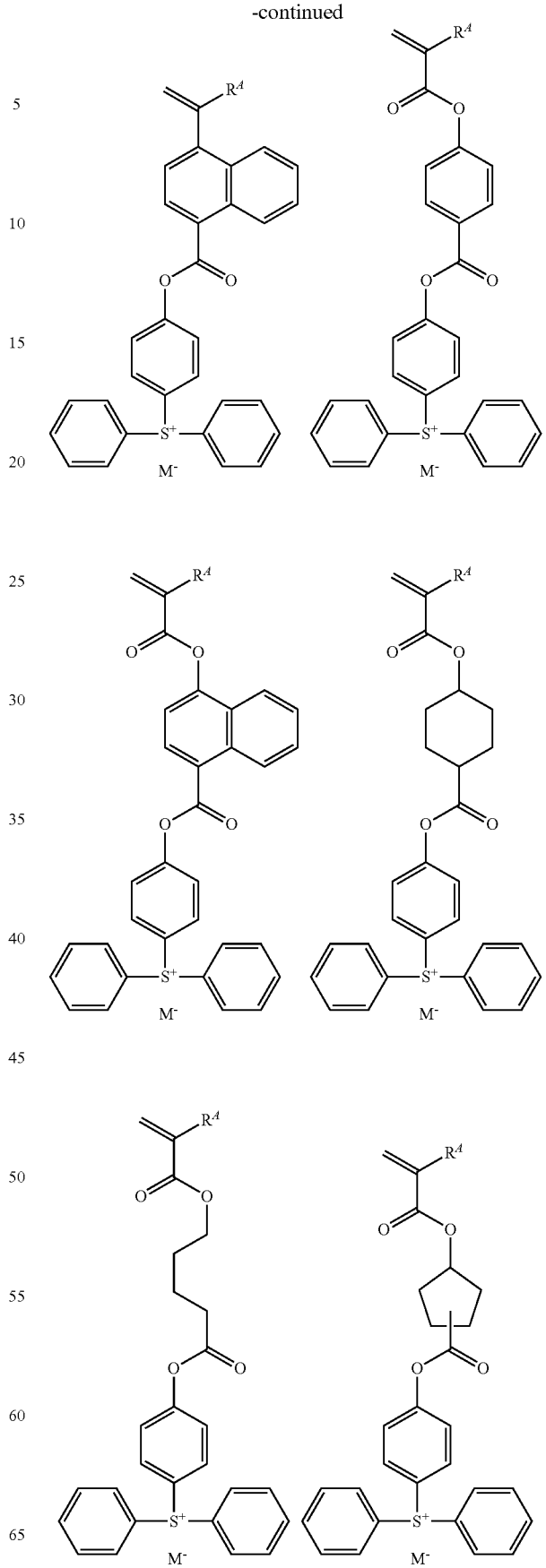

-continued

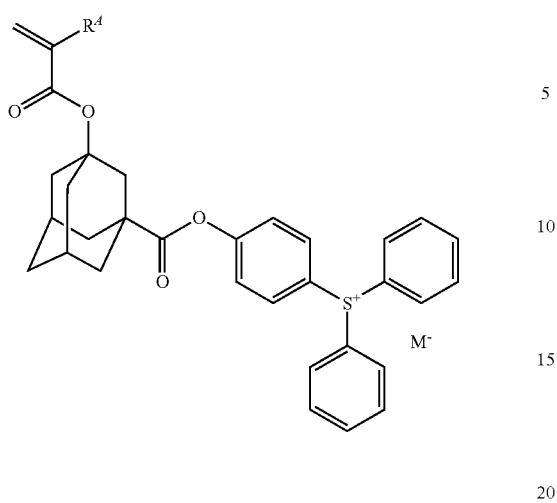

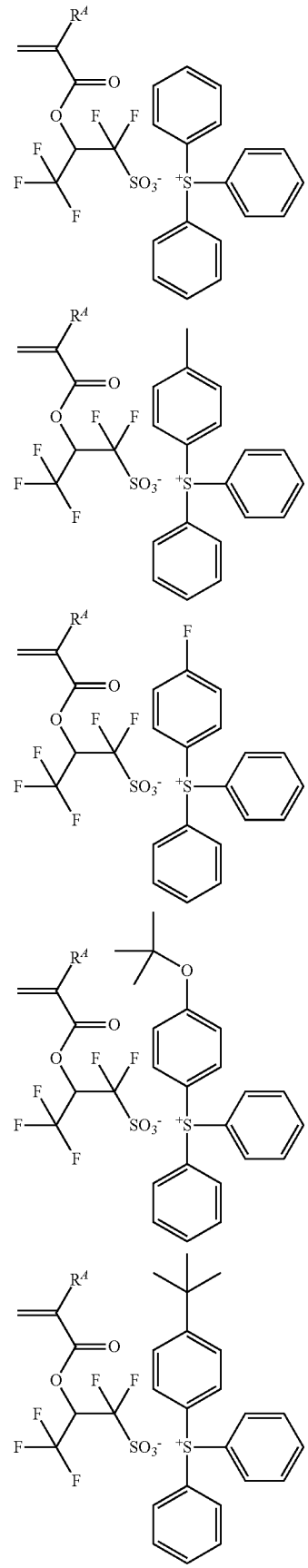

Examples of the non-nucleophilic counter ion M⁻ include halide ions such as chloride and bromide ions; fluoroalkylsulfonate ions such as triflate, 1,1,1-trifluoroethanesulfonate, and nonafluorobutanesulfonate ions; arylsulfonate ions such as tosylate, benzenesulfonate, 4-fluorobenzenesulfonate, and 1,2,3,4,5-pentafluorobenzenesulfonate ions; alkylsulfonate ions such as mesylate and butanesulfonate ions; sulfonimide ions such as bis(trifluoromethylsulfonyl)imide, bis(perfluoroethylsulfonyl)imide and bis(perfluorobutylsulfonyl)imide ions; sulfonmethide ions such as tris(trifluoromethylsulfonyl)methide and tris(perfluoroethylsulfonyl)methide ions.

Also included are sulfonates having fluorine substituted at α-position as represented by the formula (K-1) and sulfonates having fluorine substituted at α- and β-positions as represented by the formula (K-2).

(K-1)

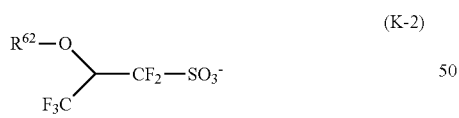
(K-2)

In formula (K-1), $R^{61}$ is hydrogen, or a $C_1$-$C_{20}$ straight, branched or cyclic alkyl group, $C_2$-$C_{20}$ straight, branched or cyclic alkenyl group, or $C_6$-$C_{20}$ aryl group, which may contain an ether, ester, carbonyl moiety, lactone ring, or fluorine atom. In formula (K-2), $R^{62}$ is hydrogen, or a $C_1$-$C_{30}$ straight, branched or cyclic alkyl group, $C_2$-$C_{30}$ straight, branched or cyclic acyl group, $C_2$-$C_{20}$ straight, branched or cyclic alkenyl group, $C_6$-$C_{20}$ aryl group or $C_6$-$C_{20}$ aryloxy group, which may contain an ether, ester, carbonyl moiety or lactone ring.

Examples of the monomer from which recurring unit (f2) is derived are shown below, but not limited thereto. $R^A$ is as defined above.

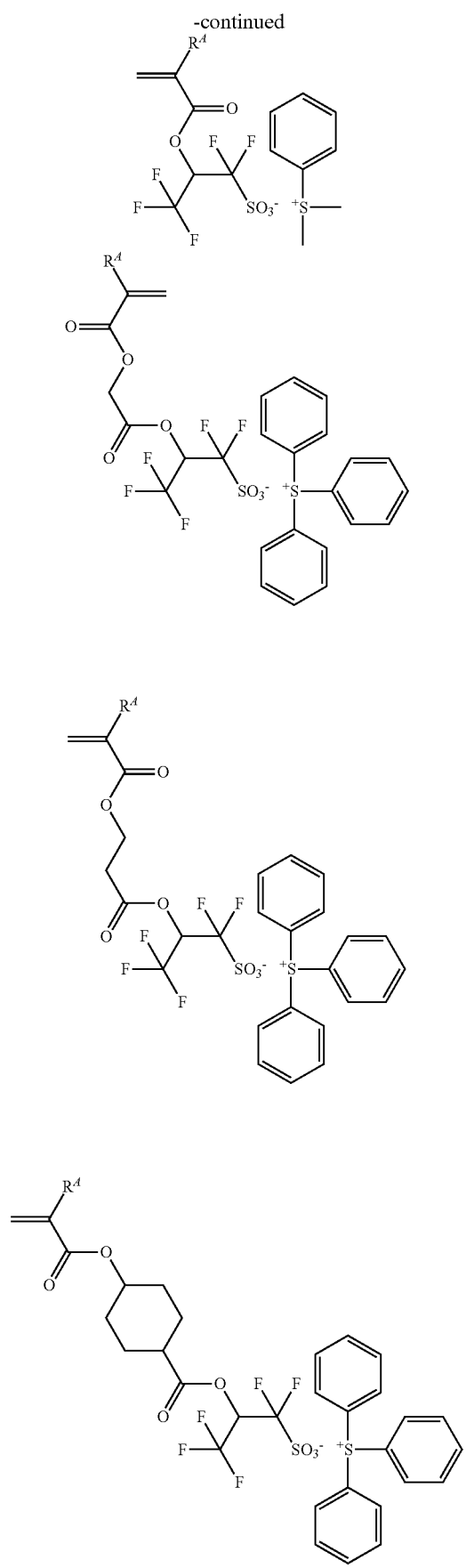

-continued
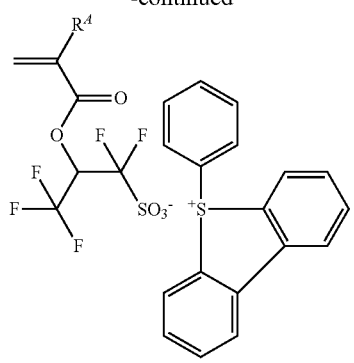
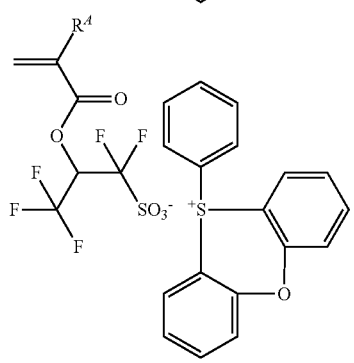
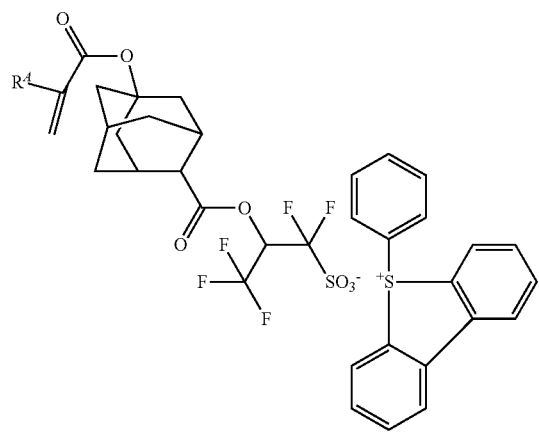
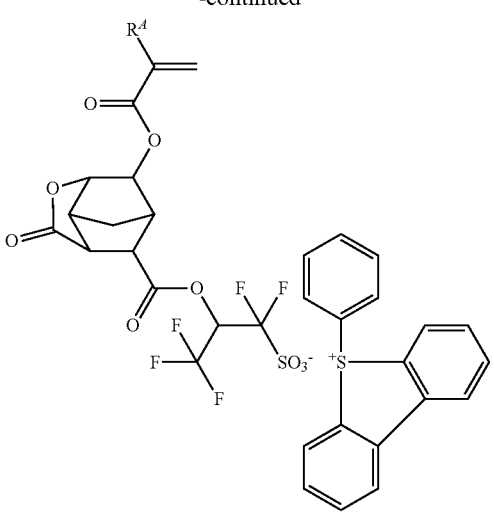
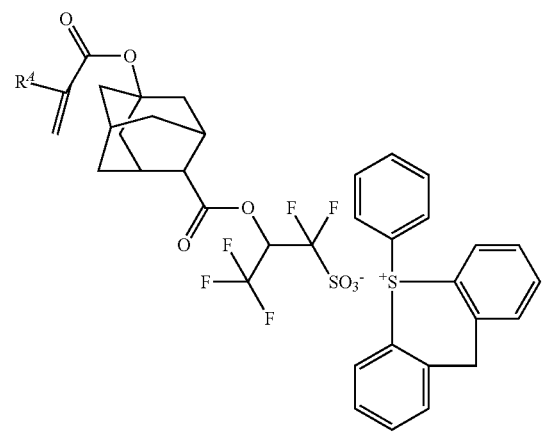
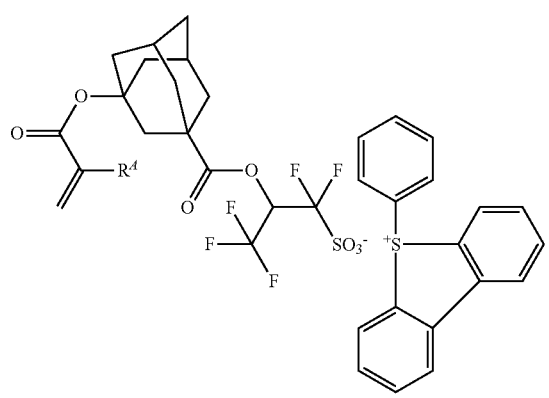

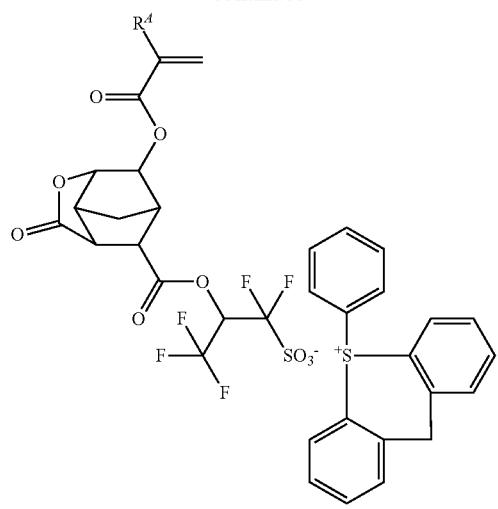
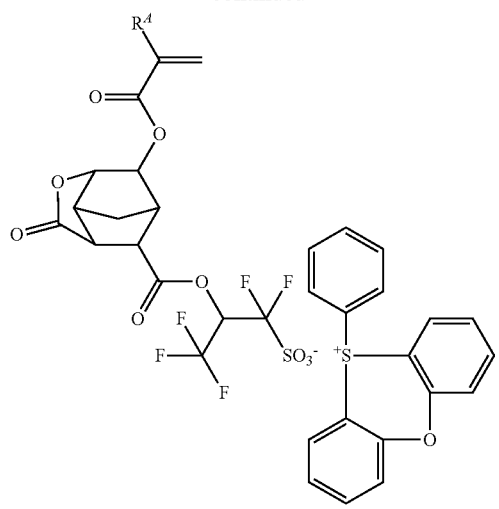
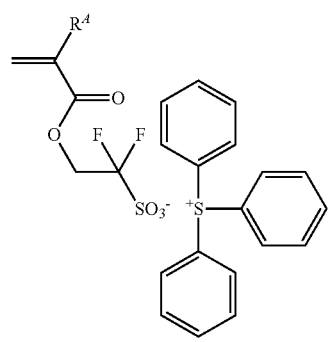
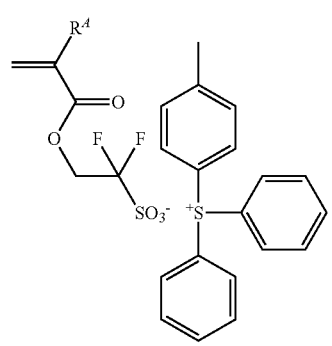
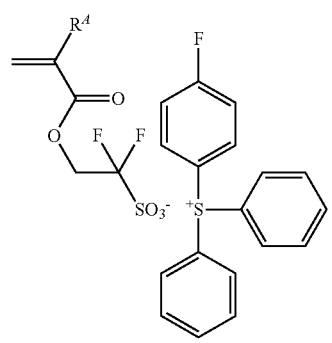

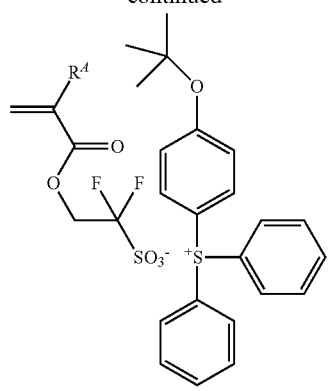
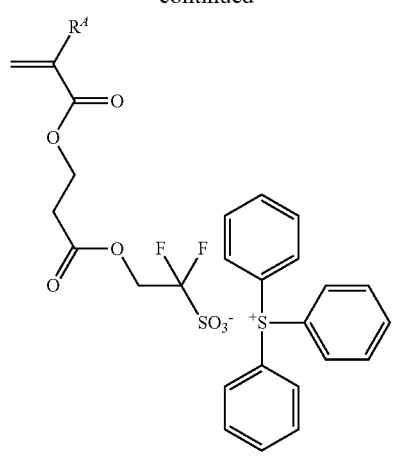
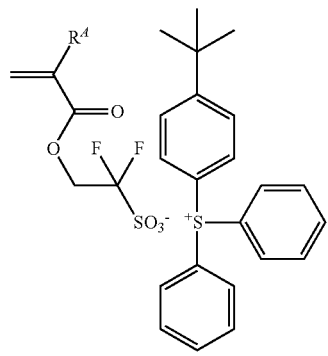
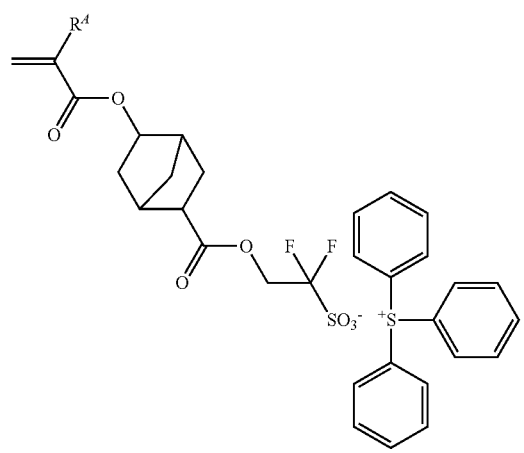
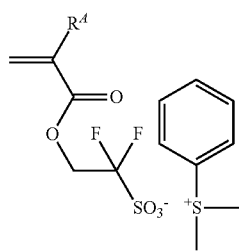
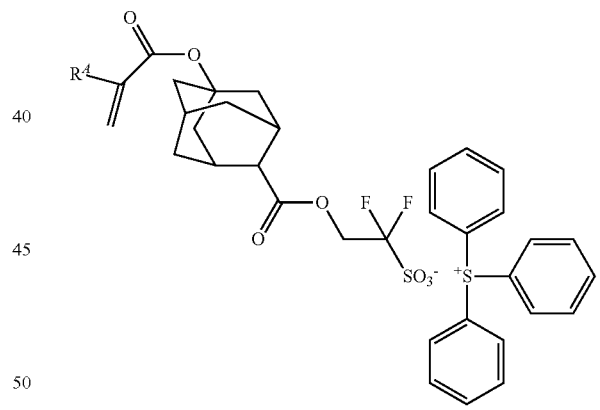
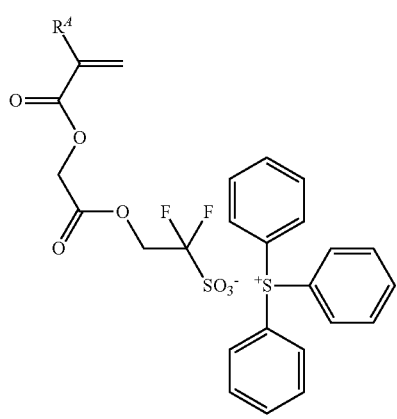
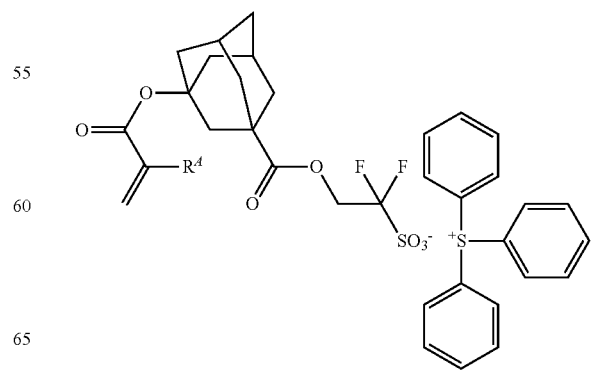

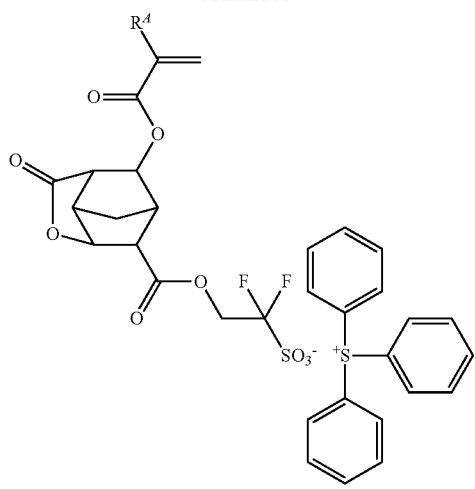
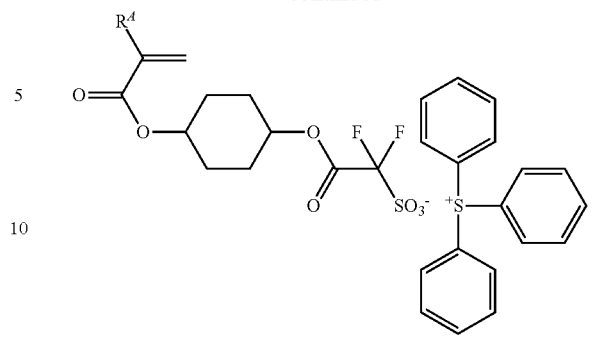
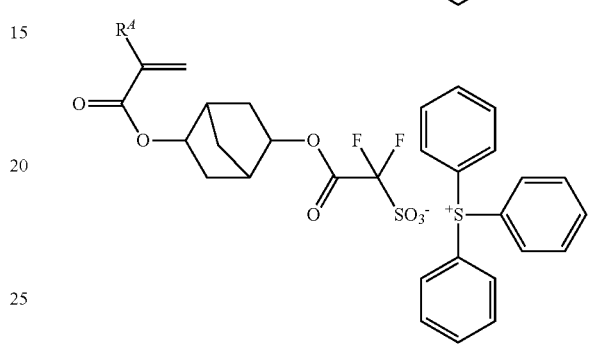
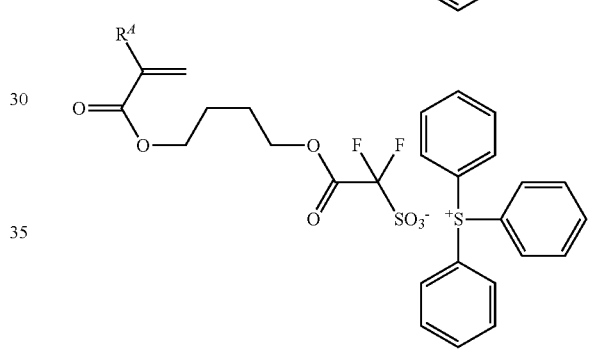
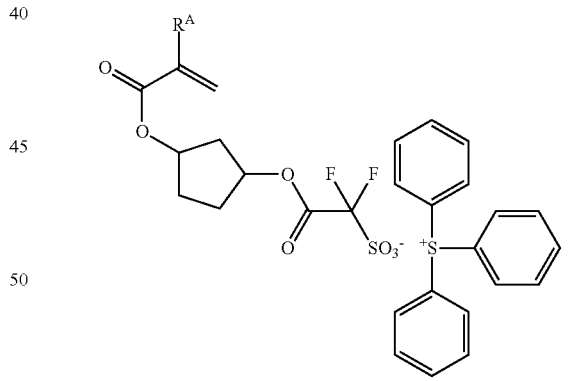
Examples of the monomer from which recurring unit (f3) is derived are shown below, but not limited thereto. $R^A$ is as defined above.
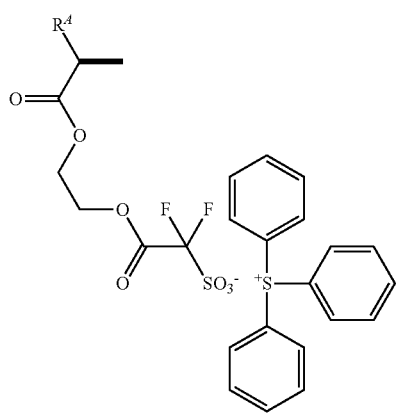

-continued
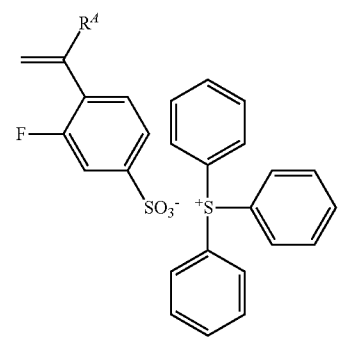
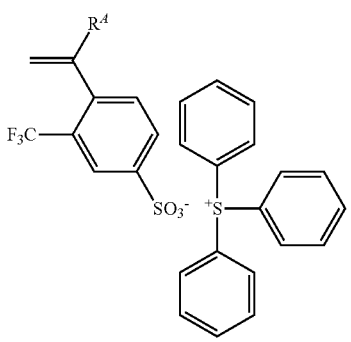
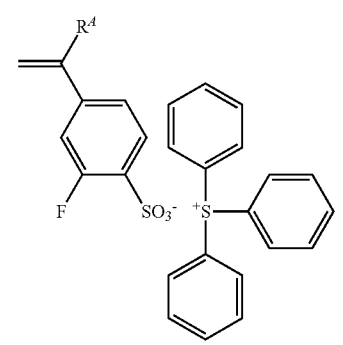
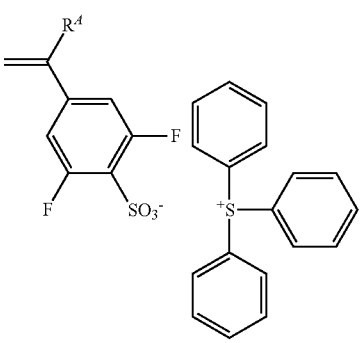
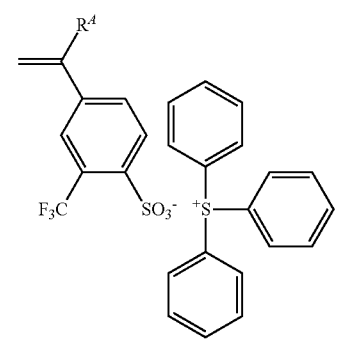
-continued
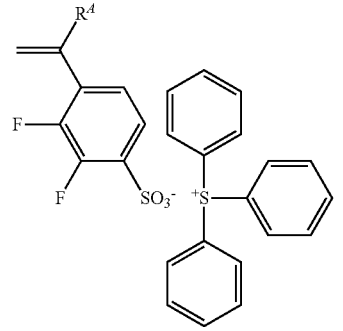
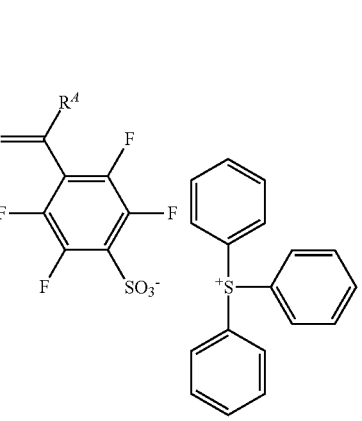
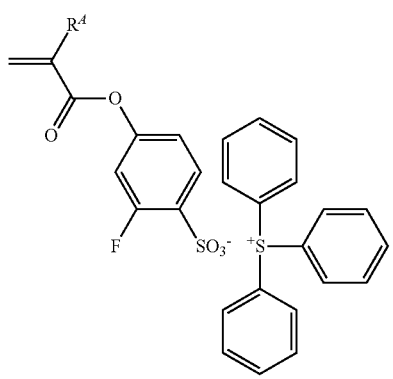
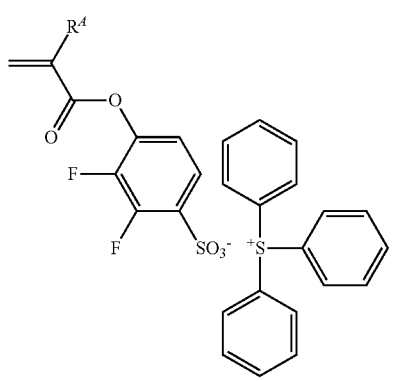

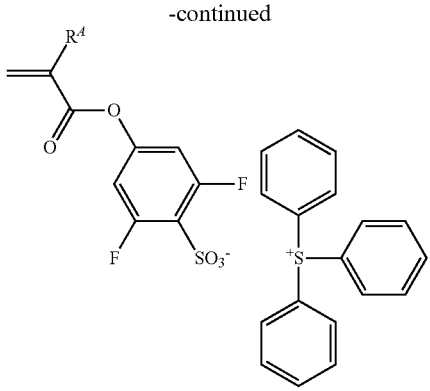

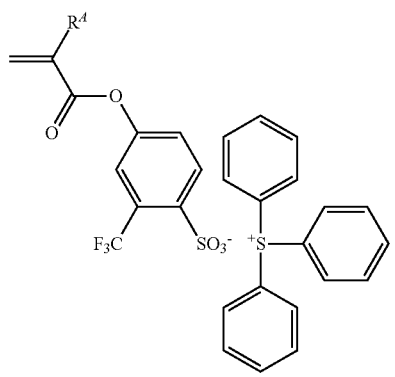

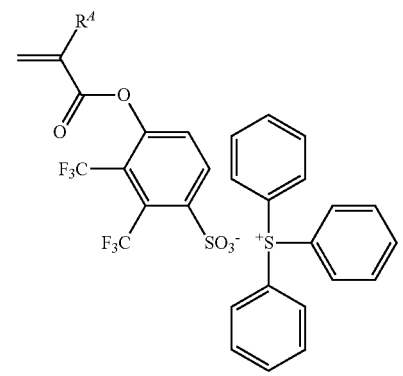

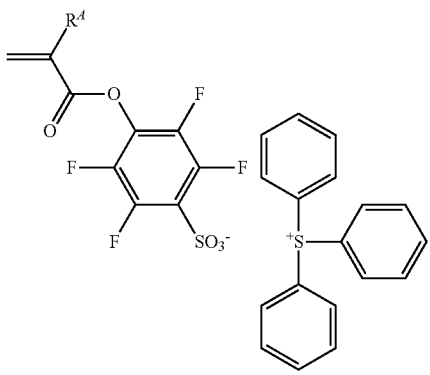

The attachment of an acid generator to the polymer main chain is effective in restraining acid diffusion, thereby preventing a reduction of resolution due to blur by acid diffusion. Also edge roughness is Improved since the acid generator is uniformly distributed.

The base polymer comprising recurring units (f) also functions as the acid generator. Since this base polymer is integrated with the acid generator, an acid generator of addition type may or may not be added to the chemically amplified resist composition.

The base polymer for formulating the positive resist composition comprises recurring units (a1) or (a2) having an acid labile group as essential component and additional recurring units (b), (c), (d), (e), and (f) as optional components. A fraction of units (a1), (a2), (b), (c), (d), (e), and (f) is: preferably $0 \leq a1 < 1.0$, $0 \leq a2 < 1.0$, $0 < a1+a2 < 1.0$, $0 \leq b \leq 0.9$, $0 \leq c \leq 0.9$, $0 \leq d \leq 0.8$, $0 \leq e \leq 0.8$, and $0 \leq f \leq 0.5$; more preferably $0 \leq a1 \leq 0.9$, $0 \leq a2 \leq 0.9$, $0.1 \leq a1+a2 \leq 0.9$, $0 \leq b \leq 0.8$, $0 \leq c \leq 0.8$, $0 \leq d \leq 0.7$, $0 \leq c \leq 0.7$, and $0 \leq f \leq 0.4$; and even more preferably $0 \leq a1 \leq 0.8$, $0 \leq a2 \leq 0.8$, $0.1 \leq a1+a2 \leq 0.8$, $0 \leq b \leq 0.75$, $0 \leq c \leq 0.75$, $0 \leq d \leq 0.6$, $0 \leq e \leq 0.6$, and $0 \leq f \leq 0.3$. In the embodiment wherein the base polymer also functions as an acid generator, the fraction of recurring units (f) is preferably $0 < f \leq 0.5$, more preferably $0.01 \leq f \leq 0.4$, and even more preferably $0.02 \leq f \leq 0.3$. Notably, $f = f1+f2+f3$, meaning that unit (f) is at least one of units (f1) to (f3), and $a1+a2+b+c+d+e+f=1.0$.

For the base polymer for formulating the negative resist composition, an acid labile group is not necessarily essential. The base polymer comprises recurring units (b), and optionally recurring units (c), (d), (e), and/or (f). A fraction of these units is: preferably $0 < b \leq 1.0$, $0 \leq c \leq 0.9$, $0 \leq d \leq 0.8$, $0 \leq e \leq 0.8$, and $0 \leq f \leq 0.5$; more preferably $0.2 \leq b \leq 1.0$, $0 \leq c \leq 0.8$, $0 \leq d \leq 0.7$, $0 \leq e \leq 0.7$, and $0 \leq f \leq 0.4$; and even more preferably $0.3 \leq b \leq 1.0$, $0 \leq c \leq 0.75$, $0 \leq d \leq 0.6$, $0 \leq e \leq 0.6$, and $0 \leq f \leq 0.3$. In the embodiment wherein the base polymer also functions as an acid generator, the fraction of recurring units (f) is preferably $0 < f \leq 0.5$, more preferably $0.01 \leq f \leq 0.4$, and even more preferably $0.02 \leq f \leq 0.3$. Notably, $f = f1+f2+f3$, meaning that unit (f) is at least one of units (f1) to (f3), and $b+c+d+e+f=1.0$.

The base polymer may be synthesized by any desired methods, for example, by dissolving one or more monomers selected from the monomers corresponding to the foregoing recurring units in an organic solvent, adding a radical polymerization initiator thereto, and effecting heat polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is preferably 2 to 100 hours, more preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, Mw or Mw/Mn is acceptable.

Other Components

With the foregoing components, other components such as an organic solvent, surfactant, dissolution inhibitor, and crosslinker may be blended in any desired combination to formulate a chemically amplified positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs. Particularly when an acid generator is incorporated to formulate a chemically amplified positive resist composition capable of utilizing acid catalyzed reaction, the composition has a higher sensitivity and is further improved in the properties described above.

In the case of positive resist compositions, inclusion of a dissolution inhibitor may lead to an increased difference in dissolution rate between exposed and unexposed areas and a further improvement in resolution. In the case of negative resist compositions, a negative pattern may be formed by adding a crosslinker to reduce the dissolution rate of exposed area.

Examples of the organic solvent used herein are described in JP-A 2008-111103, paragraphs [0144]-[0145] (U.S. Pat. No. 7,537,880). Exemplary solvents include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether, esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Exemplary surfactants are described in JP-A 2008-111103, paragraphs [0165]-[0166]. Inclusion of a surfactant may improve or control the coating characteristics of the resist composition. The surfactant is preferably added in an amount of 0.0001 to 10 parts by weight per 100 parts by weight of the base polymer.

The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per 100 parts by weight of the base polymer.

Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyl ether group. These compounds may be used as an additive or Introduced into a polymer side chain as a pendant. Hydroxy-containing compounds may also be used as the crosslinker.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethoxyethyl guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer.

To the resist composition, a polymeric additive (or water repellency improver) may also be added for improving the water repellency on surface of a resist film as spin coated. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. An appropriate amount of the water repellency improver is 0 to 20 parts, preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer.

Process

The resist composition is used in the fabrication of various integrated circuits. Pattern formation using the resist composition may be performed by well-known lithography processes. The process generally involves coating, prebaking, exposure, and development. If necessary, any additional steps such as PEB may be added.

For example, the chemically amplified resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hotplate at a temperature of 60 to 150° C. for 10 seconds to 30 minutes, preferably 80 to 120° C. for 30 seconds to 20 minutes. The resulting resist film is generally 0.1 to 2 μm thick.

The resist film is then exposed to a desired pattern of high-energy radiation such as UV, deep-UV, EB, EUV, x-ray, soft x-ray, excimer laser light, γ-ray or synchrotron radiation, directly or through a mask. The exposure dose is preferably about 1 to 200 $mJ/cm^2$, more preferably about 10 to 100 $mJ/cm^2$, or about 0.1 to 100 $\mu C/cm^2$, more preferably about 0.5 to 50 $\mu C/cm^2$. The resist film is further baked (PEB) on a hotplate at 60 to 150° C. for 10 seconds to 30 minutes, preferably 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer. It is appreciated that the resist composition of the invention is best suited for micro-patterning using such high-energy radiation as KrF and ArF excimer laser, BB, EUV, x-ray, soft x-ray, γ-ray and synchrotron radiation.

In an alternative embodiment, a negative pattern may be formed via organic solvent development. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risk of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLE

Examples of the invention are given below by way of illustration and not by way of limitation. The abbreviation "pbw" is parts by weight.

Quenchers 1 to 12 in the form of quaternary ammonium iodide, quaternary ammonium dibromoiodide, quaternary ammonium bromodiiodide or quaternary ammonium triiodide having the following structure were used in resist compositions. Of Quenchers 1 to 12, some were purchased from Tokyo Chemical Industry Co., Ltd. or Sigma-Aldrich and the remaining were prepared by neutralization reaction of an ammonium hydroxide with hydriodic acid.

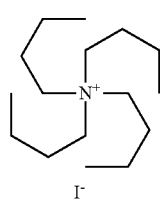

Quencher 1

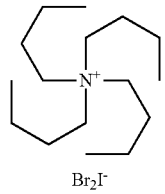

Quencher 2

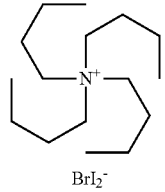

Quencher 3

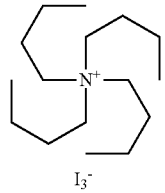

Quencher 4

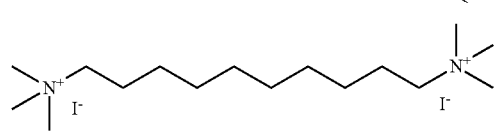

Quencher 5

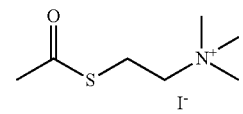

Quencher 6

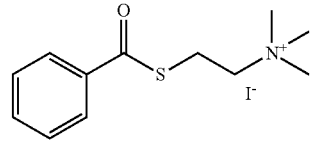

Quencher 7

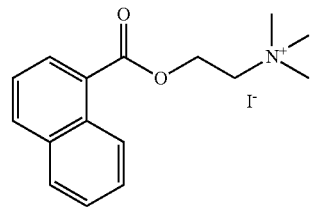

Quencher 8

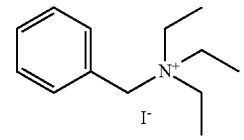

Quencher 9

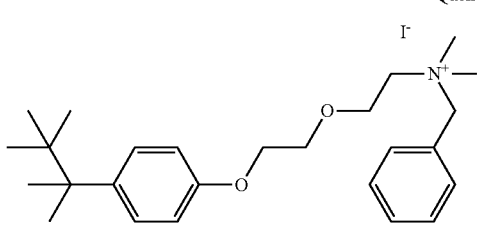

Quencher 10

Quencher 11

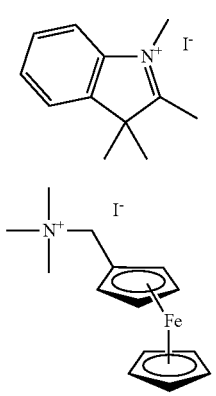

Quencher 12

Polymer 2

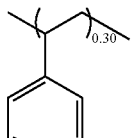
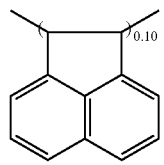

Mw = 5,100
Mw/Mn = 1.46

Synthesis Example

Synthesis of Base Polymers (Polymers 1 to 3)

Base polymers were prepared by combining suitable monomers, effecting copolymerization reaction thereof in tetrahydrofuran (THF) solvent, pouring the reaction solution into methanol for crystallization, repeatedly washing with hexane, isolation, and drying. The resulting polymers, designated Polymers 1 to 3, were analyzed for composition by $^1$H-NMR spectroscopy, and for Mw and Mw/Mn by GPC versus polystyrene standards using THF solvent.

Polymer 1

Polymer 3

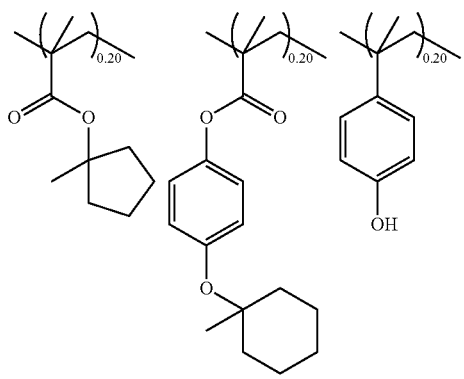

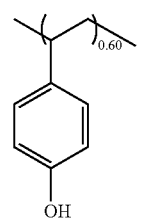

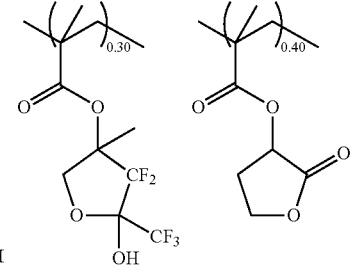

Mw = 8,100
Mw/Mn = 1.65

Mw = 7,400
Mw/Mn = 1.71

Examples and Comparative Examples

Resist compositions were prepared by dissolving the polymer and selected components in a solvent in accordance with the recipe shown in Tables 1 and 2, and filtering through a filter having a pore size of 0.2 μm. The solvent contained 100 ppm of surfactant PC-4430 (3M). The components in Tables 1 and 2 are as identified below.

Polymers 1 to 3: identified above
Organic solvents: PGMEA (propylene glycol monomethyl ether acetate)
  CyH (cyclohexanone)
  PGME (propylene glycol monomethyl ether)
Acid generators: PAG 1 to PAG 4 of the following structural formulae

PAG 1

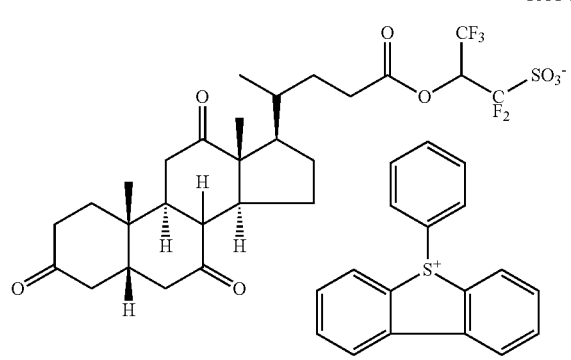

PAG 2

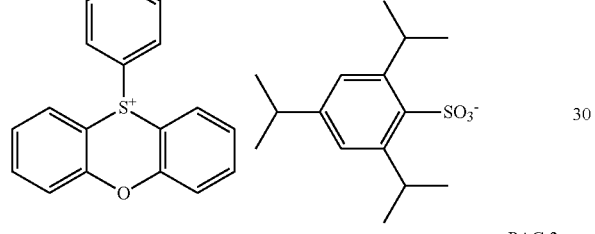

PAG 3

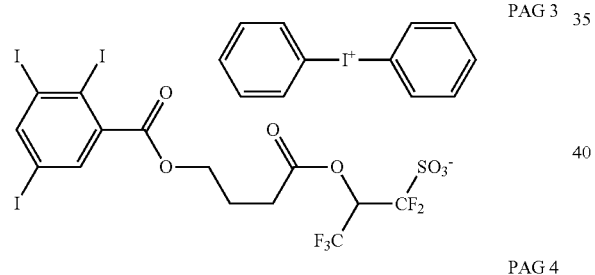

PAG 4

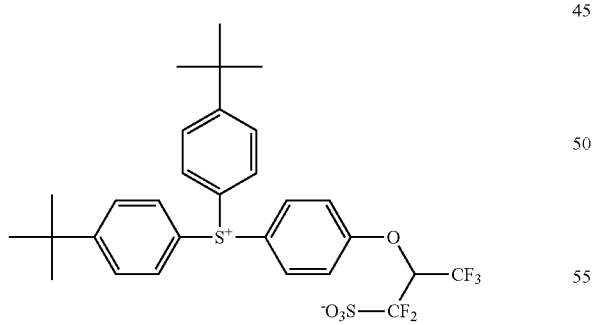

Comparative Quenchers 1 to 5:

Comparative Quencher 1

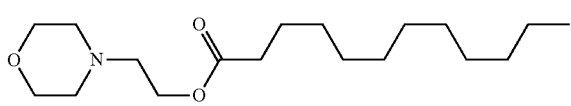

Comparative Quencher 2

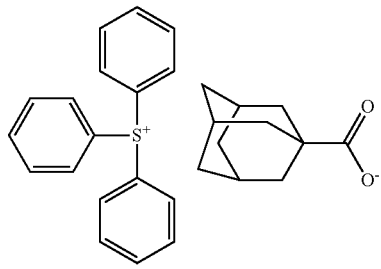

Comparative Quencher 3

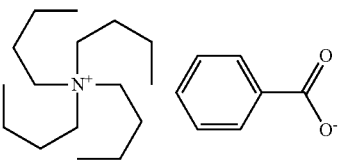

Comparative Quencher 4

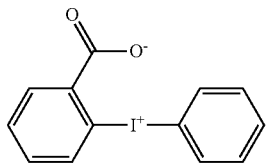

Comparative Quencher 5

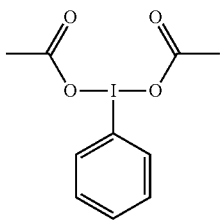

EB Lithography Patterning Test

Examples 1-1 to 1-16 and Comparative Examples 1-1 to 1-7

Each of the resist compositions (Tables 1 and 2) was spin coated onto a silicon substrate (which had been vapor primed with hexamethyldisilazane) and prebaked on a hotplate at 110° C. for 60 seconds to form a resist film of 80 nm thick. Using a system HL-800D (Hitachi Ltd.) at an accelerating voltage of 50 kV, the resist film was exposed imagewise to EB in a vacuum chamber. Immediately after the exposure, the resist film was baked (PEB) on a hotplate at the temperature shown in Tables 1 and 2 for 60 seconds and developed in a 2.38 wt % TMAH aqueous solution for 30 seconds to form a pattern.

The resist pattern was evaluated as follows. In the case of positive resist film, the resolution is a minimum trench size at the exposure dose that provides a resolution as designed of a 120-nm trench pattern. In the case of negative resist film, the resolution is a minimum isolated line size at the exposure dose that provides a resolution as designed of a 120-nm isolated line pattern. In the case of positive resist film, the sensitivity is the exposure dose that provides a resolution to the 120 nm trench pattern. In the case of negative resist film, the sensitivity is the exposure dose that provides a resolution to the 120 nm isolated line pattern. The 120-nm isolated line pattern was observed under CD-SEM (S-9200, Hitachi High-Technologies Corp.) to determine LWR. It is noted that Examples 1-1 to 1-15 and Comparative Examples 1-1 to 1-6 are positive resist compositions, and Example 1-16 and Comparative Example 1-7 are negative resist compositions.

The results are shown in Tables 1 and 2.

TABLE 1

| | | Polymer (pbw) | Acid generator (pbw) | Quencher (pbw) | Organic solvent (pbw) | PEB temp. (° C.) | Sensitivity (μC/cm²) | LWR (nm) | Resolution (nm) |
|---|---|---|---|---|---|---|---|---|---|
| Example | 1-1 | Polymer 1 (100) | — | Quencher 1 (3.70) | PGMEA (400) CyH (2,000) PGME (100) | 80 | 39 | 3.8 | 75 |
| | 1-2 | Polymer 1 (100) | — | Quencher 2 (5.29) | PGMEA (400) CyH (2,000) PGME (100) | 80 | 36 | 3.4 | 75 |
| | 1-3 | Polymer 1 (100) | — | Quencher 3 (5.76) | PGMEA (400) CyH (2,000) PGME (100) | 80 | 33 | 3.3 | 75 |
| | 1-4 | Polymer 1 (100) | — | Quencher 4 (6.23) | PGMEA (400) CyH (2,000) PGME (100) | 80 | 28 | 3.1 | 75 |
| | 1-5 | Polymer 1 (100) | — | Quencher 5 (3.60) | PGMEA (400) CyH (2,000) PGME (100) | 80 | 37 | 3.3 | 75 |
| | 1-6 | Polymer 1 (100) | — | Quencher 6 (2.82) | PGMEA (400) CyH (2,000) PGME (100) | 80 | 32 | 3.6 | 75 |
| | 1-7 | Polymer 1 (100) | — | Quencher 7 (2.89) | PGMEA (400) CyH (2,000) PGME (100) | 80 | 37 | 3.8 | 75 |
| | 1-8 | Polymer 1 (100) | — | Quencher 8 (3.51) | PGMEA (400) CyH (2,000) PGME (100) | 80 | 39 | 3.6 | 75 |
| | 1-9 | Polymer 1 (100) | — | Quencher 9 (3.19) | PGMEA (400) CyH (2,000) PGME (100) | 80 | 38 | 3.7 | 75 |
| | 1-10 | Polymer 1 (100) | — | Quencher 10 (5.25) | PGMEA (400) CyH (2,000) PGME (100) | 80 | 39 | 3.2 | 75 |
| | 1-11 | Polymer 1 (100) | — | Quencher 11 (3.01) | PGMEA (400) CyH (2,000) PGME (100) | 80 | 33 | 3.5 | 75 |
| | 1-12 | Polymer 1 (100) | — | Quencher 12 (4.15) | PGMEA (400) CyH (2,000) PGME (100) | 80 | 31 | 3.4 | 75 |
| | 1-13 | Polymer 1 (100) | PAG 1 (15) | Quencher 4 (6.23) | PGMEA (400) CyH (2,000) PGME (100) | 80 | 23 | 3.3 | 75 |
| | 1-14 | Polymer 1 (100) | PAG 3 (18) | Quencher 4 (6.23) | PGMEA (400) CyH (2,000) PGME (100) | 80 | 18 | 3.1 | 75 |
| | 1-15 | Polymer 2 (100) | PAG 2 (10) | Quencher 4 (6.23) | PGMEA (2,000) CyH (500) | 90 | 35 | 4.5 | 80 |
| | 1-16 | Polymer 3 (100) | PAG 4 (10) | Quencher 4 (6.23) | PGMEA (2,000) CyH (500) | 100 | 39 | 4.9 | 80 |

TABLE 2

| | | Polymer (pbw) | Acid generator (pbw) | Quencher (pbw) | Organic solvent (pbw) | PEB temp. (° C.) | Sensitivity (μC/cm²) | LWR (nm) | Resolution (nm) |
|---|---|---|---|---|---|---|---|---|---|
| Comparative Example | 1-1 | Polymer 1 (100) | — | Comparative Quencher 1 (2.50) | PGMEA (400) CyH (2,000) PGME (100) | 80 | 59 | 5.8 | 85 |
| | 1-2 | Polymer 1 (100) | — | Comparative Quencher 2 (4.42) | PGMEA (400) CyH (2,000) PGME (100) | 80 | 57 | 5.7 | 85 |

TABLE 2-continued

| | | Polymer (pbw) | Acid generator (pbw) | Quencher (pbw) | Organic solvent (pbw) | PEB temp. (° C.) | Sensitivity ($\mu$C/cm$^2$) | LWR (nm) | Resolution (nm) |
|---|---|---|---|---|---|---|---|---|---|
| | 1-3 | Polymer 1 (100) | — | Comparative Quencher 3 (3.63) | PGMEA (400) CyH (2,000) PGME (100) | 80 | 56 | 4.3 | 80 |
| | 1-4 | Polymer 1 (100) | — | Comparative Quencher 4 (3.23) | PGMEA (400) CyH (2,000) PGME (100) | 80 | 57 | 4.6 | 80 |
| | 1-5 | Polymer 1 (100) | — | Comparative Quencher 5 (3.20) | PGMEA (400) CyH (2,000) PGME (100) | 80 | 61 | 5.5 | 80 |
| | 1-6 | Polymer 2 (100) | PAG 2 (10) | Comparative Quencher 1 (2.50) | PGMEA (2,000) CyH (500) | 90 | 44 | 7.6 | 85 |
| | 1-7 | Polymer 3 (100) | PAG 1 (10) | Comparative Quencher 1 (2.50) | PGMEA (2,000) CyH (500) | 100 | 60 | 8.4 | 90 |

EUV Lithography Test

Examples 2-1 to 2-12 and Comparative Example 2-1

The resist composition in Table 3 was spin coated on a silicon substrate having a 20 nm coating of silicon-containing spin-on hard mask SHB-A940 (Shin-Etsu Chemical Co., Ltd., silicon content 43 wt %) and prebaked on a hotplate at 105° C. for 60 seconds to form a resist film of 60 nm thick. Using an EUV scanner NXE3300 (ASML, NA 0.33, σ0.9/0.6, quadrupole illumination), the resist film was exposed to EUV through a mask bearing a hole pattern at a pitch 46 nm (on-wafer size) and +20% bias. The resist film to was baked (PEB) on a hotplate at the temperature shown in Table 3 for 60 seconds and developed in a 2.38 wt % TMAH aqueous solution for 30 seconds to form a hole pattern having a size of 23 nm.

The resist pattern was evaluated using CD-SEM (CG-5000, Hitachi High-Technologies Corp.). The exposure dose that provides a hole pattern having a size of 23 nm is reported as sensitivity. The size of 50 holes was measured, from which a size variation (3σ) was computed and reported as CDU.

The resist composition is shown in Table 3 together with the sensitivity and CDU of EUV lithography.

TABLE 3

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Example | 2-1 | Polymer 1 (100) | — | Quencher 1 (3.70) | PGMEA (400) CyH (2,000) PGME (100) | 80 | 24 | 3.3 |
| | 2-2 | Polymer 1 (100) | — | Quencher 2 (5.29) | PGMEA (400) CyH (2,000) PGME (100) | 80 | 25 | 3.0 |
| | 2-3 | Polymer 1 (100) | — | Quencher 3 (5.76) | PGMEA (400) CyH (2,000) PGME (100) | 80 | 25 | 2.9 |
| | 2-4 | Polymer 1 (100) | — | Quencher 4 (6.23) | PGMEA (400) CyH (2,000) PGME (100) | 80 | 21 | 3.1 |
| | 2-5 | Polymer 1 (100) | — | Quencher 5 (3.60) | PGMEA (400) CyH (2,000) PGME (100) | 80 | 24 | 2.6 |
| | 2-6 | Polymer 1 (100) | — | Quencher 6 (2.82) | PGMEA (400) CyH (2,000) PGME (100) | 80 | 28 | 2.6 |
| | 2-7 | Polymer 1 (100) | — | Quencher 7 (2.89) | PGMEA (400) CyH (2,000) PGME (100) | 80 | 25 | 2.8 |
| | 2-8 | Polymer 1 (100) | — | Quencher 8 (3.51) | PGMEA (400) CyH (2,000) PGME (100) | 80 | 28 | 2.8 |
| | 2-9 | Polymer 1 (100) | — | Quencher 9 (3.19) | PGMEA (400) CyH (2,000) PGME (100) | 80 | 26 | 2.9 |
| | 2-10 | Polymer 1 (100) | — | Quencher 10 (5.25) | PGMEA (400) CyH (2,000) PGME (100) | 80 | 26 | 2.9 |
| | 2-11 | Polymer 1 (100) | | Quencher 11 (3.01) | PGMEA (400) CyH (2,000) PGME (100) | 80 | 26 | 2.9 |

TABLE 3-continued

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| | 2-12 | Polymer 1 (100) | PAG 3 (10) | Quencher 8 (5.20) | PGMEA (400) CyH (2,000) PGME (100) | 80 | 23 | 2.9 |
| Comparative Example | 2-1 | Polymer 1 (100) | — | Comparative Quencher 1 (2.50) | PGMEA (400) CyH (2,000) PGME (100) | 80 | 38 | 3.5 |

It is demonstrated in Tables 1 to 3 that resist compositions comprising a quaternary ammonium iodide, quaternary ammonium dibromoiodide, quaternary ammonium bromodiiodide of quaternary ammonium triiodide form patterns having a high sensitivity, satisfactory resolution, and reduced LWR or CDU.

Japanese Patent Application No. 2016-224748 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising a quencher containing a quaternary ammonium salt selected from the group consisting of a quaternary ammonium iodide, quaternary ammonium dibromoiodide, quaternary ammonium bromodiiodide, and quaternary ammonium triiodide, and an acid generator,
wherein the acid generator is a polymer comprising recurring units of at least one selected from recurring units having the formulae (f1) to (f3) wherein the polymer is a base polymer:

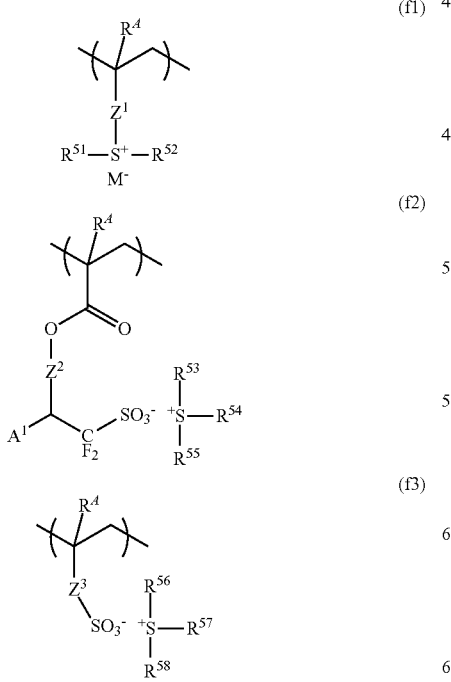

wherein $R^4$ is each independently hydrogen or methyl,
$Z^1$ is a single bond, phenylene, —O—$Z^{11}$—, or —C(=O)—$Z^{12}$—$Z^{11}$—, $Z^{11}$ is a $C_1$-$C_6$ straight, branched or cyclic alkylene group which may contain a carbonyl, ester, ether or hydroxyl moiety, or $Z^{11}$ is a $C_2$-$C_6$ straight, branched or cyclic alkenylene group which may contain a carbonyl, ester, ether or hydroxyl moiety, or $Z^{11}$ is a phenylene group, $Z^{12}$ is —O— or —NH—,
$R^{51}$, $R^{52}$, $R^{53}$, $R^{54}$, $R^{55}$, $R^{56}$, $R^{57}$, and $R^{58}$ are each independently a $C_1$-$C_{12}$ straight, branched or cyclic alkyl group which may contain a carbonyl, ester or ether moiety, or $R^{51}$, $R^{52}$, $R^{53}$, $R^{54}$, $R^{55}$, $R^{56}$, $R^{57}$, and $R^{58}$ are each independently a $C_6$-$C_{12}$ aryl, $C_7$-$C_{20}$ aralkyl, or mercaptophenyl group,
$Z^2$ is a single bond, —$Z^{21}$—C(=O)—O—, —$Z^{21}$—O—, or —$Z^{21}$—O—C(=O)—, $Z^{21}$ is a $C_1$-$C_{12}$ straight, branched or cyclic alkylene group which may contain a carbonyl, ester or ether moiety,
$Z^3$ is a single bond, methylene, ethylene, phenylene, fluorinated phenylene, —O—$Z^{31}$—, or —C(=O)—$Z^{32}$—$Z^{31}$—, $Z^{31}$ is a $C_1$-$C_6$ straight, branched or cyclic alkylene group which may contain a carbonyl, ester, ether or hydroxyl moiety, or $Z^{31}$ is a $C_2$-$C_6$ straight, branched or cyclic alkenylene group which may contain a carbonyl, ester, ether or hydroxyl moiety, or $Z^{31}$ is a phenylene, fluorinated phenylene or trifluoromethyl-substituted phenylene group, $Z^{32}$ is —O— or —NH—,
$A^1$ is hydrogen or trifluoromethyl, and $M^-$ is a non-nucleophilic counter ion.

2. The resist composition of claim 1 wherein the quaternary ammonium salt has the formula (1) or (2):

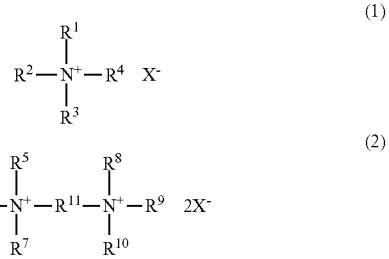

wherein $R^1$ to $R^4$ and $R^5$ to $R^{10}$ are each independently a $C_1$-$C_{24}$ straight, branched or cyclic alkyl group, $C_2$-$C_{24}$ straight, branched or cyclic alkenyl group, $C_2$-$C_{24}$ straight, branched or cyclic alkynyl group, or $C_6$-$C_{24}$ aryl group, $R^1$ to $R^4$ and $R^5$ to $R^{10}$ may contain a halogen, hydroxyl, carboxyl, ether, ester, thiol, thioester, thionoester, dithioester, amino, nitro, sulfone or ferrocenyl moiety, a pair of $R^1$ and $R^2$, $R^1$ and $R^4$, $R^2$ and R³, and/or R³ and R⁴ may bond together to form a ring, or a pair of R¹ and R², R¹ and R⁴, R² and R³, or R³ and R⁴, taken together, may form a double bond, R¹¹ is a $C_2$-$C_{12}$ straight, branched or cyclic alkylene group which may contain an ether and/or ester moiety, X⁻ is an anion selected from the group consisting of I⁻, $Br_2I^-$, $BrI_2^-$ and $I_3^-$.

3. The resist composition of claim 1 wherein the base polymer is an acid labile group-free polymer.

4. The resist composition of claim 1, further comprising an organic solvent.

5. The resist composition of claim 1, further comprising a surfactant.

6. A pattern forming process comprising the steps of coating the resist composition of claim 1 onto a substrate, baking, exposing the resulting resist film to high-energy radiation, and developing the resist film with a developer.

7. The process of claim 6 wherein the high-energy radiation is ArF excimer laser of wavelength 193 nm or KrF excimer laser of wavelength 248 nm.

8. The process of claim 6 wherein the high-energy radiation is EB or EUV of wavelength 3 to 15 nm.

9. A chemically amplified resist composition comprising
a quencher containing a quaternary ammonium salt selected from the group consisting of a quaternary ammonium iodide, quaternary ammonium dibromoiodide, quaternary ammonium bromodiiodide, and quaternary ammonium triiodide,
an acid generator, and
a base polymer,
wherein the acid generator is capable of generating sulfonic acid, imidic acid or methide acid, and the base polymer consists of
recurring units having the formula (a1) or recurring units having the formula (a2), and at least one selected from the group consisting of
recurring units (b) having a phenolic hydroxyl group as an adhesive group,
recurring units (c) having another adhesive group selected from the group consisting of hydroxyl (other than the foregoing phenolic hydroxyl), lactone ring, ether, ester, carbonyl and cyano groups,
recurring units (d) selected from the group of units consisting of indene, benzofuran, benzothiophene, acenaphthylene, chromone, coumarin, norbornadiene, and derivatives thereof,
recurring units (e) derived from compounds selected from the group consisting of styrene, vinylnaphthalene, vinylanthracene, vinylpyrene, methyleneindene, vinylpyridine, and vinylcarbazole, and
recurring units of at least one selected from recurring units having the formulae (f1) to (f3):

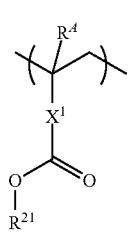
(a1)

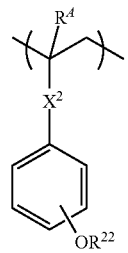
(a2)

wherein $R^A$ is each independently hydrogen or methyl, $R^{21}$ and $R^{22}$ are each independently an acid labile group, $X^1$ is a single bond, phenylene, naphthylene, or a $C_1$-$C_{12}$ linking group containing ester moiety or lactone ring, and $X^2$ is a single bond or ester group,

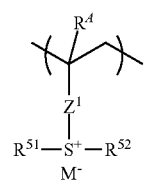
(f1)

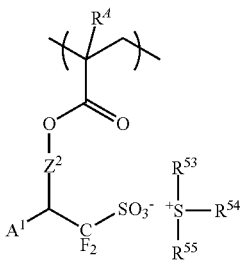
(f2)

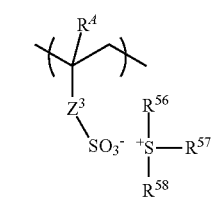
(f3)

wherein $R^A$ is each independently hydrogen or methyl,
$Z^1$ is a single bond, phenylene, —O—$Z^{11}$—, —C(=O)—$Z^{12}$—$Z^{11}$—, is a $C_1$-$C_6$ straight, branched or cyclic alkylene group which may contain a carbonyl, ester, ether or hydroxyl moiety, or $Z^{11}$ is a $C_2$-$C_6$ straight, branched or cyclic alkenylene group which may contain a carbonyl, ester, ether or hydroxyl moiety, or $Z^{11}$ is a phenylene group, $Z^{12}$ is —O— or —NH—,
$R^{51}$, $R^{52}$, $R^{53}$, $R^{54}$, $R^{55}$, $R^{56}$, $R^{57}$, and $R^{58}$ are each independently a $C_1$-$C_{12}$ straight, branched or cyclic alkyl group which may contain a carbonyl, ester or ether moiety, or $R^{51}$ $R^{52}$, $R^{53}$, $R^{54}$ $R^{55}$, $R^{56}$, $R^{57}$, and $R^{58}$ are each independently a $C_6$-$C_{12}$ aryl, $C_7$-$C_{20}$ aralkyl, or mercaptophenyl group,
$Z^2$ is a single bond, —$Z^{21}$—C(=O)—O—, —$Z^{21}$—O—, or —$Z^{21}$—O—C(=O)—, $Z^{21}$ is a $C_1$-$C_{12}$ straight, branched or cyclic alkylene group which may contain a carbonyl, ester or ether moiety,
$Z^3$ is a single bond, methylene, ethylene, phenylene, fluorinated phenylene, —O—$Z^{31}$—, or —C(=O)—

$Z^{32}-Z^{31}-$, $Z^{31}$ is a $C_1$-$C_6$ straight, branched or cyclic alkylene group which may contain a carbonyl, ester, ether or hydroxyl moiety, or $Z^{31}$ is a $C_2$-$C_6$ straight, branched or cyclic alkenylene group which may contain a carbonyl, ester, ether or hydroxyl moiety, or $Z^{31}$ is a phenylene, fluorinated phenylene or trifluoromethyl-substituted phenylene group, $Z^{32}$ is —O— or —NH—, $A^1$ is hydrogen or trifluoromethyl, and $M^-$ is a non-nucleophilic counter ion.

10. The resist composition of claim 9 which is a chemically amplified positive resist composition.

11. The resist composition of claim 9 wherein the quaternary ammonium salt has the formula (1) or (2):

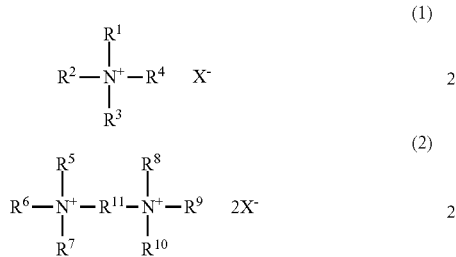

wherein $R^1$ to $R^4$ and $R^5$ to $R^{10}$ are each independently a $C_1$-$C_{24}$ straight, branched or cyclic alkyl group, $C_2$-$C_{24}$ straight, branched or cyclic alkenyl group, $C_2$-$C_{24}$ straight, branched or cyclic alkynyl group, or $C_6$-$C_{24}$ aryl group, $R^1$ to $R^4$ and $R^5$ to $R^{10}$ may contain a halogen, hydroxyl, carboxyl, ether, ester, thiol, thioester, thionoester, dithioester, amino, nitro, sulfone or ferrocenyl moiety, a pair of $R^1$ and $R^2$, $R^1$ and $R^4$, $R^2$ and $R^3$, and/or $R^3$ and $R^4$ may bond together to form a ring, or a pair of $R^1$ and $R^2$, $R^1$ and $R^4$, $R^2$ and $R^3$, or $R^3$ and $R^4$, taken together, may form a double bond, $R^{11}$ is a $C_2$-$C_{12}$ straight, branched or cyclic alkylene group which may contain an ether and/or ester moiety, $X^-$ is an anion selected from the group consisting of $I^-$, $Br_2I^-$, $BrI_2^-$ and $I_3^-$.

12. A pattern forming process comprising the steps of coating the resist composition of claim 9 onto a substrate, baking, exposing the resulting resist film to high-energy radiation, and developing the resist film with a developer.

13. A chemically amplified negative resist composition comprising
a quencher containing a quaternary ammonium salt selected from the group consisting of a quaternary ammonium iodide, quaternary ammonium dibromoiodide, quaternary ammonium bromodiiodide, and quaternary ammonium triiodide,
an acid generator, and
a base polymer,
wherein the base polymer is an acid labile group free polymer.

14. The resist composition of claim 13 wherein the quaternary ammonium salt has the formula (1) or (2):

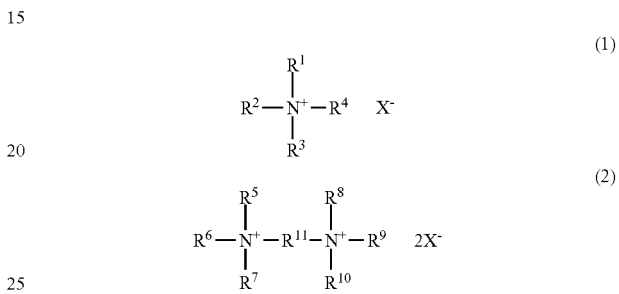

wherein $R^1$ to $R^4$ and $R^5$ to $R^{10}$ are each independently a $C_1$-$C_{24}$ straight, branched or cyclic alkyl group, $C_2$-$C_{24}$ straight, branched or cyclic alkenyl group, $C_2$-$C_{24}$ straight, branched or cyclic alkynyl group, or $C_6$-$C_{24}$ aryl group, $R^1$ to $R^4$ and $R^5$ to $R^{10}$ may contain a halogen, hydroxyl, carboxyl, ether, ester, thiol, thioester, thionoester, dithioester, amino, nitro, sulfone or ferrocenyl moiety, a pair of $R^1$ and $R^2$, $R^1$ and $R^4$, $R^2$ and $R^3$, and/or $R^3$ and $R^4$ may bond together to form a ring, or a pair of $R^1$ and $R^2$, $R^1$ and $R^4$, $R^2$ and $R^3$, or $R^3$ and $R^4$, taken together, may form a double bond, $R^{11}$ is a $C_2$-$C_{12}$ straight, branched or cyclic alkylene group which may contain an ether and/or ester moiety, $X^-$ is an anion selected from the group consisting of $I^-$, $Br_2I^-$, $BrI_2^-$ and $I_3^-$.

15. A pattern forming process comprising the steps of coating the resist composition of claim 13 onto a substrate, baking, exposing the resulting resist film to high-energy radiation, and developing the resist film with a developer.

* * * * *